United States Patent
Graham et al.

(10) Patent No.: US 10,714,951 B2
(45) Date of Patent: Jul. 14, 2020

(54) STRUCTURAL FRAMEWORK FOR WIRELESS CHARGING MATS

(71) Applicant: Apple Inc., Cupertino, CA (US)

(72) Inventors: Christopher S. Graham, San Francisco, CA (US); Demetrios B. Karanikos, San Francisco, CA (US); Darshan R. Kasar, San Francisco, CA (US); Paul J. Thompson, Mountain View, CA (US); Eric S. Jol, San Jose, CA (US); Grant S. Haug, Mountain View, CA (US); Karl Ruben F. Larsson, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 352 days.

(21) Appl. No.: 15/699,986

(22) Filed: Sep. 8, 2017

(65) Prior Publication Data

US 2018/0090956 A1    Mar. 29, 2018

Related U.S. Application Data

(60) Provisional application No. 62/399,248, filed on Sep. 23, 2016, provisional application No. 62/399,243, (Continued)

(51) Int. Cl.
*H02J 7/00* (2006.01)
*H02J 50/10* (2016.01)
(Continued)

(52) U.S. Cl.
CPC .......... *H02J 7/0042* (2013.01); *H01F 27/288* (2013.01); *H01F 27/325* (2013.01);
(Continued)

(58) Field of Classification Search
CPC ..................................................... H02J 7/0042
(Continued)

(56) References Cited

U.S. PATENT DOCUMENTS

| 6,129,025 A | 10/2000 | Minakami et al. |
| 7,932,638 B2 | 4/2011 | Randall |

(Continued)

FOREIGN PATENT DOCUMENTS

| AU | 2017330233 | 7/2019 |
| EP | 2782208 | 9/2014 |

(Continued)

OTHER PUBLICATIONS

U.S. Appl. No. 15/699,978, Final Office Action, dated May 8, 2019, 19 pages.

(Continued)

*Primary Examiner* — Jerry D Robbins
(74) *Attorney, Agent, or Firm* — Kilpatrick, Townsend and Stockton LLP

(57) ABSTRACT

Embodiments describe a wireless charging device including: a housing having a charging surface and first and second walls that define an interior cavity; a transmitter coil arrangement disposed within the interior cavity, an interconnection structure positioned within the interior cavity below the transmitter coil arrangement, the interconnection structure including a plurality of packaged electrical components mounted on the interconnection structure and configured to operate the plurality of transmitter coils during wireless power transfer, where the plurality of packaged electrical components is located below the transmitter coil arrangement; and a frame comprising a plurality of openings positioned corresponding to the plurality of packaged electrical components, each opening providing space within which a respective packaged electrical device is disposed.

20 Claims, 31 Drawing Sheets

Related U.S. Application Data filed on Sep. 23, 2016, provisional application No. 62/399,245, filed on Sep. 23, 2016, provisional application No. 62/399,255, filed on Sep. 23, 2016, provisional application No. 62/399,259, filed on Sep. 23, 2016, provisional application No. 62/399,263, filed on Sep. 23, 2016, provisional application No. 62/399,269, filed on Sep. 23, 2016, provisional application No. 62/399,273, filed on Sep. 23, 2016, provisional application No. 62/399,276, filed on Sep. 23, 2016, provisional application No. 62/526,905, filed on Jun. 29, 2017.

(51) Int. Cl.
| | | |
|---|---|---|
| *H01F 27/28* | (2006.01) | |
| *H02J 7/02* | (2016.01) | |
| *H05K 9/00* | (2006.01) | |
| *H02J 50/40* | (2016.01) | |
| *H02J 50/60* | (2016.01) | |
| *H02J 50/70* | (2016.01) | |
| *H04B 5/00* | (2006.01) | |
| *H01F 27/32* | (2006.01) | |
| *H02J 5/00* | (2016.01) | |

(52) U.S. Cl.
CPC .............. *H02J 5/005* (2013.01); *H02J 7/025* (2013.01); *H02J 50/10* (2016.02); *H02J 50/40* (2016.02); *H02J 50/60* (2016.02); *H02J 50/70* (2016.02); *H04B 5/0037* (2013.01); *H04B 5/0075* (2013.01); *H04B 5/0087* (2013.01); *H05K 9/0007* (2013.01)

(58) Field of Classification Search
USPC ........................................................ 320/108
See application file for complete search history.

(56) References Cited

U.S. PATENT DOCUMENTS

| | | | |
|---|---|---|---|
| 7,948,208 B2 | 5/2011 | Partovi et al. | |
| 8,519,815 B1 | 8/2013 | Sanders | |
| 8,525,370 B2 | 9/2013 | Walley et al. | |
| 9,007,019 B2 | 4/2015 | Iijima et al. | |
| 9,209,627 B2 | 12/2015 | Baarman et al. | |
| 9,231,411 B2 | 1/2016 | Baarman et al. | |
| 9,331,518 B2 | 5/2016 | Walley et al. | |
| 9,356,457 B2 | 5/2016 | Sedzin et al. | |
| 9,627,913 B2 | 4/2017 | Maugars | |
| 9,658,670 B1 | 5/2017 | Sultenfuss et al. | |
| 9,847,664 B2 | 12/2017 | Kozuma et al. | |
| 10,063,085 B2 | 8/2018 | Bae | |
| 10,277,043 B2 | 4/2019 | Graham et al. | |
| 10,340,711 B2 | 7/2019 | Graham et al. | |
| 2005/0275497 A1 | 12/2005 | Ramadan et al. | |
| 2007/0007844 A1 | 1/2007 | Barbat | |
| 2007/0182367 A1 | 8/2007 | Partovi | |
| 2007/0279002 A1 | 12/2007 | Partovi et al. | |
| 2008/0055279 A1 | 3/2008 | Osada et al. | |
| 2009/0096413 A1* | 4/2009 | Partovi ................ H01F 5/003 320/108 |
| 2009/0134711 A1 | 5/2009 | Issa et al. | |
| 2010/0070219 A1 | 3/2010 | Azancot et al. | |
| 2010/0141369 A1 | 6/2010 | Mori | |
| 2010/0181841 A1 | 7/2010 | Azancot et al. | |
| 2010/0219183 A1 | 9/2010 | Azancot et al. | |
| 2010/0225174 A1 | 9/2010 | Jiang et al. | |
| 2010/0244579 A1 | 9/2010 | Sogabe et al. | |
| 2010/0259217 A1 | 10/2010 | Baarman et al. | |
| 2010/0270970 A1 | 10/2010 | Toya et al. | |
| 2010/0295652 A1 | 11/2010 | Mori | |
| 2011/0127845 A1 | 6/2011 | Walley et al. | |
| 2011/0136550 A1 | 6/2011 | Maugars | |
| 2011/0254378 A1 | 10/2011 | Ichikawa et al. | |
| 2012/0038317 A1 | 2/2012 | Miyamoto et al. | |
| 2012/0049991 A1* | 3/2012 | Baarman ............... H01F 27/022 336/199 |
| 2012/0112552 A1 | 5/2012 | Baarman et al. | |
| 2012/0205988 A1 | 8/2012 | Tanabe | |
| 2012/0256585 A1 | 10/2012 | Partovi et al. | |
| 2012/0262109 A1 | 10/2012 | Toya et al. | |
| 2012/0313577 A1* | 12/2012 | Moes ....................... H02J 7/025 320/108 |
| 2013/0020988 A1 | 1/2013 | Kim et al. | |
| 2013/0026983 A1 | 1/2013 | Yamamoto et al. | |
| 2013/0038135 A1 | 2/2013 | Ichikawa | |
| 2013/0038279 A1 | 2/2013 | Seyerle et al. | |
| 2013/0069444 A1 | 3/2013 | Waffenschmidt et al. | |
| 2013/0099589 A1 | 4/2013 | An | |
| 2013/0116763 A1 | 5/2013 | Parker et al. | |
| 2013/0257362 A1 | 10/2013 | Lim et al. | |
| 2013/0293025 A1 | 11/2013 | Xu et al. | |
| 2013/0307469 A1 | 11/2013 | Kuroda et al. | |
| 2014/0021798 A1 | 1/2014 | Kesler et al. | |
| 2014/0091640 A1 | 4/2014 | Scholz et al. | |
| 2014/0176055 A1 | 6/2014 | Van Lammeren et al. | |
| 2014/0197694 A1 | 7/2014 | Asanuma et al. | |
| 2014/0292101 A1 | 10/2014 | Baarman et al. | |
| 2014/0292468 A1 | 10/2014 | Motomiya et al. | |
| 2014/0354223 A1 | 12/2014 | Lee et al. | |
| 2015/0028478 A1 | 1/2015 | Meyer et al. | |
| 2015/0170832 A1 | 6/2015 | Covic et al. | |
| 2015/0236513 A1 | 8/2015 | Covic et al. | |
| 2015/0255988 A1 | 9/2015 | Yang et al. | |
| 2015/0280442 A1 | 10/2015 | Graham | |
| 2015/0280450 A1 | 10/2015 | Park et al. | |
| 2015/0302984 A1 | 10/2015 | Kurs | |
| 2015/0326061 A1 | 11/2015 | Davison et al. | |
| 2015/0364244 A1 | 12/2015 | Tsai et al. | |
| 2016/0072334 A1 | 3/2016 | Wu | |
| 2016/0072337 A1 | 3/2016 | Chang et al. | |
| 2016/0087484 A1 | 3/2016 | Kim | |
| 2016/0118806 A1 | 4/2016 | Standke et al. | |
| 2016/0126001 A1 | 5/2016 | Chien et al. | |
| 2016/0126009 A1 | 5/2016 | Chien et al. | |
| 2017/0018935 A1 | 1/2017 | Georgakopoulos et al. | |
| 2017/0063101 A1 | 3/2017 | Sultenfuss et al. | |
| 2017/0063143 A1 | 3/2017 | Hoarau et al. | |
| 2017/0117738 A1 | 4/2017 | Yeoh et al. | |
| 2017/0133145 A1 | 5/2017 | Hong et al. | |
| 2017/0178802 A1 | 6/2017 | Yang et al. | |
| 2017/0214259 A1 | 7/2017 | Brown et al. | |
| 2017/0228721 A1 | 8/2017 | Lee et al. | |
| 2017/0237290 A1 | 8/2017 | Bakker et al. | |
| 2017/0237296 A1 | 8/2017 | Keith et al. | |
| 2017/0345548 A1 | 11/2017 | Yu et al. | |
| 2017/0345555 A1 | 11/2017 | Jang et al. | |
| 2017/0366046 A1 | 12/2017 | Werner | |
| 2018/0313697 A1 | 11/2018 | Montes et al. | |
| 2019/0140481 A1 | 5/2019 | Keeling et al. | |

FOREIGN PATENT DOCUMENTS

| | | |
|---|---|---|
| EP | 2782288 | 9/2014 |
| GB | 2389720 | 12/2003 |
| GB | 2389728 | 12/2003 |
| JP | 11176677 | 7/1999 |
| JP | 2012523814 | 10/2012 |
| JP | 2014179543 | 9/2014 |
| JP | 2015008547 | 1/2015 |
| JP | 2015176898 | 10/2015 |
| JP | 2018507671 | 3/2018 |
| WO | 2008137996 | 11/2008 |
| WO | 2013061610 | 5/2013 |
| WO | 2015077239 | 5/2015 |

(56) References Cited

FOREIGN PATENT DOCUMENTS

| WO | 2016002205 | 1/2016 |
| WO | 2016114893 | 7/2016 |

OTHER PUBLICATIONS

U.S. Appl. No. 15/700,016, Final Office Action, dated Apr. 18, 2019, 28 pages.
U.S. Appl. No. 15/700,034, Non-Final Office Action, dated Mar. 29, 2019, 18 pages.
Japan Patent Application No. 2018-101713, Office Action, dated Mar. 22, 2019, 6 pages.
Japan Patent Application No. 2018-101714, Office Action, dated Mar. 29, 2019, 4 pages.
Japan Patent Application No. 2018-526812, Office Action, dated Mar. 15, 2019, 5 pages.
U.S. Appl. No. 15/699,965, Notice of Allowance, dated Dec. 14, 2018, 10 pages.
European Patent Application No. 18178191.5, Extended European Search Report, dated Dec. 14, 2018, 8 pages.
European Patent Application No. 18178206.1, Extended European Search Report, dated Dec. 14, 2018, 9 pages.
U.S. Appl. No. 15/700,001, Non-Final Office Action, dated Aug. 7, 2019, 32 pages.
U.S. Appl. No. 15/700,016, Non-Final Office Action, dated Aug. 8, 2019, 27 pages.
Japan Patent Application No. 2018-526812, Office Action, dated Jun. 24, 2019, 5 pages.
European Patent Application No. 19179861.0, Extended European Search Report, dated Sep. 30, 2019, 8 pages.
U.S. Appl. No. 15/699,965, "First Action Interview Pilot Program Pre-Interview Commu", dated Dec. 7, 2017, 4 pages.
U.S. Appl. No. 15/699,978, "First Action Interview Pilot Program Pre-Interview Communication", dated Dec. 11, 2017, 6 pages.
PCT/US2017/050966, "Invitation to Pay Additional Fees and Partial Search Report", dated Nov. 20, 2017, 12 pages.
U.S. Appl. No. 16/127,118, Notice of Allowance, dated Oct. 23, 2019, 11 pages.
European Patent Application No. 17772190.9, Office Action, dated Oct. 21, 2019, 5 pages.
U.S. Appl. No. 15/700,016 , "Non-Final Office Action", dated Oct. 4, 2018, 20 pages.
U.S. Appl. No. 15/700,016, Final Office Action, dated Feb. 20, 2020, 30 pages.
Office Action issued in European Application No. EP17772190.9, dated Mar. 12, 2020 in 5 pages.
U.S. Appl. No. 15/699,978, Non-Final Office Action, dated Jan. 3, 2020, 25 pages.
U.S. Appl. No. 15/700,025, Non-Final Office Action, dated Jan. 9, 2020, 9 pages.
U.S. Appl. No. 15/700,038, Notice of Allowance, dated Jan. 14, 2020, 10 pages.

\* cited by examiner

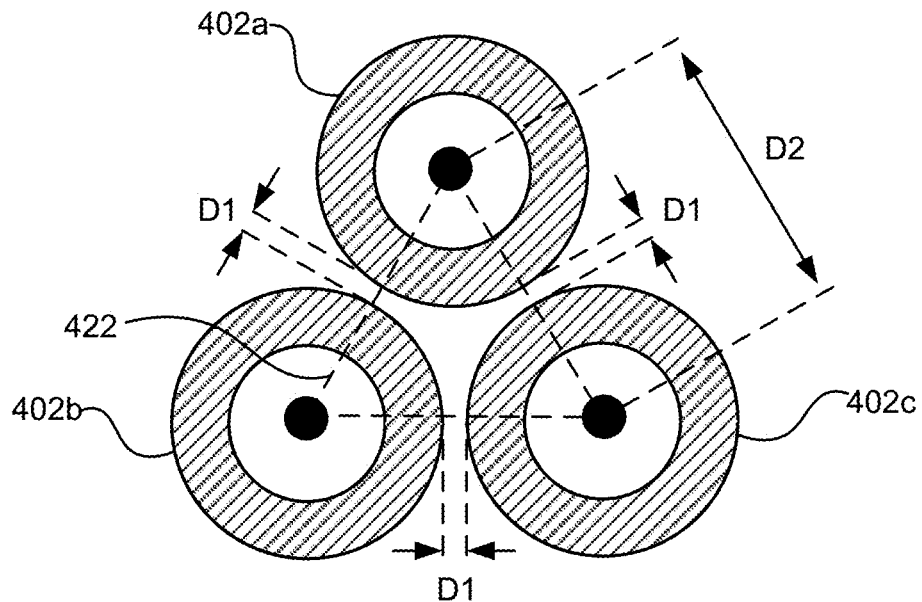
FIG. 5A
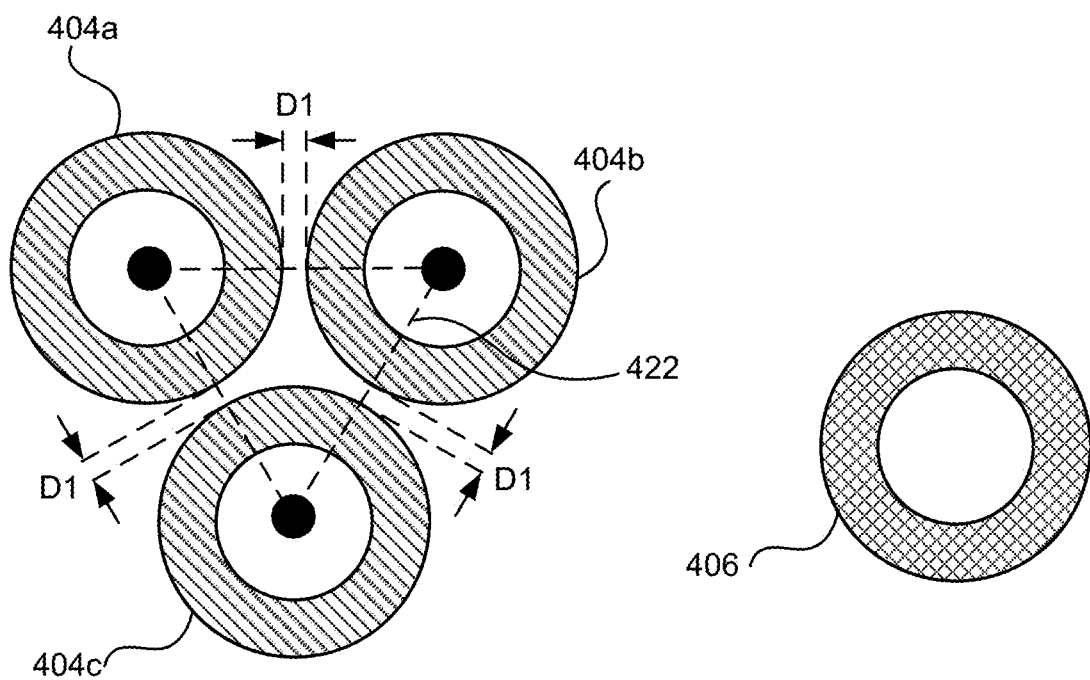
FIG. 5B  FIG. 5C

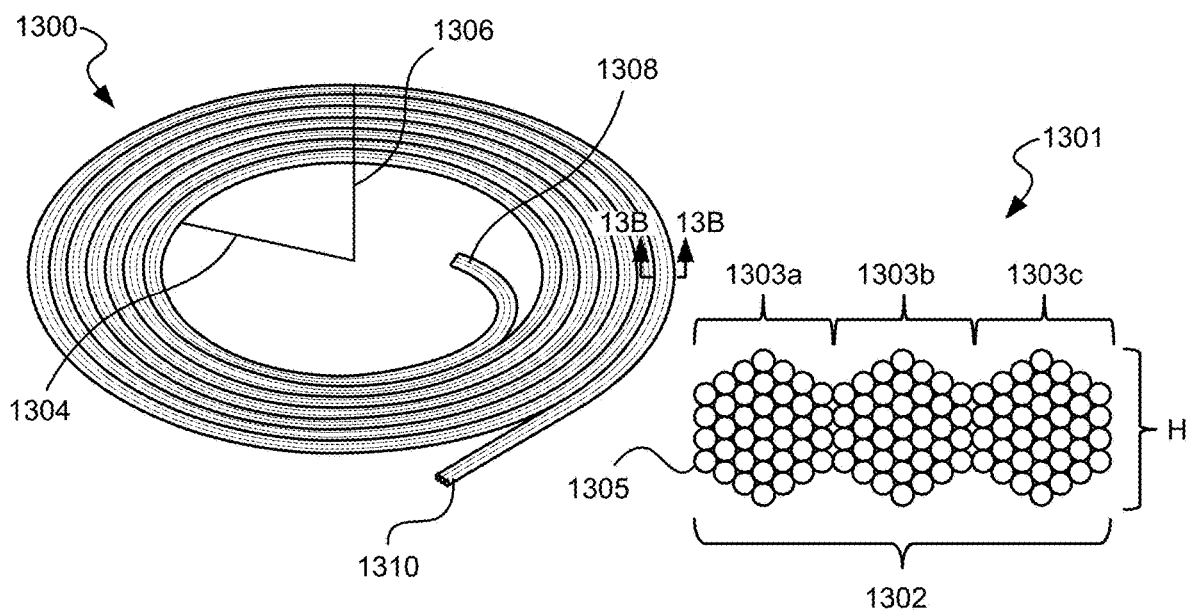
*FIG. 13A*  *FIG. 13B*
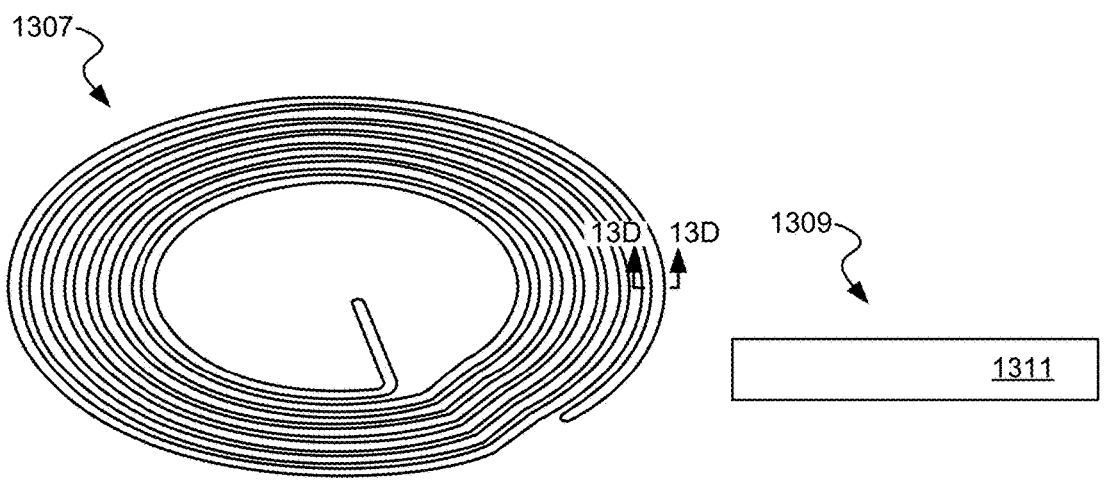
*FIG. 13C*  *FIG. 13D*

STRUCTURAL FRAMEWORK FOR WIRELESS CHARGING MATS

CROSS REFERENCES TO RELATED APPLICATIONS

This application claims priority to U.S. Provisional Patent Application No. 62/399,243, filed on Sep. 23, 2016, U.S. Provisional Patent Application No. 62/399,245, filed on Sep. 23, 2016, U.S. Provisional Patent Application No. 62/399,248, filed on Sep. 23, 2016, U.S. Provisional Patent Application No. 62/399,255, filed on Sep. 23, 2016, U.S. Provisional Patent Application No. 62/399,259, filed on Sep. 23, 2016, U.S. Provisional Patent Application No. 62/399,263, filed on Sep. 23, 2016, U.S. Provisional Patent Application No. 62/399,269; filed on Sep. 23, 2016, U.S. Provisional Patent Application No. 62/399,273, filed on Sep. 23, 2016, U.S. Provisional Patent Application No. 62/399,276; filed on Sep. 23, 2016, and U.S. Provisional Patent Application No. 62/526,905; filed on Jun. 29, 2017, the disclosures of which are hereby incorporated by reference in their entirety and for all purposes.

BACKGROUND

Electronic devices (e.g., mobile phones, media players, electronic watches, and the like) operate when there is charge stored in their batteries. Some electronic devices include a rechargeable battery that can be recharged by coupling the electronic device to a power source through a physical connection, such as through a charging cord. Using a charging cord to charge a battery in an electronic device, however, requires the electronic device to be physically tethered to a power outlet. Additionally, using a charging cord requires the mobile device to have a connector, typically a receptacle connector, configured to mate with a connector, typically a plug connector, of the charging cord. The receptacle connector typically includes a cavity in the electronic device that provides an avenue within which dust and moisture can intrude and damage the device. Furthermore, a user of the electronic device has to physically connect the charging cable to the receptacle connector in order to charge the battery.

To avoid such shortcomings, wireless charging devices have been developed to wirelessly charge electronic devices without the need for a charging cord. For example, some electronic devices can be recharged by merely resting the device on a charging surface of a wireless charging device. A transmitter coil disposed below the charging surface may produce a time-varying magnetic field that induces a current in a corresponding receiving coil in the electronic device. The induced current can be used by the electronic device to charge its internal battery.

Some existing wireless charging devices have a number of disadvantages. For instance, some wireless charging devices require an electronic device to be placed in a very confined charging region on the charging surface in order for the electronic device being charged to receive power. If an electronic device is placed outside of the charging region, the electronic device may not wirelessly charge or may charge inefficiently and waste power. This limits the ease at which an electronic device can be charged by the wireless charging device.

SUMMARY

Some embodiments of the disclosure provide a wireless charging device that includes a charging surface having a broad charging region upon which an electronic device can be placed to wirelessly receive power. In some embodiments the wireless charging device can be a wireless charging mat that includes an arrangement of wireless power transmitters beneath the charging surface defining a charging region. The wireless charging mat allows the electronic device to be charged at any location within the charging region, thereby increasing the ease at which electronic devices can be charged by the mat.

In some embodiments a wireless charging device includes: a housing having a charging surface and first and second walls that define an interior cavity; a transmitter coil arrangement disposed within the interior cavity, the transmitter coil arrangement including a plurality of transmitter coils positioned within the interior cavity in an overlapping arrangement such that different coils in the plurality of coils are on different planes and each of the plurality of transmitter coils has a central axis positioned a lateral distance away from the central axes of all other transmitter coils of the plurality of transmitter coils; an interconnection structure positioned within the interior cavity below the transmitter coil arrangement, the interconnection structure including a plurality of packaged electrical components mounted on the interconnection structure and configured to operate the plurality of transmitter coils during wireless power transfer, where the plurality of packaged electrical components is located below the transmitter coil arrangement; and a frame comprising a plurality of openings positioned corresponding to the plurality of packaged electrical components, each opening providing space within which a respective packaged electrical device is disposed.

In some additional embodiments, a wireless charging device includes: a housing having a planar charging surface and first and second shells that define an interior cavity; a transmitter coil arrangement disposed within the interior cavity, the transmitter coil arrangement including a plurality of transmitter coils positioned within the interior cavity in an overlapping arrangement such that different coils in the plurality of coils are on different planes each of the plurality of transmitter coils has a central axis positioned a lateral distance away from the central axes of all other transmitter coils of the plurality of transmitter coils; an interconnection structure positioned within the interior cavity below the transmitter coil arrangement, the interconnection structure including a plurality of packaged electrical components mounted on the interconnection structure and configured to operate the plurality of transmitter coils during wireless power transfer, where the plurality of packaged electrical components is located below the transmitter coil arrangement; a frame comprising a plurality of openings positioned corresponding to the plurality of packaged electrical components, each opening providing space within which a respective packaged electrical device is disposed; and a bottom shield disposed below and coupled to the frame, the bottom shield including a shielding layer and one or more insulating layers, where the one or more insulating layers are positioned to correspond with at least one opening of the plurality of openings.

In some further additional embodiments, a wireless charging system includes: an electrical device comprising a receiver coil configured to generate a current to charge a battery when exposed to a time-varying magnetic flux; and a wireless charging device configured to generate the time-varying magnetic flux to wirelessly charge the electronic device. The wireless charging device includes: a housing having a charging surface, the housing including first and second walls that define an interior cavity; a transmitter coil arrangement disposed within the interior cavity, the transmitter coil arrangement including a plurality of transmitter coils positioned within the interior cavity in an overlapping arrangement such that different coils in the plurality of coils are on different planes and each of the plurality of transmitter coils has a central axis positioned a lateral distance away from the central axes of all other transmitter coils of the plurality of transmitter coils; an interconnection structure positioned within the interior cavity below the transmitter coil arrangement, the interconnection structure including a plurality of packaged electrical components mounted on the interconnection structure and configured to operate the plurality of transmitter coils during wireless power transfer, where the plurality of packaged electrical components are located below the transmitter coil arrangement; and a frame comprising a plurality of openings positioned corresponding to the plurality of packaged electrical components, each opening providing space within which a respective packaged electrical device is disposed.

A better understanding of the nature and advantages of embodiments of the present invention may be gained with reference to the following detailed description and the accompanying drawings.

BRIEF DESCRIPTION OF THE DRAWINGS

FIGS. 5A-5C are simplified diagrams illustrating the different layers of a transmitter coil arrangement configured in a rosette pattern, according to some embodiments of the present disclosure.

FIG. 13A is a simplified diagram illustrating an exemplary coil of wire formed of a plurality of thin wires, according to some embodiments of the present disclosure.

FIG. 13B is a simplified diagram illustrating a cross-sectional view of a single turn of a coil of wire formed of a plurality of thin wires, according to some embodiments of the present disclosure.

FIG. 13C is a simplified diagram illustrating an exemplary coil of wire formed of a single core of conductive wire, according to some embodiments of the present disclosure.

FIG. 13D is a simplified diagram illustrating a cross-sectional view of a single turn of a coil of wire formed of a single core of conductive wire, according to some embodiments of the present disclosure.

DETAILED DESCRIPTION

Embodiments of the disclosure describe a wireless charging mat where an electronic device can be efficiently charged across a vast majority, if not an entire area, of a charging surface of the wireless charging mat. Arrays of transmitter coils disposed below the charging surface may generate time-varying magnetic fields capable of inducing current in a receiver of the electronic device or of a docking station with which the electronic device is coupled.

The wireless charging mat may include multiple transmitter coil layers. Each layer can include an array of transmitter coils arranged in a grid pattern and configured to generate magnetic fields in a corresponding grid pattern. Spaces between each transmitter coil in the layer may be a "dead zone," i.e., a region where a magnetic field is not generated. Thus, the multiple transmitter coil layers can be arranged so that there are minimal dead zones across a charging surface of the wireless charging mat. In some embodiments, the wireless charging mat includes three transmitter coil layers where each layer is arranged to fill dead zones in the other two layers. For instance, magnetic fields generated by coils in a first layer can fill in dead zones in the second and third layers. Likewise, magnetic fields generated by coils in the second layer may fill in dead zones in the first and third layers; and magnetic fields generated by coils in the third layer can fill in dead zones in the first and second layers. Accordingly, the three transmitter coil layers can collectively generate magnetic fields that span across the charging surface, thereby enabling an electronic device to be charged across a vast majority of the charging surface. Aspects and features of embodiments of such a wireless charging mat are discussed in further detail herein.

I. Wireless Charging Mat

Figure 1:
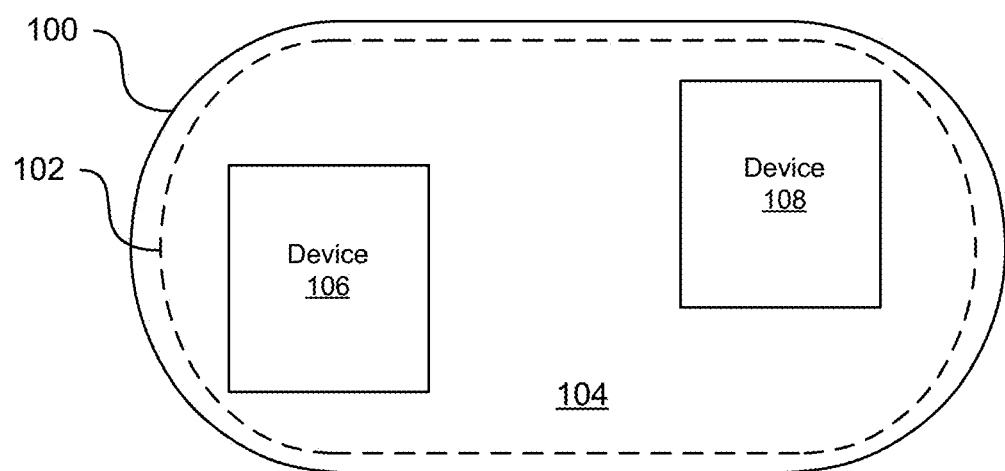
FIG. 1 is a simplified diagram illustrating an exemplary wireless charging mat and two devices positioned on the charging mat, according to some embodiments of the present disclosure.

FIG. 1 illustrates an exemplary wireless charging mat 100, according to some embodiments of the present disclosure. Wireless charging mat 100 can include a charging surface 102 upon which a device having a wireless power receiver can be placed upon to wirelessly charge its battery. In some embodiments, charging surface 102 may be a region of a top surface 104 of wireless charging mat 100 that spans across a vast majority, if not the entire area, of top surface 104. Time-varying magnetic fields generated by wireless charging mat 100 can propagate through regions of top surface 104 within charging surface 102 and form a continuous region within which devices can wirelessly receive power.

In some embodiments, devices can be placed in any location within charging surface 102 to receive power. For instance, a first device 106 can be positioned on a left side of wireless charging mat 100 within charging surface 102 and receive power from wireless charging mat 100. And a second device, e.g., device 108, can be positioned on a right side of wireless charging mat 100 within charging surface 102 to receive power from wireless charging mat 100. It is to be appreciated that a device placed anywhere within charging surface 102 can receive power from wireless charging mat 100 according to embodiments of the present disclosure. In some embodiments, more than one device may be placed on wireless charging mat 100 to receive power. As an example, both devices 106 and 108 may be concurrently placed on wireless charging mat 100 and simultaneously receive power.

Devices 106 and 108 can be any suitable device configured to receive power from wireless charging mat 100. For example, device 106 and/or device 108 can be a portable electronic device (e.g., a mobile phone, a media player, an electronic watch, and the like), a docking station, or an accessory electronic device, each having a receiver coil configured to receive power when exposed to magnetic fields produced by wireless charging mat 100.

Wireless charging mat 100 can be shaped to provide a suitable surface upon which one or more devices can be charged. For instance, wireless charging mat 100 can be in the shape of a pill (a generally oval shape) as shown in FIG. 1, although other embodiments can have different shapes. Some embodiments can have a circular shape, rectangular shape, square shape, or any other suitable shape for providing a surface upon which a device can be wirelessly charged without departing from the spirit and scope of the present disclosure.

II. Arrangement of Transmitter Coils

Figure 2:
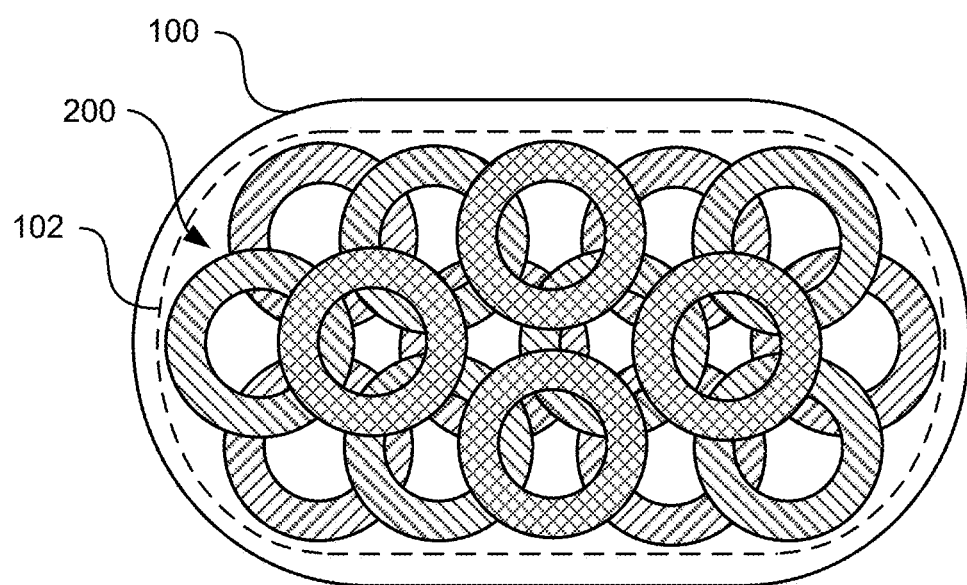
FIG. 2 is a simplified diagram illustrating a transmitter coil arrangement embedded within a charging mat, according to some embodiments of the present disclosure.

Time-varying magnetic fields can be generated by multiple transmitter coils embedded within wireless charging mat 100. For instance, wireless charging mat 100 can include a transmitter coil arrangement as shown in FIG. 2. FIG. 2 illustrates transmitter coil arrangement 200 embedded within charging mat 100, according to some embodiments of the present disclosure. The illustration of FIG. 2 shows wireless charging mat 100 with top surface 104 removed so that the embedded transmitter coil arrangement 200 may be seen. Transmitter coil arrangement 200 can include multiple arrays of transmitter coils arranged in different layers and in a non-concentric fashion so that when all of the transmitter coils are operating, an array of magnetic fields can be generated across charging surface 102.

A. Transmitter Coil Patterns

According to some embodiments of the present disclosure, the specific arrangement of transmitter coils 200 enables wireless charging mat 100 to generate an array of magnetic fields that forms a continuous charging surface upon which an electronic device can be charged. The continuous charging surface allows an electronic device to be efficiently charged at any location within the charging surface. The charging surface can span across a vast majority, if not an entire area, of wireless charging mat 100. In some embodiments, transmitter coil arrangement 200 can be arranged according to a base pattern that enables transmitter coil arrangement 200 to generate magnetic fields that form the continuous charging surface. The base pattern can be expanded to form more complex patterns that form a larger continuous charging surface.

1. Base Pattern

Figure 3:
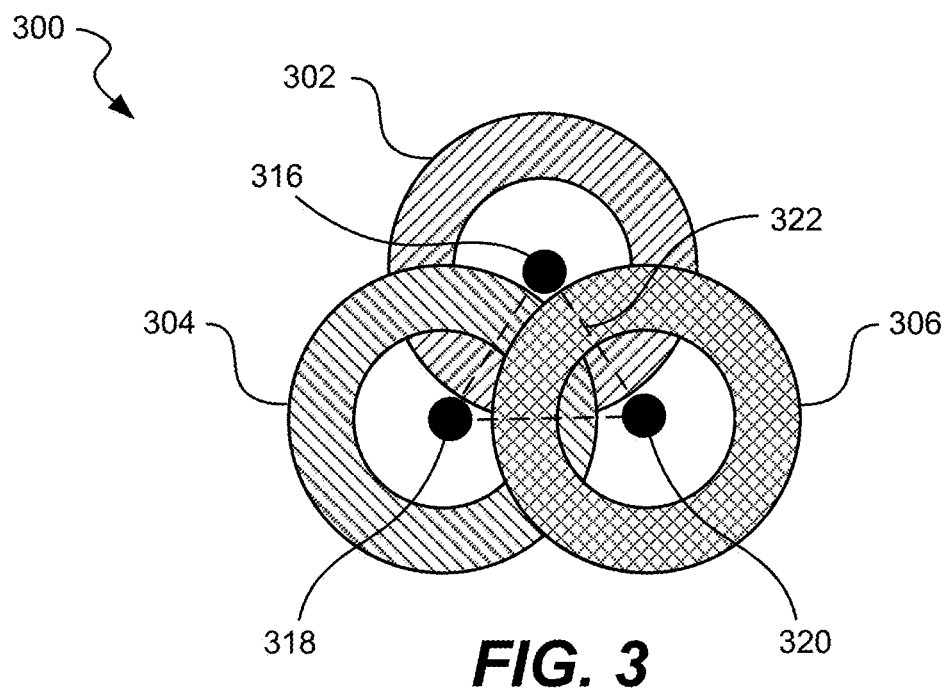
FIG. 3 is a simplified diagram illustrating an exemplary base pattern having three transmitter coils, according to some embodiments of the present disclosure.

FIG. 3 illustrates an exemplary base pattern 300 having three transmitter coils: first transmitter coil 302, second transmitter coil 304, and third transmitter coil 306, according to some embodiments of the present disclosure. First, second, and third transmitter coils 302, 304, and 306 can be arranged in three separate layers, thereby forming a transmitter coil stack. For example, first transmitter coil 302 can be positioned in a first layer, second transmitter coil 304 can be positioned in a second layer above the first layer, and third transmitter coil 306 can be positioned in a third layer above the first and second layers. Each transmitter coil can be formed of a single layer of wire that is wound from an outer radius to an inner radius so that it forms a flat, ring-like shape, as will be discussed in detail further herein. As shown in FIG. 3, each transmitter coil is shown without a central member (e.g., a "bobbin" as will also be discussed further herein) so that other transmitter coils located in layers below the transmitter coil can be seen for ease of understanding.

In some embodiments, first, second, and third transmitter coils 302, 304, and 306 can each include a central termination zone. A central termination zone can be a region at the center of each transmitter coil that is reserved for interfacing with an interconnection layer, such as a printed circuit board (PCB). As shown in FIG. 3, first, second, and third transmitter coils 302, 304, and 306 can have central termination zones 316, 318, and 320, respectively. Central termination zones 316, 318, and 320 can be regions at the center of each transmitter coil reserved for interfacing with the interconnection layer, as will be discussed further herein. Accordingly, first, second, and third transmitter coils 302, 304, and 306 can be positioned in locations where their respective central termination zones can interface with the interconnection layer without being blocked by a neighboring transmitter coil. For instance, central termination zone 316 of transmitter coil 302 is laterally positioned outside of the outer diameter of transmitter coil 304 and 306. The same can be said for central termination zones 318 and 320. Accordingly, central termination zones 316, 318, and 320 can extend through the transmitter coil stack without intersecting another transmitter coil. In some embodiments, central termination zones 316, 318, and 320 may be positioned equally spaced apart from one another such that the central termination zones 316, 318, and 320 form an equilateral triangle 322.

2. Rosette Pattern

As mentioned above, the base pattern can be expanded upon to form other patterns for different shapes and sizes of wireless charging mats. One of such patterns is a rosette pattern, which may be suitable for substantially circular wireless charging mats given its circular profile. The rosette pattern can be a pattern where the transmitter coils are arranged in an overlapping arrangement such that different coils in the plurality of coils are on different planes and are non-concentric with each other. In an expanded base pattern, one or more transmitter coil layers can include more than one transmitter coil.

Figure 4:
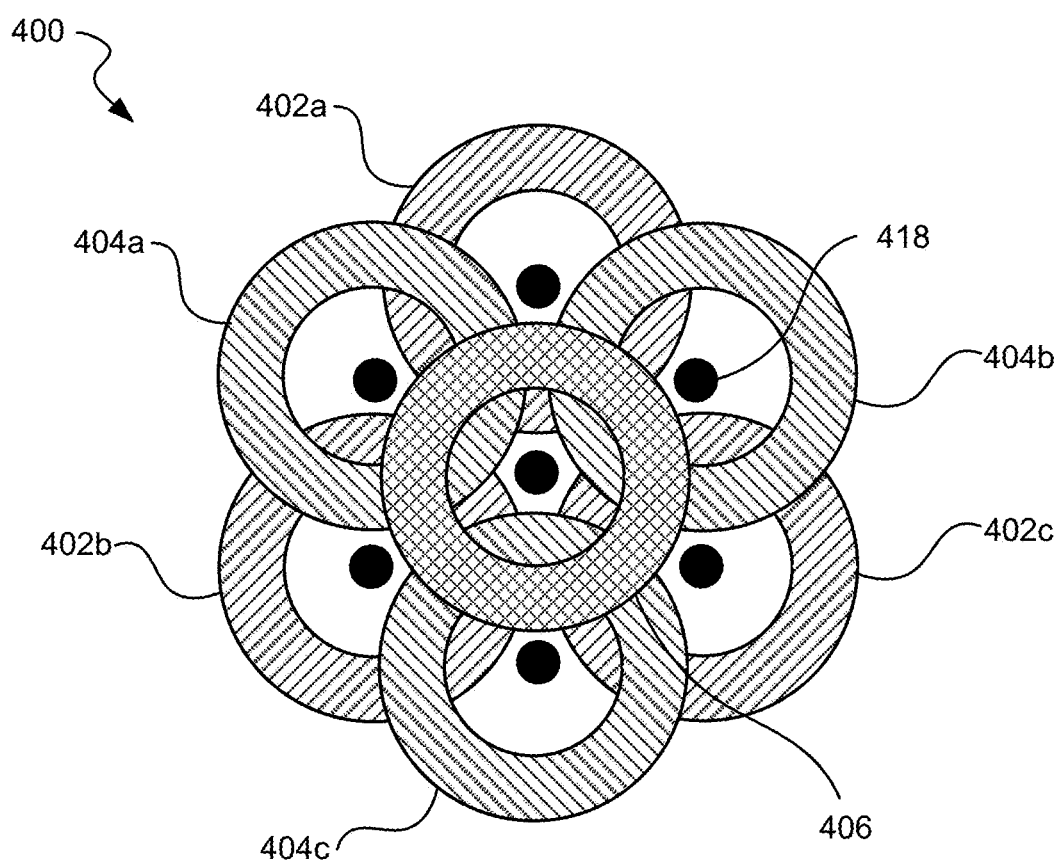
FIG. 4 is a simplified diagram illustrating an exemplary transmitter coil arrangement configured in a rosette pattern, according to some embodiments of the present disclosure.

FIG. 4 illustrates an exemplary transmitter coil arrangement 400 configured in a rosette pattern, according to some embodiments of the present disclosure. Transmitter coil arrangement 400 can include three separate transmitter coil layers where one or more of those layers include multiple transmitter coils. For example, a first transmitter coil layer can include transmitter coils 402a-c, a second transmitter coil layer can include transmitter coils 404a-c, and a third transmitter coil layer can include transmitter coil 406. Each transmitter coil in transmitter coil arrangement 400 can have an opening defined by an inner diameter of the transmitter coil, where each opening includes a termination zone 418 (i.e. central portion) that is not overlapping any portion of an adjacent transmitter coil. Additionally, the transmitter coils are arranged such that no two coils in the plurality of coils are concentric with each other.

The base pattern may be pervasive throughout the rosette pattern such that every group of three transmitter coils, one in each transmitter coil layer, that are closest together is arranged in the base pattern. For instance, transmitter coils 402a, 404a, and 406 are arranged in the base pattern. Likewise, transmitter coils 402a, 404b, and 406 are arranged in the base pattern, transmitter coils 404b, 402c, and 406 are arranged in the base pattern, and so on and so forth. By arranging transmitter coil arrangement 400 according to the base pattern, transmitter coil arrangement 400 can create a continuous charging region within which an electronic device can charge in any location.

To better understand the arrangement of an expanded base pattern, FIGS. 5A-5C illustrate the different layers of transmitter coil arrangement 400. Specifically, FIG. 5A illustrates the first layer including transmitter coils 402a-c, FIG. 5B illustrates the second layer including transmitter coils 404a-c, and FIG. 5C illustrates the third layer including transmitter coil 406. According to embodiments, transmitter coils in the same layer can be equally spaced apart so that the generated magnetic fields can be arranged in an evenly spaced grid pattern. For example, transmitter coils 402a-c and 404a-c can be spaced apart by a distance D1. The distance D1 may be selected to be wide enough for parts of transmitter coils in other layers to fit within it for stacking purposes, as will be discussed further herein. In other embodiments, the distance D1 may be selected to be wide enough so that adjacent transmitter coils do not make contact with each other. For instance, distance D1 may be less than 3 mm. In a particular embodiment, distance D1 is less than 1 mm.

The center of each transmitter coil in the same layer can be separated by a distance D2. Distance D2 can affect the uniformity of magnetic flux across the charging surface. Larger distances D2 result in lower magnetic flux uniformity across the charging surface, whereas smaller distances D2 result in higher magnetic flux uniformity across the charging surface. In some embodiments, distance D2 is selected to be the smallest distance that allows for a suitable distance D1 between transmitter coils while taking into consideration the outer diameter of each transmitter coil. In additional embodiments, distance D2 is the same for all adjacent transmitter coils in the same layer. Thus, groups of three transmitter coils (e.g., transmitter coils 402a-c and 404a-c in each of the first and second layers, respectively) can be arranged according to the end points of an equilateral triangle 422.

Although FIGS. 5A and 5B illustrate only three transmitter coils in a single transmitter coil layer, it is to be appreciated that embodiments are not limited to transmitter coil layers having only three coils. Instead, other embodiments can include transmitter coil layers having more than three transmitter coils. In such embodiments, the transmitter coils are arranged equally spaced apart and placed in positions corresponding to corners of equilateral triangles.

B. Expanding Transmitter Coil Patterns

Figure 6A:
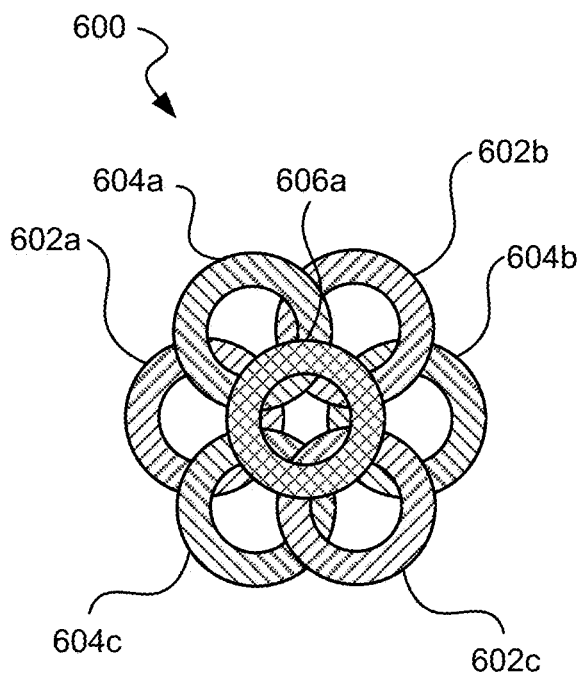
FIGS. 6A-6E are simplified diagrams illustrating an expansion of a pattern of transmitter coils, according to some embodiments of the present disclosure.
Figure 6B:
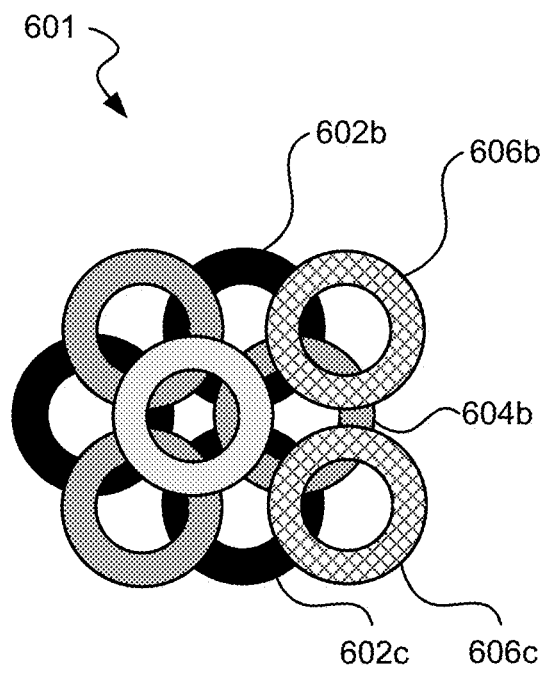
Figure 6C:
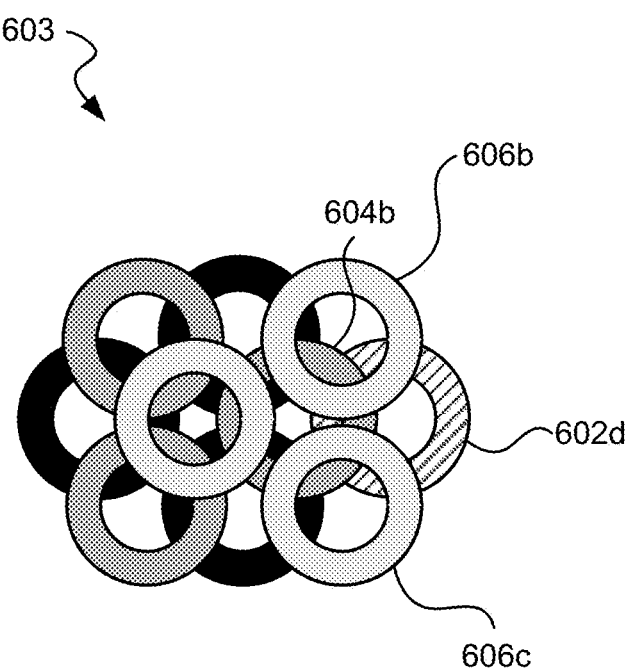

Like the base pattern, the rosette pattern (or any other pattern formed from the base pattern) can be expanded to form larger sets of transmitter coils for different shapes and sizes of wireless charging mats. FIGS. 6A-6C illustrate an expansion of a pattern of transmitter coils according to some embodiments of the present disclosure. FIG. 6A illustrates an initial pattern 600, and FIGS. 6B and 6C each illustrate the initial pattern after it has been expanded by an incremental transmitter coil layer.

Initial pattern 600 in FIG. 6A is shown as a transmitter coil arrangement 600 arranged in a rosette pattern, though one skilled in the art understands that any initial pattern formed from the base pattern can be used as the initial pattern. Initial pattern 600 includes three transmitter coil layers where a first layer includes transmitter coils 602a-c, a second layer includes transmitter coils 604a-c, and a third layer includes transmitter coil 606a. The second layer can be disposed between the first and third layers.

The way in which a pattern of transmitter coils may be expanded can be based on its existing transmitter coil arrangement. For instance, adding a transmitter coil to the existing pattern can be based on the layers in which the closest transistor coils are positioned, where the transmitter coil added to the pattern is placed in the layer in which the closest transmitter coils are not positioned. As an example, if the closest transmitter coils are positioned in the first and second layers, then the next transmitter coil used to expand the pattern is positioned in the third layer. Likewise, if the closest transmitter coils are positioned in the first and third layers, then the next transmitter coil is placed in the second layer; and if the closest transmitter coils are positioned in the second and third layers, then the next transmitter coil is placed in the first layer. This approach may be used to expand the pattern each time an additional coil is added to the existing transmitter coil arrangement. Each transmitter coil added to the pattern is positioned according to the base pattern discussed herein with respect to FIG. 3.

In the particular example shown in FIG. 6B, transmitter coils 606b and 606c are added to transmitter coil arrangement 600 to form transmitter coil arrangement 601. Using the approach discussed herein, transmitter coils 606b and 606c are placed in the transmitter coil arrangement 601 according to the positions of the outermost transmitter coils. Since the outermost transmitter coils 602b, 602c, and 604b, are positioned in the first and second layers, transmitter coils 606b and 606c can be positioned in the third layer. Expanding the pattern by another transmitter coil layer follows the same approach. For instance, as shown in FIG. 6C, transmitter coil 602d is added to transmitter coil arrangement 601 to form transmitter coil arrangement 603. Since the outermost transmitter coils 606b, 606c, and 604b are positioned in the second and third layers, transmitter coil 602d can be positioned in the first layer.

Figure 6D:
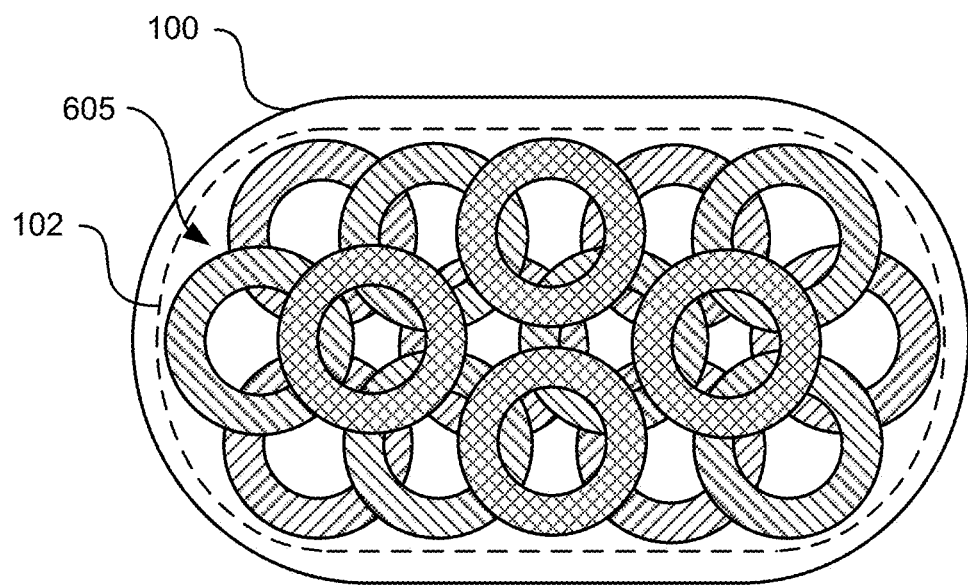

Transmitter coil arrangement 600 can be expanded to any degree according to any design. For instance, transmitter coil arrangement 600 can be expanded according to a 16-coil design. FIG. 6D illustrates exemplary transmitter coil arrangement 605 formed of 16 coils, according to some embodiments of the present disclosure. As shown, the transmitter coils in transmitter coil arrangement 605 can be organized in an overlapping arrangement such that different coils in the plurality of coils are on different planes and are non-concentric with each other. Transmitter coil arrangement 605 can be similar to the coil arrangement of transmitter coil arrangement 200 briefly discussed herein with respect to FIG. 2. Thus, each transmitter coil can be positioned to provide broad coverage across charging surface 102 of charging mat 100.

Figure 6E:
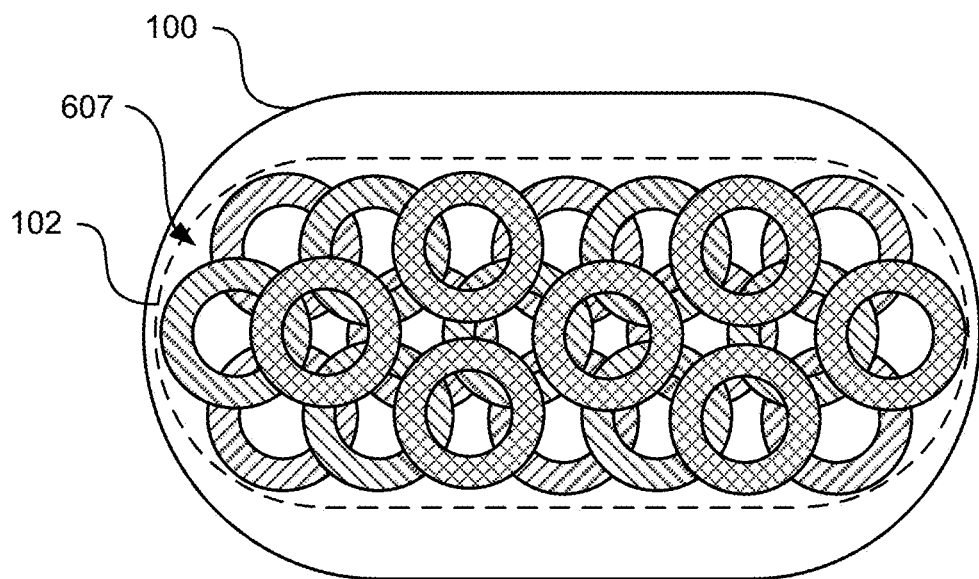

In some embodiments, transmitter coil arrangement 600 can be expanded further according to a different design. As an example, transmitter coil arrangement 600 can be expanded according to a 22-coil design. FIG. 6E illustrates exemplary transmitter coil arrangement 607 formed of 22 coils, according to some embodiments of the present disclosure. As shown, six additional coils can be added to the 16-coil design according to the steps explained herein with respect to FIGS. 6A-6C. Adding additional coils can alter the shape and coverage of charging surface 102. Furthermore, adding additional coils can change the density of magnetic flux across charging surface 102. More coils may result in a larger charging surface 102 and a greater density of magnetic flux across charging surface 102 than a transmitter coil arrangement with less coils.

C. Coverage of Transmitter Coil Patterns

According to embodiments of the present disclosure, transmitter coils arranged in patterns formed from the base pattern can generate magnetic fields that form a continuous charging surface. The continuous charging surface allows electronic devices resting upon the charging surface to receive power in any location within it, thereby enhancing the ease at which a user may charge his or her device.

Figure 7A:
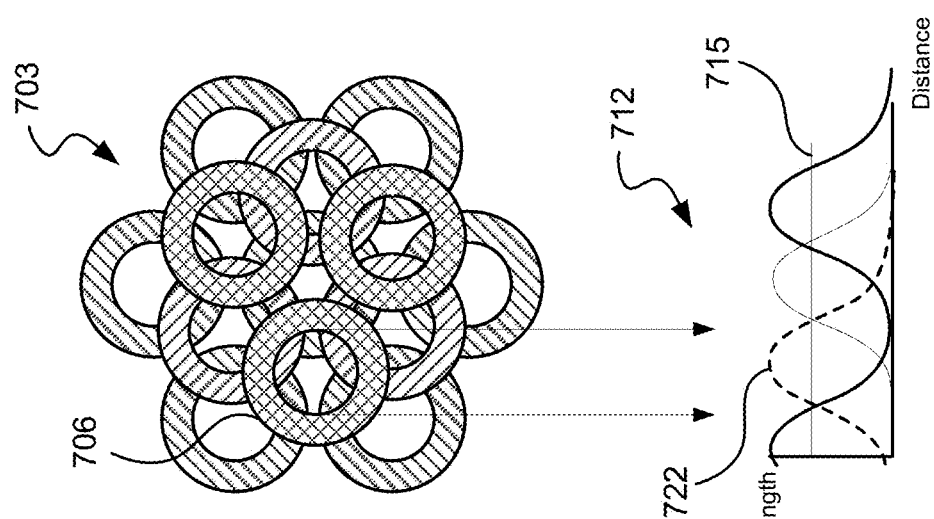
FIGS. 7A-7C are simplified diagrams and charts illustrating the formation of a continuous charging surface, according to embodiments of the present disclosure.
Figure 7B:
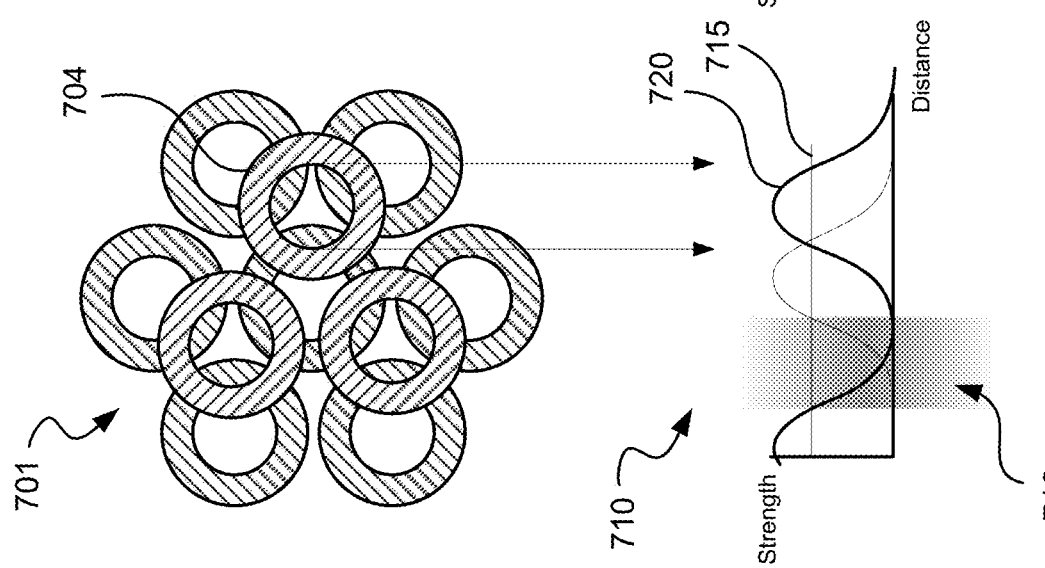
Figure 7C:
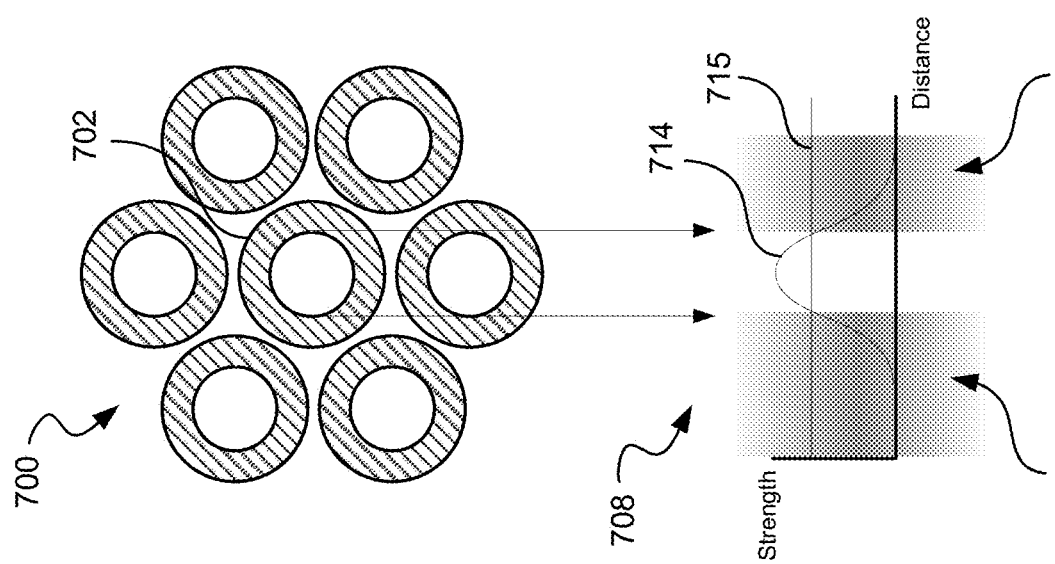

FIGS. 7A-7C illustrate how the pattern of the transmitter coils creates the continuous charging surface, according to embodiments of the present disclosure. Each figure illustrates a separate layer of a transmitter coil arrangement and shows a corresponding graph plotting the strength of a magnetic field across a distance. The graph plots the strength of one transmitter coil, but can be applied to all transmitter coils in the same layer. Each graph has a Y-axis representing strength of the magnetic field (which may be expressed by the unit H representing amperes per meter) increasing upward, and an X-axis representing horizontal distance across a charging surface increasing to the right.

FIG. 7A illustrates an array of transmitter coils 700 and a graph 708 representing a strength-to-distance curve of a magnetic field generated by a transmitter coil 702, according to some of the present disclosure. Array of transmitter coils 700 can be an array of transmitter coils positioned within a first layer of a transmitter coil arrangement. In some embodiments, transmitter coil 702 generates a magnetic field having a strength-to-distance curve 714 that peaks near the center of transmitter coil 702 and decreases as you move farther away from the center of curve 714.

In order for the transmitter coil to perform wireless charging, the transmitter coil may need to generate a magnetic field that is strong enough to extend above a charging surface. The threshold at which wireless charging is enabled may be represented by a strength threshold 715 shown in graph 708. Portion of curve 714 above strength threshold 715 may be sufficient for wireless charging, and those portions of curve 714 below strength threshold 715 may be insufficient for wireless charging. Portions of curve 714 below strength threshold 715 may be designated as "dead zones" 716 and 718 where the magnetic field is not strong enough to wirelessly charge an electronic device resting on the charging surface.

Thus, according to embodiments, additional layers can be incorporated in the transmitter coil arrangement to fill in the dead zones. As shown in FIG. 7B, a second transmitter coil layer can be placed on top of the first transmitter coil layer in a manner congruent to the arrangement of the base pattern discussed herein to fill in at least some of the dead zones of the first layer, thereby resulting in transmitter coil arrangement 701. The second transmitter coil layer can include a transmitter coil 704 that has a magnetic field strength-to-distance curve 720. By including transmitter coil 704 in the second layer, the magnetic fields generated by transmitter coil 704 (and other transmitter coils in the second layer) can fill in dead zone 718 from the first layer. Thus, portions of the charging surface corresponding to the transmitter coils in the second layer may be able to perform wireless charging.

As can be appreciated from chart 720, there may still be some dead zones even with the addition of the second layer. For instance, portions of dead zone 716 may still exist, thereby causing some regions of the charging surface to not be capable of performing wireless charging, and resulting in a discontinuous charging surface. Thus, according to some embodiments of the present disclosure, a third layer can be incorporated to fill in the remaining dead zones.

FIG. 7C illustrates a third transmitter coil layer formed on top of the first and second transmitter coil layers to form transmitter coil arrangement 703. In some embodiments, the second transmitter coil layer can be positioned between the first and third transmitter coil layers. Third transmitter coil layer can include a transmitter coil 706 that has a magnetic field strength-to-distance curve 722. By including transmitter coil 706 in the third layer, the magnetic fields generated by transmitter coil 706 (and other transmitter coils in the second layer) can fill in dead zone 716 from the first and second layers. Accordingly, there may no longer be any dead zones within the charging surface, thereby creating a continuous charging surface within which an electronic device can be wirelessly charged when resting in any location.

Although FIGS. 7A-7C illustrate a transmitter coil arrangement that has only three layers to create a continuous charging surface, embodiments are not limited to such configurations. Other embodiments can have more or less than three layers to form a continuous charging surface, without departing from the spirit and scope of the present disclosure.

D. Rotational Arrangement of Transmitter Coils

Arranging the transmitter coils so that they overlap one another in different layers increases the z-height (e.g., thicknesses) of the transmitter coil arrangement when assembled as compared to an array of similar coils arranged in a single layer. According to some embodiments of the present disclosure, transmitter coils in a transmitter coil arrangement can be oriented in various radial directions to minimize the z-height of a transmitter coil arrangement as described in various embodiments discussed below. A radial direction is the angle at which a transmitter coil is radially aligned with respect to a reference direction, which may be any arbitrary angular direction such as true north. The radial direction of a transmitter coil may be defined by an angular difference between a reference location of the transmitter coil and the reference direction.

Figure 8A:
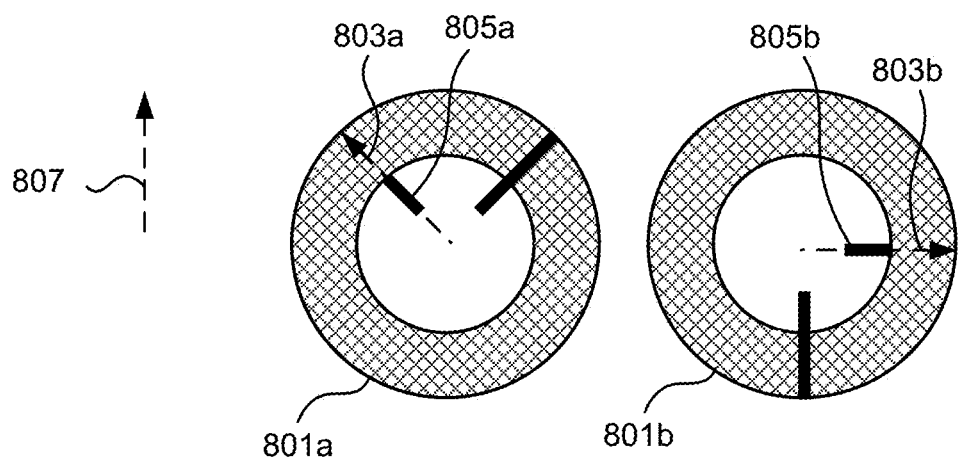
FIG. 8A is a simplified diagram illustrating exemplary radial directions for two transmitter coils, according to some embodiments of the present disclosure.

FIG. 8A illustrates exemplary reference locations for transmitter coils 801a-b with respect to an exemplary reference direction 807. Exemplary reference direction 807 may be an angular direction corresponding to true north as shown in FIG. 8A. A reference location may be represented by any structural part of a transmitter coil that is common in all other transmitter coils. For instance, a reference location 803a of transmitter coil 801a can be represented by a termination end 805 of transmitter coil 801a. Likewise, a reference location 803b of transmitter coil 801b can be represented by a corresponding termination end 805b of transmitter coil 801b. The radial direction of transmitter coil 801a can be defined by the angle between reference location 807 and reference location 803a, and the radial direction of transmitter coil 801b can be defined by the angle between reference direction 807 and reference location and 803b. Thus, transmitter coil 801a may be arranged in a different radial direction than transmitter coil 801b as shown in FIG. 8A.

The particular way these transmitter coils are arranged can be based on one or more factors. For instance, the structure of the transmitter coil can include protrusions that can fit in the spaces between transmitter coils in adjacent layers, thereby minimizing z-height. As an example, a transmitter coil in the first layer can have protrusions that fit in the space between adjacent transmitter coils in the second layer. Details of such structures will be discussed further herein.

Figure 8B:
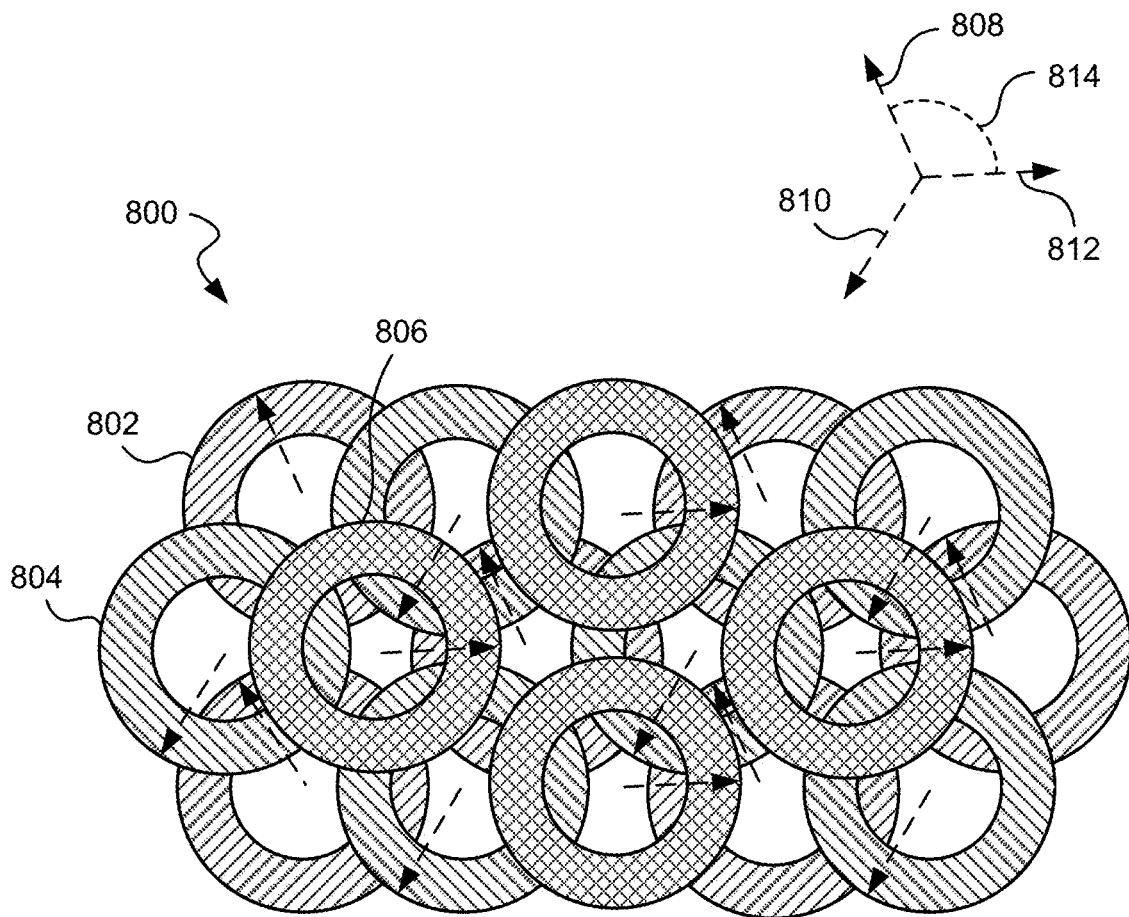
FIG. 8B is a simplified diagram illustrating an exemplary transmitter coil arrangement formed of three transmitter coil layers where the transmitter coils of each layer is arranged in a different radial direction than the other layers, according to some embodiments of the present disclosure.

Transmitter coils in different transmitter coil layers can be arranged in different radial directions. FIG. 8B illustrates an exemplary transmitter coil arrangement 800 formed of three transmitter coil layers: a first transmitter coil layer 802, a second transmitter coil layer 804, and a third transmitter coil layer 806, where the transmitter coils of each layer is arranged in a different radial direction than the other layers. Transmitter coil arrangement 800 is shown in an arrangement suitable for a pill-shaped wireless charging mat, such as wireless charging mat 100 in FIGS. 1 and 2, though it is to be appreciated that embodiments are not limited to such arrangements, and that other embodiments can have transmitter coil arrangements suitable for other shapes of wireless charging mats without departing from the spirit and scope of the present disclosure.

As shown in FIG. 8B, transmitter coils of first transmitter coil layer 802 can be arranged in a first radial direction 808, transmitter coils of second transmitter coil layer 804 can be arranged in a second radial direction 810, and transmitter coils of third transmitter coil layer 806 can be arranged in a third radial direction 812. First, second, and third radial directions 808, 810, and 812 can be offset from one another by an angular offset 814. The degree angular offset 814 may be determined to be an angle that enables transmitter coils of first, second, and third transmitter coil layers 802, 804, and 806 to achieve minimal z-height when transmitter coil arrangement 800 is assembled, as will be discussed in detail further herein. In some embodiments, angular offset 814 ranges between 110 to 130 degrees, particularly around 120 degrees in certain embodiments.

While transmitter coils in different layers can be arranged in different radial directions, transmitter coils in the same coplanar layer can be arranged in the same radial direction. To better illustrate this concept, FIGS. 9A-9C each illustrate a different transmitter coil layer of transmitter coil arrangement 800 in FIG. 8B. Specifically, FIG. 9A illustrates first transmitter coil layer 802, FIG. 9B illustrates second transmitter coil layer 804, and FIG. 9C illustrates third transmitter coil layer 806.

Figure 9A:
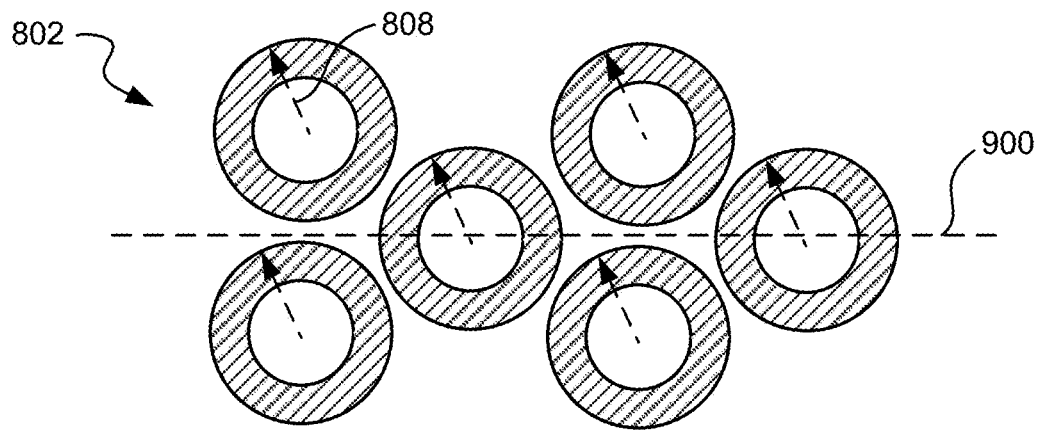
FIGS. 9A-9C are simplified diagrams illustrating different transmitter coil layers of the transmitter coil arrangement illustrated in FIG. 8B, according to some embodiments of the present disclosure.
Figure 9B:
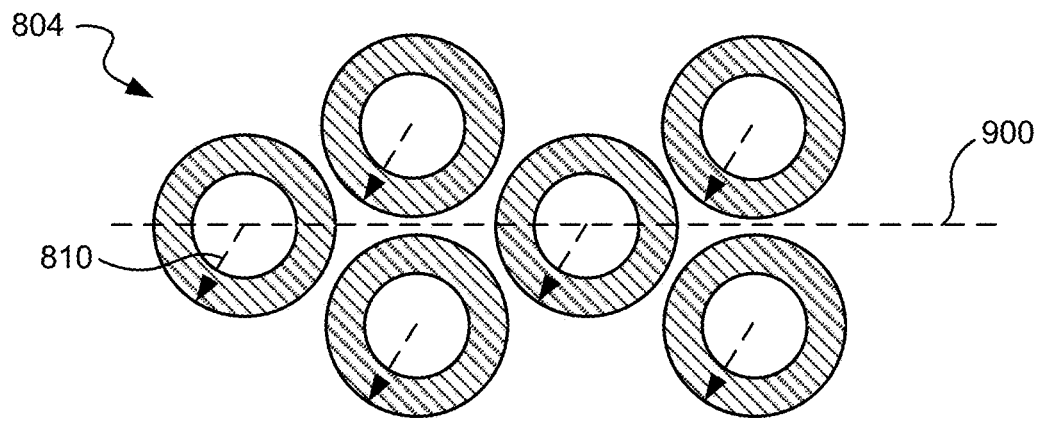
Figure 9C:
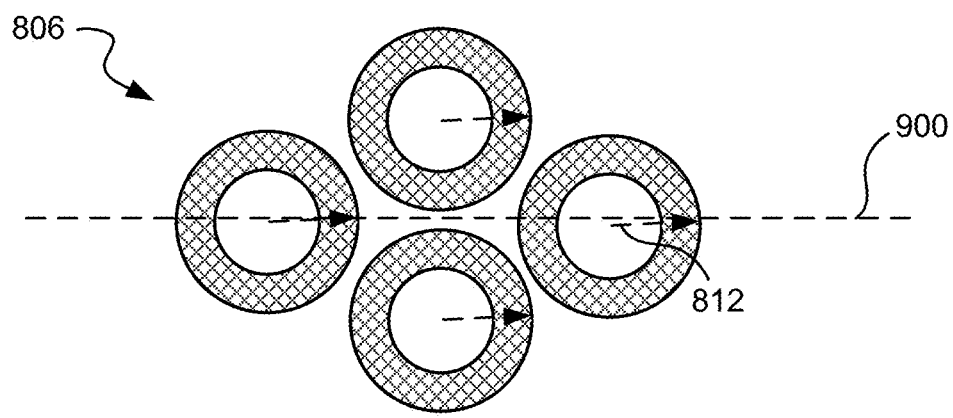

As can be seen from FIGS. 9A-9C, transmitter coils 802 are all arranged in the same radial direction, e.g., first radial direction 808. Likewise, transmitter coils 804 are all arranged in radial direction 810, and transmitter coils 806 are all arranged in radial direction 812. In some embodiments, the transmitter coils in the same layer are substantially coplanar. Additionally, adjacent transmitter coils in the same coplanar layer are positioned the same distance away from one another, as discussed herein with respect to FIGS. 5A and 5B. Furthermore, each set of transmitter coils in a coplanar layer are symmetrical across a horizontal axis 900. In some embodiments, only two out of the three layers of transmitter coils has the same number of transmitter coils. For instance, transmitter coils 802 in the first layer has the same number of transmitter coils as transmitter coils 804 in the second layer. Transmitter coils 806 in the third layer can have a different number of transmitter coils than the other two layers, such as two less transmitter coils than the other two layers. This phenomenon is an artifact of the expanded rosette pattern discussed herein above.

Figure 10:
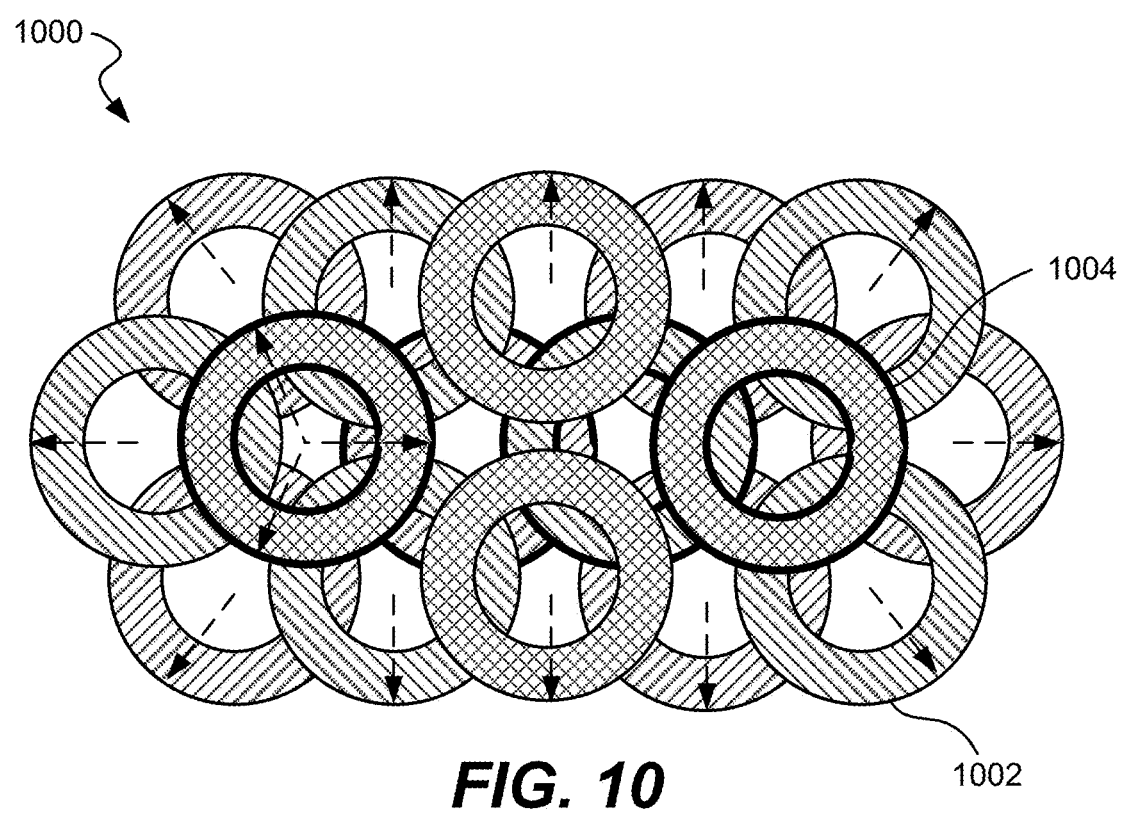
FIG. 10 is a simplified diagram illustrating an exemplary transmitter coil arrangement where transmitter coils are arranged in different radial directions based on their position in the transmitter coil arrangement, according to some embodiments of the present disclosure.

FIGS. 8B and 9A-9C illustrate one exemplary transmitter coil arrangement; however, embodiments are not limited to such arrangements. Other embodiments can have different transmitter coil arrangements. As an example, FIG. 10 illustrates an exemplary transmitter coil arrangement 1000 that includes sixteen individual coils where the transmitter coils are arranged in different radial directions based on their position in the transmitter coil arrangement, according to some embodiments of the present disclosure. For instance, transmitter coil arrangement 1000 can include twelve outer transmitter coils 1002 and four inner transmitter coils 1004. Outer transmitter coils 1002 may be a set of transmitter coils positioned near the outermost regions of transmitter coil arrangement 1000, while inner transmitter coils 1004 may be those transmitter coils surrounded by outer transmitter coils 1002. As shown in FIG. 10, inner transmitter coils 1004 are indicated by bolded lines, and outer transmitter coils 1002 are indicated by non-bolded lines for ease of observation.

In some embodiments, outer transmitter coils 1002 are arranged in a different radial direction than inner transmitter coils 1004. As shown in FIG. 10, outer transmitter coils 1002 can be arranged in a radial direction pointing toward the outer edges of transmitter coil arrangement 1000, while inner transmitter coils 1004 can be arranged in various radial directions. Arranging outer transmitter coils 1002 in such a manner enables some portions of outer transmitter coils 1002 to be positioned away from an inner region of a charging surface. Such portions may be less efficient portions of the transmitter coils due to the structural configuration of the transmitter coil, as will be discussed further herein.

Figure 11A:
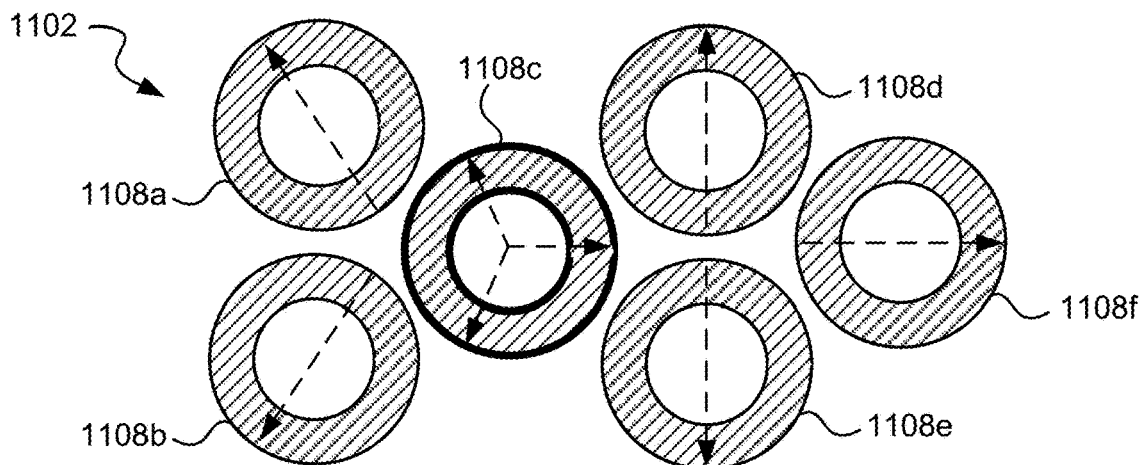
FIGS. 11A-11C are simplified diagrams illustrating different transmitter coil layers of the transmitter coil arrangement illustrated in FIG. 10, according to some embodiments of the present disclosure.
Figure 11B:
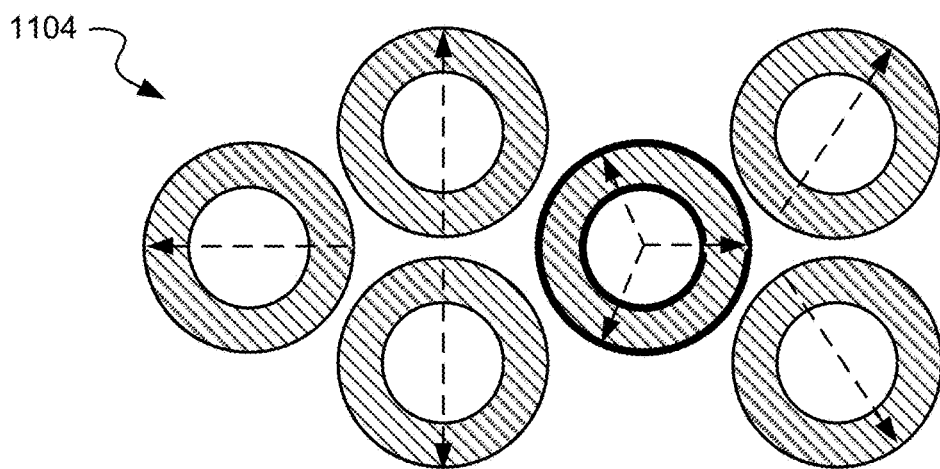
Figure 11C:
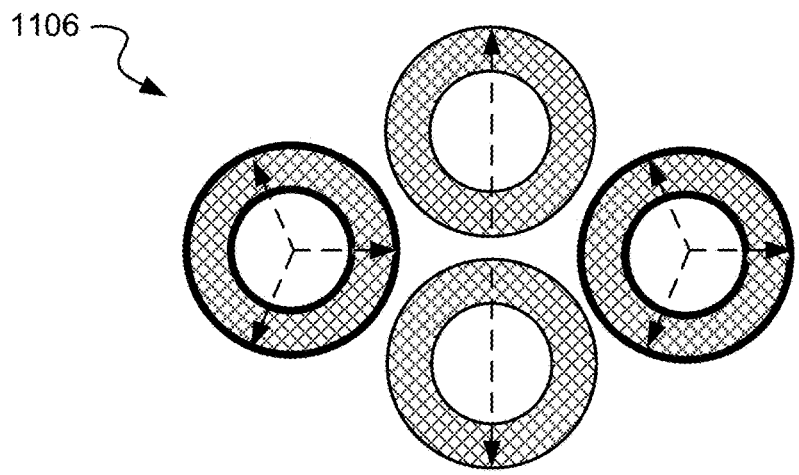

Given the multi-layered construction of transmitter coil arrangement 1000, transmitter coils in the same coplanar layer can be arranged in different directions. FIGS. 11A-11C each illustrate a different transmitter coil layer of transmitter coil arrangement 1000 in FIG. 10. Specifically, FIG. 11A illustrates a first transmitter coil layer 1102, FIG. 11B illustrates a second transmitter coil layer 1104, and FIG. 11C illustrates a third transmitter coil layer 1106 of transmitter coil arrangement 1000.

As can be seen from FIGS. 11A-11C, one or more transmitter coils in first transmitter coil layer 1102 are arranged in a different radial direction than other transmitter coils in the same layer. Transmitter coils that are part of outer transmitter coils 1002 in FIG. 10, e.g., transmitter coils 1108a, 1108b, 1108d, 1108e, and 1108f, can be arranged so that their radial direction face outward as discussed herein with respect to FIG. 10 to achieve a more even charging surface across a wireless charging mat. Conversely, transmitter coils that are part of inner transmitter coils 1104 in FIG. 10, e.g., transmitter coil 1108c, can be arranged so that its radial direction is an increment of between 110 to 130 degrees, such as 120 degrees discussed herein with respect to FIG. 8B. Transmitter coils that are part of respective inner and outer transmitter coils in the second and third transmitter coil layers, as shown in FIGS. 11B and 11C, can also be arranged based on the same principles.

Figure 12A:
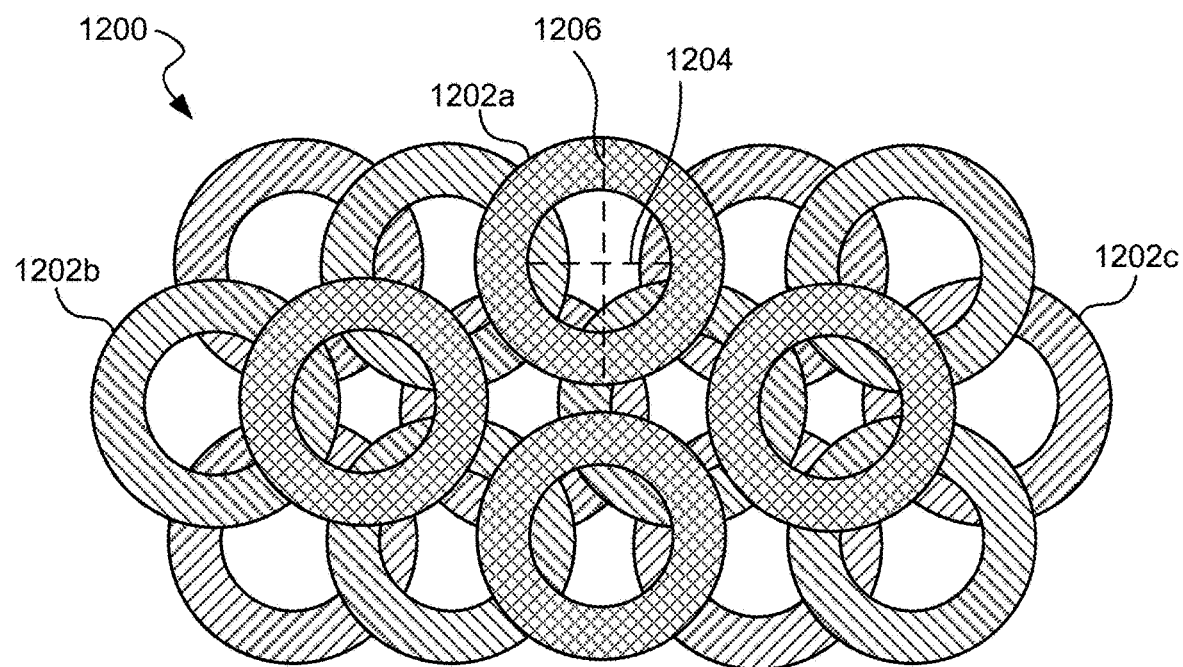
FIG. 12A is a simplified diagram illustrating an exemplary transmitter coil arrangement where all transmitter coils have substantially the same dimensions than other transmitter coils in the transmitter coil arrangement, according to some embodiments of the present disclosure.

Transmitter coils shown in FIGS. 2-11C in respective transmitter coil arrangements can have similar dimensions. For example, transmitter coils in each transmitter coil arrangement can have the same inner diameter and outer diameter. FIG. 12A illustrates an exemplary transmitter coil arrangement 1200 where all of the transmitter coils have substantially the same dimensions, e.g., the same inner and outer diameters. An inner diameter can be defined by the diameter of a perimeter formed by the turn of a transmitter coil that is closest to its center, and an outer diameter can be defined by the diameter of a perimeter formed by the turn of a transmitter coil that is farthest from its center. For instance, transmitter coil 1202a can have an inner diameter 1204 and an outer diameter 1206. Even transmitter coils 1202b and 1202c positioned at the farthest left and right positions in transmitter coil arrangement 1200 can have substantially the same dimensions as all other transmitter coils. In some embodiments, transmitter coils have substantially the same dimensions when their respective inner and outer diameters differ by less than 10%, particularly less than 5% in certain embodiments.

Although transmitter coils arrangement discussed herein can have the substantially the same dimensions, some embodiments can have transmitter coil arrangements where some transmitter coils have different dimensions than other transmitter coils in the same transmitter coil arrangement, as will be discussed herein with respect to FIG. 12B.

Figure 12B:
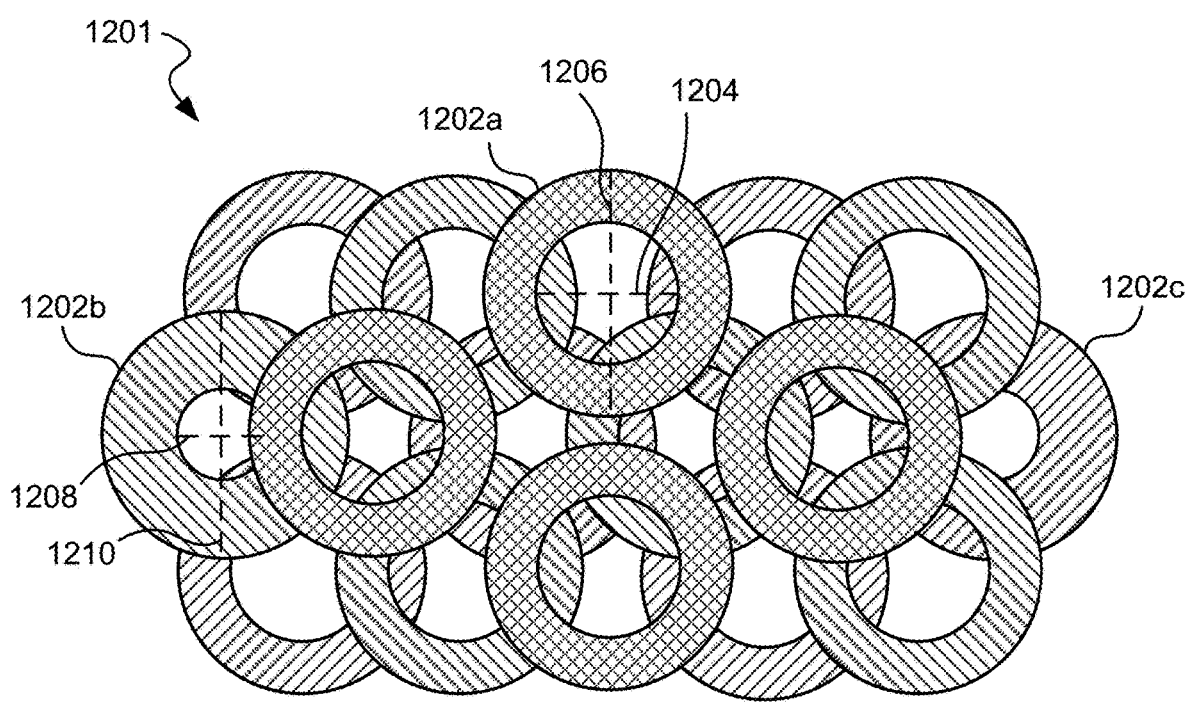
FIG. 12B is a simplified diagram illustrating an exemplary transmitter coil arrangement where one or more transmitter coils have different dimensions than other transmitter coils in the transmitter coil arrangement, according to some embodiments of the present disclosure.

FIG. 12B illustrates an exemplary transmitter coil arrangement 1201 where one or more transmitter coils have different dimensions than other transmitter coils in transmitter coil arrangement 1201, according to some embodiments of the present disclosure. In some embodiments, all other transmitter coils in transmitter coil arrangement 1200 can have the same inner and outer diameters 1204 and 1206 except for the transmitter coils that are positioned at the farthest left and right positions of transmitter coil arrangement 1200, such as transmitter coils 1202b and 1202c.

Transmitter coils 1202b and 1202c can have a smaller inner diameter than all other transmitter coils in transmitter coil arrangement 1200 because of their positions. The farthest left and right positions of transmitter coil arrangement 1200 have the least density of transmitter coils by virtue of being at the very edge of the transmitter coil arrangement. Thus, magnetic flux generated in those positions may be less dense than magnetic flux generated at other areas of transmitter coil arrangement 1200, such as magnetic flux generated near the center of transmitter coil arrangement 1200. Accordingly, one or more transmitter coils located at the farthest left and right positions can have different coil dimensions to increase the magnetic flux density produced at those areas of the transmitter coil arrangement. For instance, transmitter coils 1202b and 1202c can have a smaller inner diameter 1208 but the same outer diameter 1210 when compared to other transmitter coils in transmitter coil arrangement 1200, e.g., transmitter coil 1202a. By having a smaller inner diameter, transmitter coils 1202b and 1202c can have more turns, thereby being capable of generating a greater amount of flux. In some embodiments, inner diameter 1208 is approximately three to five mm less than inner diameter 1204. For instance, inner diameter 1208 can be approximately 4 mm less than inner diameter 1204 such that inner diameter 1208 is 13 mm and inner diameter 1204 is 17 mm. It is to be appreciated that other embodiments can modify the shape and/or geometry of the transmitter coils to achieve a smoother charging region. Additionally, the shape of one or more transmitter coils can be modified based on the geometry of the wireless charging mat and the location of the transmitter coils with respect to the wireless charging mat. For instance, if the wireless charging mat is in the general shape of a square or of another shape that has several straight edges, some transmitter coils disposed at the edges of the wireless charging mat can be in the shape of a "D" such that the straight edges of the transmitter coil can correspond to the straight edges of the wireless charging mat.

III. Transmitter Coil Structure

As illustrated in FIGS. 2-12, the transmitter coils are shown as circular "O"-shaped rings. It is to be appreciated that the circular "O"-shaped rings represent a coil of wire for generating time-varying magnetic fields capable of inducing a corresponding current in a receiver coil for performing wireless charging. In some embodiments, the coil of wire may be formed of a coil of wire where each turn of the wire includes a bundle of smaller coils of wire. In other embodiments, the coil of wire may be formed of a coil of wire where each turn of the wire includes a single core of conductive material. While FIGS. 2-12 illustrate the transmitter coils as circular rings, in some embodiments each transmitter coil can have an outer perimeter with a generally circular shape that is not a perfect circle due to the width of the wire and the spiraling nature of the wire as described in further detail below. As used herein, a "generally circular" coil refers to both a coil with a circular perimeter and a coil that has a perimeter that is close to being circular as discussed below. In other embodiments, transmitter coils may be non-circular, such as hexagonal so that the coils may maximize usage of the space between adjacent transmitter coils, or any other suitable shape, e.g., square, oval, rectangular, triangular, and the like.

A. Transmitter Coil Wiring

FIG. 13A illustrates an exemplary coil of wire 1300 formed of a plurality of thin wires, according to some embodiments of the present disclosure. A single turn of wire can include a bundle 1302 of small conductive wires, as shown in FIG. 13B. FIG. 13B illustrates a cross-sectional view 1301 of a single turn of wire of coil 1300. The single turn of wire can include multiple thin wires 1305, which can be arranged in sub-bundles, such as sub-bundles 1303a, 1303b, and 1303c. The overall width of bundle 1302 of wires may be determined by the thickness of each thin wire 1305 and the manner in which the bundle 1302 of thin wires are arranged (e.g., how many thin wires 1305 are stacked together in the z direction to define the height, H, of each sub-bundle). In some embodiments, the thickness of each thin wire 1305 may range between 110 and 120 microns, resulting in a bundle 1302 of thin wire having a width ranging between 1 to 2 mm and a height (H) ranging between 0.4 to 0.7 mm. Using a bundle of thin wire for each turn of the coil may be particularly useful for generating stronger magnetic fields given its ability to achieve a large number of turns in a limited amount of space.

Coil of wire 1300 may be formed of a coil of wire that winds between an inner radius 1304 to an outer radius 1306. In some embodiments, coil of wire 1300 can be a flattened "O"-ring formed of single layer of wire that winds from inner radius 1304 to the outer radius 1306, or vice versa. Inner radius 1304 can be a non-zero radius that allows coil of wire 1300 to have a vacant inner space. Having the coil of wire 1300 wind in a single layer of wire minimizes the overall height of the coil, which thereby decreases the overall height of the wireless charging mat once the coils are assembled.

In particular embodiments, each thin wire 1305 is an electrically insulated wire that is covered in one or more layers of dielectric material, such as polyurethane. The layer of electrical insulation prevents the thin wires from shorting with an adjacent thin wire when coiled. Additionally, coil of wire 1300 as a whole can be covered with another layer of insulating material, such as polyimide, to attach the wound wires together to form a single structure of coiled wire. Coil of wire 1300 can be attached to a bobbin, as will be discussed further herein, and can thus be easily picked up and placed (e.g., using a robot as part of a manufacturing process) in a transmitter coil arrangement.

In some embodiments, instead of using a bundle of smaller coils, a single core of conductive material may be used for each turn of wire, as shown in FIG. 13C. FIG. 13C illustrates an exemplary coil of wire 1307 formed of a single core of conductive wire, according to some embodiments of the present disclosure. FIG. 13D illustrates a cross-sectional view 1309 of a single turn of wire of coil 1307. As shown in cross-sectional view 1309, the single turn of wire may be formed of a single core of conductive wire 1311 instead of a bundle of wires 1302 as shown in FIG. 13B. Using a single core of conductive wire for each turn of the coil of wire may be particularly useful for applications where the transmitter coil is formed in a PCB, which can be printed with conductive lines having very small dimensions. In some embodiments, the single core of conductive wire can have a width between 0.9 and 1.3 mm, and a height between 0.08 to 0.18 mm.

With reference back to FIG. 13A, coil of wire 1300 can have two termination ends: first termination end 1308 and second termination end 1310. The termination ends may be the avenue through which current can enter and exit through coil of wire 1300. In some embodiments, termination end 1310 can fold over coil 1300 to be positioned within an inner diameter of coil 1300 as shown in FIGS. 14A and 14B.

Figure 14A:
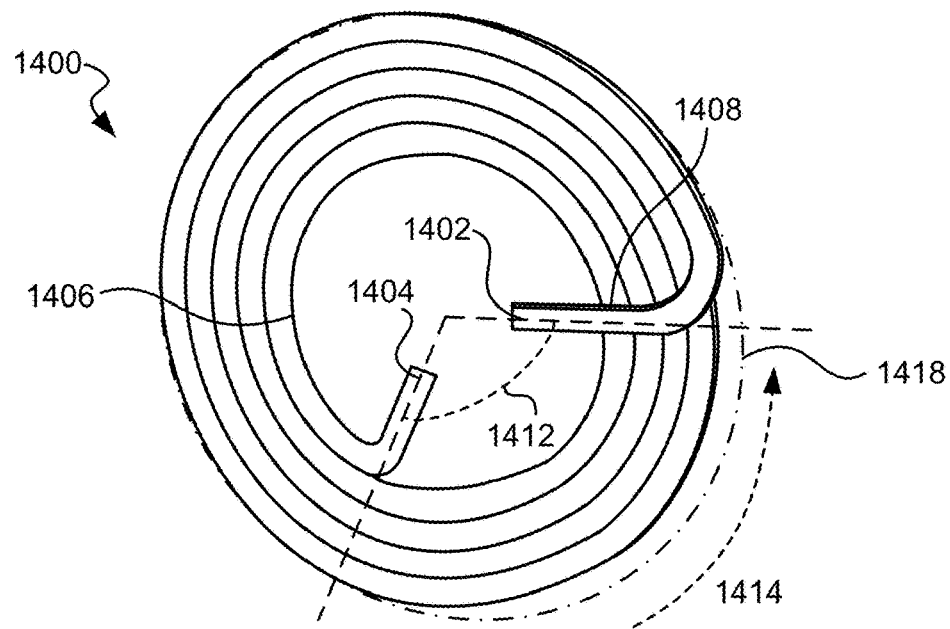
FIG. 14A is a simplified diagram illustrating a top perspective view of a coil of wire with termination ends positioned within an internal diameter of the coil of wire and arranged at an angle with respect to one another, according to some embodiments of the present disclosure.
Figure 14B:
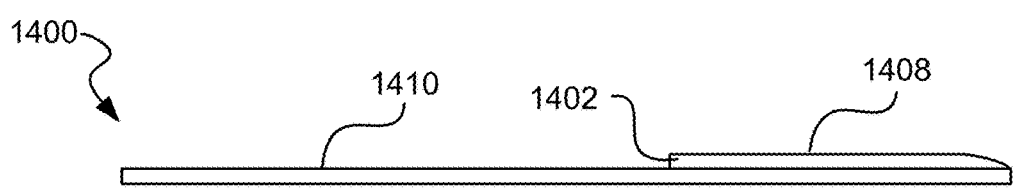
FIG. 14B is a simplified diagram illustrating a side view of the coil of wire illustrated in FIG. 14A, according to some embodiments of the present disclosure.

Specifically, FIG. 14A illustrates a top perspective view of a coil of wire 1400 with termination ends 1402 and 1404 positioned within an internal diameter 1406 of coil of wire 1400, according to some embodiments of the present disclosure, and FIG. 14B illustrates a side view of coil of wire 1400. Positioning termination ends 1402 and 1404 within the internal diameter of coil of wire 1400 simplifies how coil 1400 is coupled to another structure, such as a driver board, because it enables the coupling to be performed at a single location, e.g., the center of coil of wire 1400.

As shown in FIG. 14A, termination end 1402 bends over coil 1400 so that it is positioned within internal diameter 1406. Although termination end 1402 appears to bend over coil 1400 without folding over on itself, embodiments are not limited to such arrangements and that embodiments where termination end 1402 folds over itself to be positioned within internal diameter 1406 are envisioned herein as well. In some embodiments, a portion 1408 of the termination end 1402 rests on coil 1400 so that it protrudes above a plane of coil 1400. For instance, with reference to FIG. 14B, portion 1408 can extend above a plane 1410 of coil 1400 as defined by a surface formed by the winding of wire of coil 1400. The protrusion may be positioned on only one side of coil 1400 so that the other side of coil 1400 may not have a protrusion. Unlike termination end 1402, termination end 1404 may not protrude above plane 1410 as it may already be positioned within internal diameter 1406. In some embodiments, termination end 1404 can merely bend toward the center of coil 1400 without folding over coil 1400.

With reference back to FIG. 14A, the directions at which termination ends 1402 and 1404 turn toward the center of coil 1400 can, in some embodiments, form an angle 1412 with respect to each other. Angle 1412 may be determined based on an offset angle, such as offset angle 814 discussed herein with respect to FIG. 8B. Offset angle 814 may enable the overlapping portion 1408 of coil 1400 to be positioned in a gap between transmitter coils in an adjacent layer to minimize the z-height of a transmitter coil stack, as will be discussed further herein.

Figure 14C:
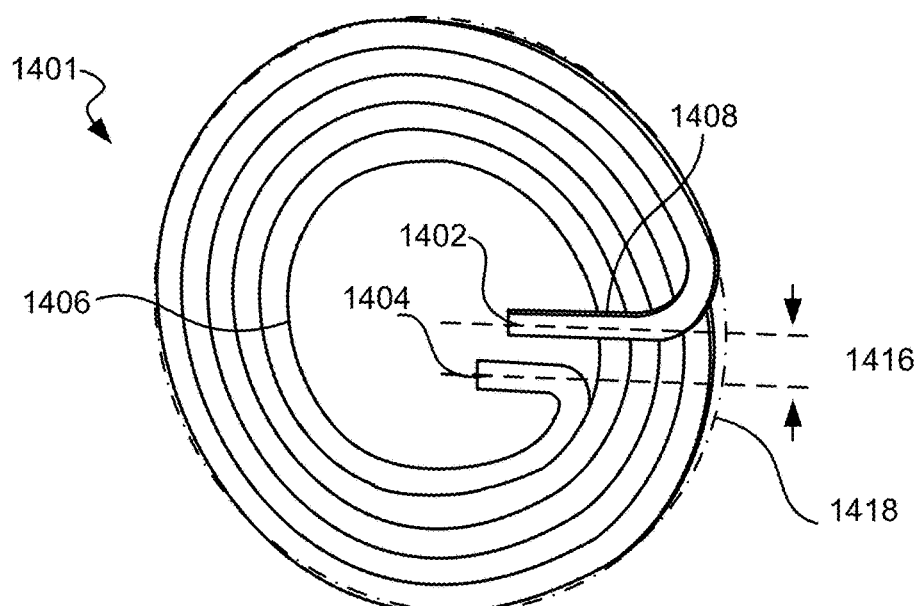
FIG. 14C is a simplified diagram illustrating a top perspective view of a coil of wire with termination ends positioned within an internal diameter of the coil of wire and arranged parallel to one another, according to some embodiments of the present disclosure.

As can be appreciated from FIG. 14A, a portion of coil of wire 1400 can have a different number of turns than other regions. For example, region 1414 of coil 1400 can have four turns of wire, while the rest of coil 1400 (e.g., regions of coil 1400 that is not part of region 1414) has five turns of wire as shown in FIG. 14A. In another example (not shown in FIG. 14A), region 1414 of coil 1400 can have more turns than the rest of coil 1400. It is to be appreciated that having more or less turns in region 1414 depends on the arrangement of termination ends 1402 and 1404 which define where the winding begins and ends. Accordingly, region 1414 may have different coupling characteristics with other transmitter coils when arranged in a transmitter coil arrangement than the other regions of coil 1400. As an example, region 1414 may have more coupling with other transmitter coils in a transmitter coil arrangement. Having more coupling may reduce the efficiency of the transmitter coil. Thus, in some embodiments, region 1414 may be minimized to mitigate coupling with other transmitter coils by reducing the angle at which termination ends 1402 and 1404 are positioned. For example, termination ends 1402 and 1404 can be positioned parallel to one another, as shown in FIG. 14C. In some embodiments, region 1414 is less than half of coil 1400 such that region 1414 is a smaller portion of coil 1400 than the rest of coil 1400.

FIG. 14C illustrates an exemplary coil of wire 1401 where termination ends 1402 and 1404 are arranged parallel to one another. By arranging termination ends 1402 and 1404 parallel to one another, region 1416 of coil 1401 having less turns than other regions of the coil may be minimized. For instance, region 1416 having only four turns of wire may be minimized to be the small distance between termination ends 1402 and 1404 shown in FIG. 14C. In comparison, region 1416 may be substantially smaller than region 1414 in FIG. 14A. Accordingly, by minimizing region 1416, coil 1401 may operate in a more efficient manner.

In some embodiments, due to the width of each turn of the wire that makes up coils 1400 and 1401, each coil can have a generally circular shape (as defined by the outer perimeter of the coil) that is not a true circle. That is, some regions of the outer perimeter of coils 1400 and 1401 may deviate from the outer perimeter of a true circle. For example, the outer perimeter of a true circle 1418, represented by dashed and dotted lines, is superimposed over coil 1400 and 1401 in FIGS. 14A and 14C. Portions of the outer perimeter of coils 1400 and 1401 having less turns, e.g., portions 1414 and 1416, may deviate from the outer perimeter of a true circle 1418 by having a shorter radius. The non-circular shape of the transmitter coils can dictate the organization of a transmitter coil arrangement to ensure an even charging efficiency across the entire surface of the charging region, as will be discussed further below.

As will be appreciated further herein, the different ways the termination ends are arranged may affect the radial directions of the coils as discussed herein with respect to FIGS. 8-11C. Details of this relationship will be discussed further herein with respect to FIGS. 17A-19.

B. Bobbin

According to some embodiments of the present disclosure, each coil of wire is wound around, and the termination ends of each coil are attached to, a central, disc-shaped support structure known as a "bobbin." The structure formed by combining the coil of wire and the bobbin is sometimes referred to as "a transmitter coil" throughout the disclosure. The bobbin is a support structure that not only provides structural integrity for the coil of wire, but also provides a structure to which the termination ends can attach for coupling with a respective pair of contact pins. The contact pins can electrically couple the coil of wire to a driver board for operating the coil of wire as a transmitter coil for wireless charging.

Figure 15A:
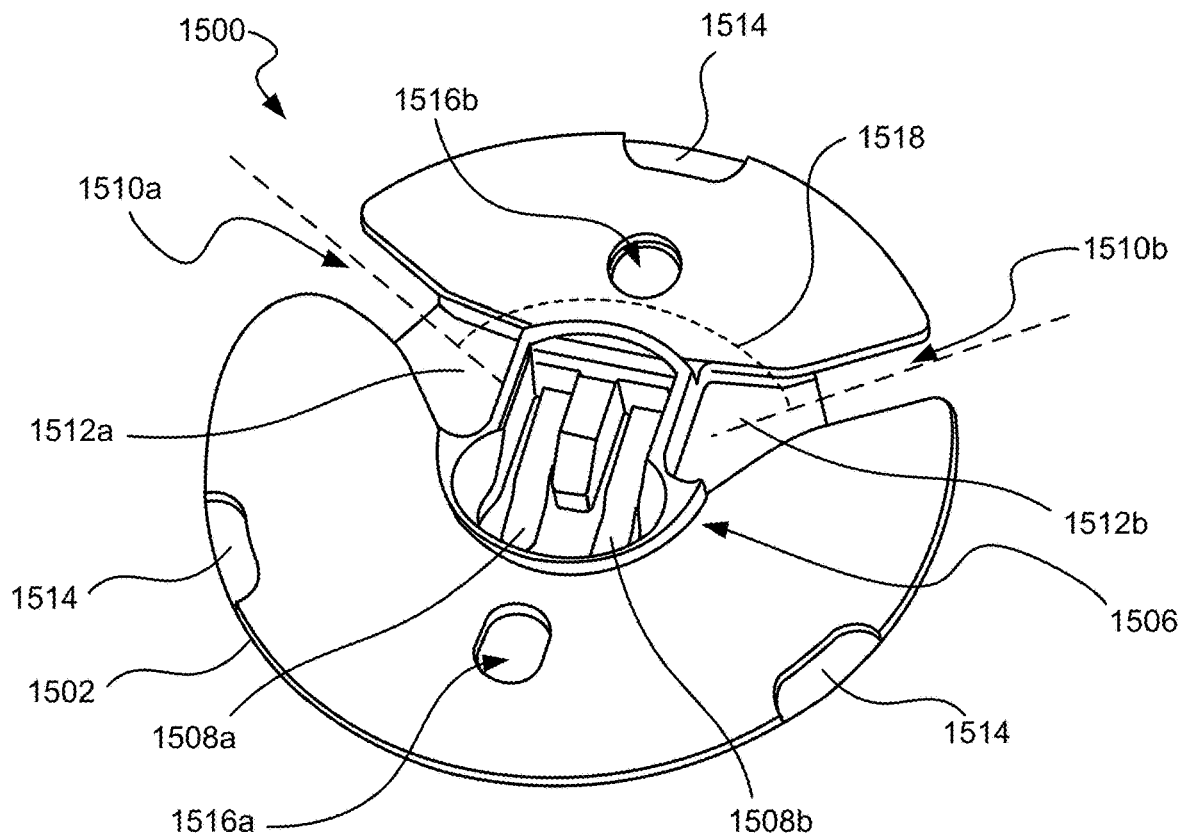
FIGS. 15A-15D are simplified diagrams illustrating top and side views of an exemplary bobbin, according to some embodiments of the present disclosure.
Figure 15B:
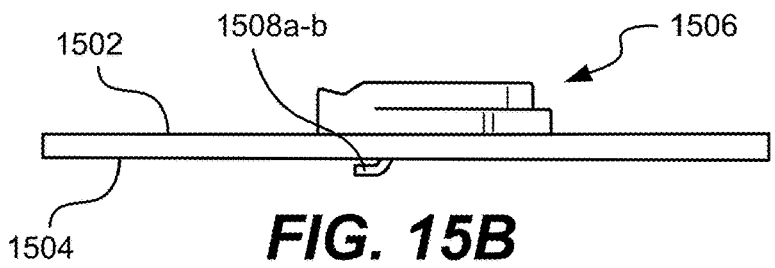
Figure 15C:
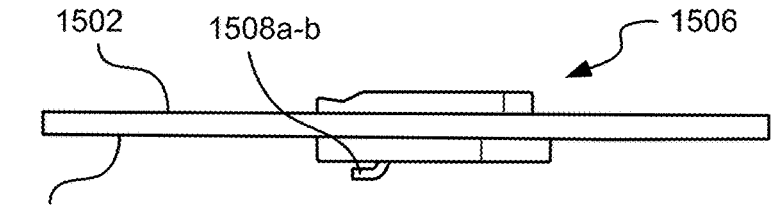
Figure 15D:
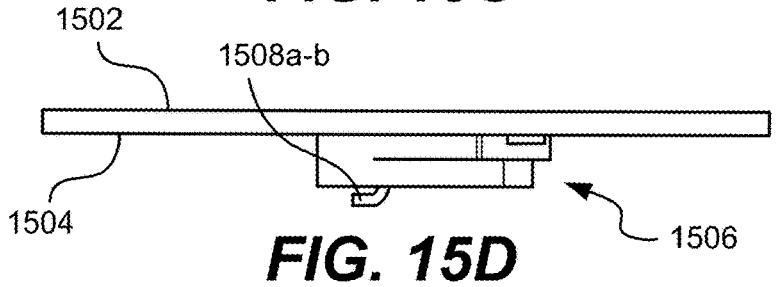

FIGS. 15A-15D illustrate an exemplary bobbin 1500 according to some embodiments of the present disclosure. Specifically, FIG. 15A illustrates a top perspective view of bobbin 1500, FIG. 15B illustrates a side-view of bobbin 1500, and FIGS. 15C and 15D illustrate side-views of exemplary bobbins 1520 and 1522, respectively. Bobbins 1520 and 1522 may have similar features as bobbin 1500, except that their contact housings and pins may be arranged differently, as discussed below.

Bobbin 1500 may be a generally flat and circular structure in the shape of a disc including substantially planar surfaces. For example, bobbin 1500 can have a substantially planar top surface 1502 and a substantially planar bottom surface 1504 as shown in FIG. 15B. With reference back to FIG.

15A, bobbin 1500 includes a contact housing 1506 positioned near the center of bobbin 1500. A pair of contact pins 1508*a-b* can reside within contact housing 1502 for coupling with a respective pair of termination ends of a coil of wire. Contact pins 1508*a-b* may be contacts in the form of cantilever beams (or any other suitable form of contacts) that are configured to make contact with pads on a control board, e.g., a driver board formed as a PCB, for operating a coil of wire (not shown) wound around angular bobbin 1500.

In some embodiments, contact housing 1506 can protrude past a planar surface of bobbin 1500. As an example, contact housing 1506 can protrude past planar top surface 1502 as shown in FIG. 15B. In another example, contact housing 1506 can protrude past both top and bottom surfaces 1502 and 1504, respectively, as shown in FIG. 15C, or can protrude past bottom surface 1504 as shown in FIG. 15D. Contact housing 1506 protrudes past a plane of bobbin 1500 to provide additional vertical space for termination ends of a coil of wire to couple with contact pins 1508*a-b*. For instance, contact housing 1506 may provide enough space for the termination ends to be soldered to bobbin 1500. The resulting soldered structure may occupy more vertical space than the thickness of bobbin 1500 defined by top and bottom surfaces 1502 and 1504.

Bobbin 1500 can also include a pair of contact pads 1512*a-b*. Contact pads 1512*a-b* can provide a surface upon which termination ends of a coil of wire can attach to electrically couple with contact pins 1508*a-b*. For instance, contact pads 1512*a-b* may be substantially flat surfaces that are electrically coupled to respective contact pins 1508*a-b*. Bobbin 1500 may further include a pair of channels 1510*a-b* to allow termination ends to couple with contact pads 1512*a-b*. In some embodiments, channels 1510*a-b* extend from outer rim 1516 toward contact housing 1506, i.e., toward the center of bobbin 1500. Channels 1510*a-b* can provide an avenue through which the termination ends traverse to make contact with contact pads 1512*a-b*. As shown in FIG. 15A, channels 1510*a-b* can be vacant regions in bobbin 1500 where termination ends can be positioned without substantially affecting the overall thickness of bobbin 1500.

Bobbin 1500 can further include one or more openings 1516*a* and 1516*b*. Each opening 1516*a* and 1516*b* can be a vacant space that extends through bobbin 1500 so that apparatuses can pass through from one side of bobbin 1500 to the other. In some embodiments, openings 1516*a* and 1516*b* are features that can be used to grab bobbin 1500 and to pick up and accurately place bobbin 1500 in specific locations, such as in a transmitter coil arrangement. Additionally, openings 1516*a* and 1516*b* provide avenues through which apparatuses may traverse to secure bobbin 1500 in a transmitter coil arrangement after being pick up and placed in its intended location.

In some embodiments, bobbin 1500 can include attachment pads 1514 for attaching the coil of wire to bobbin 1500. Any suitable adhesive, such as an epoxy adhesive, may secure bobbin 1500 to the coil of wire by fixing the coil of wire to attachment pads 1514. Although FIG. 15A shows three attachment pads 1514 disposed on only one side of bobbin 1500, embodiments are not limited to such configurations. Other embodiments can have more or less attachment pads and the attachment pads can be disposed on either or both sides of the bobbin.

C. Angle Transmitter Coil

As shown in FIG. 15A, channels 1510*a-b* of bobbin 1500 can be arranged at an angle 1518 with respect to one another. Angle 1518 can be a non-zero angle that is particularly suitable for allowing transmitter coils to be arranged in a stack with minimal z-height. For instance, angle 1518 may be between 110 to 130 degrees, such as 120 degrees in particular embodiments. Angle 1518 may correspond to angle 1412 between the termination ends of coil 1400 in FIG. 14. As such, a coil of wire wound about outer rim 1516 of bobbin 1500 may result in the formation of coil 1400. According to some embodiments, winding a coil of wire about bobbin 1500 results in the formation of an angle transmitter coil as shown in FIGS. 16A and 16B.

Figure 16A:
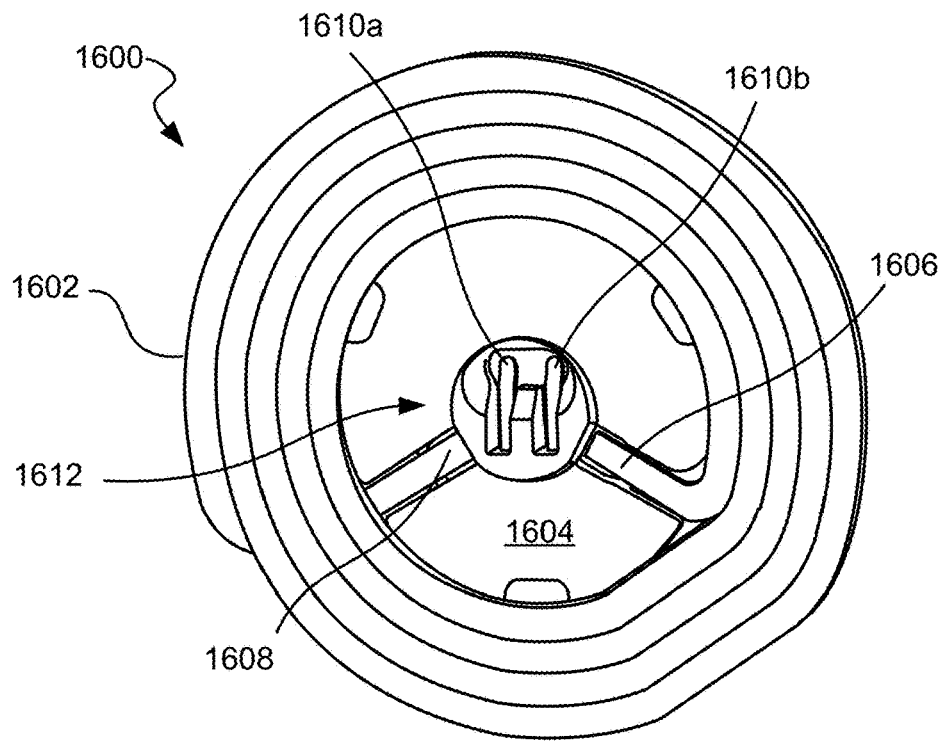
FIGS. 16A and 16B are simplified diagrams illustrating top and bottom perspective views of an exemplary angle transmitter coil, according to some embodiments of the present disclosure.
Figure 16B:
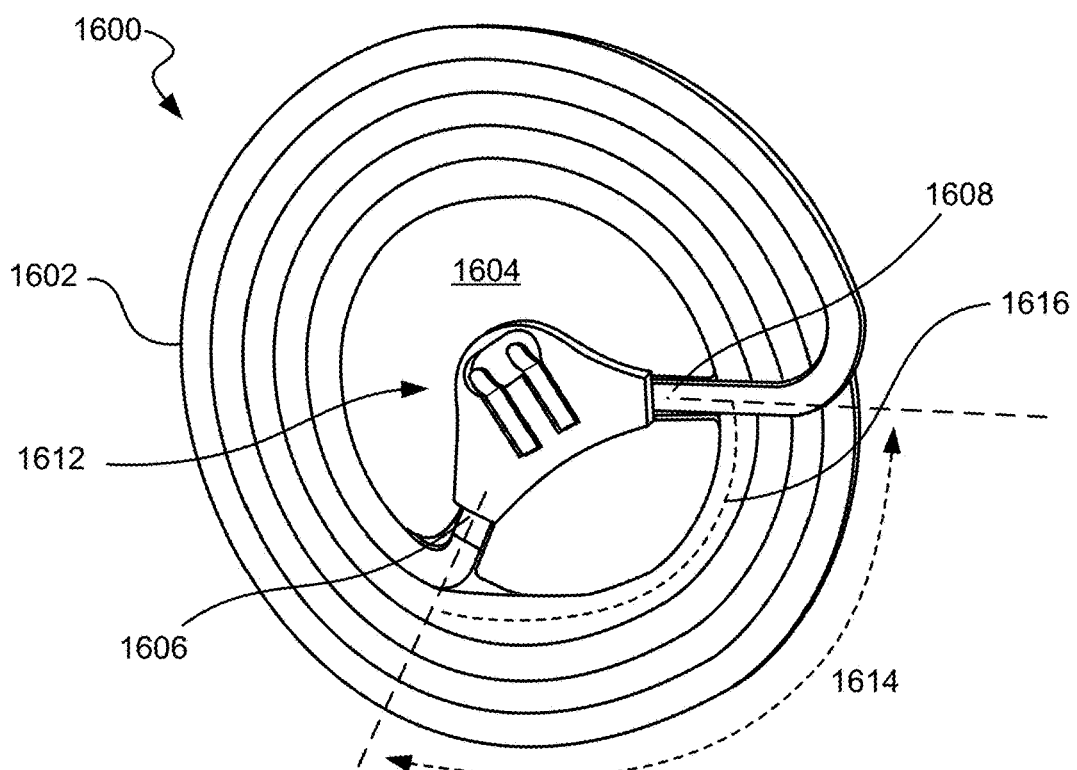

FIGS. 16A and 16B illustrate top and bottom perspective views, respectively, of an exemplary angle transmitter coil 1600 formed of a coil of wire 1602 wound about bobbin 1604, according to some embodiments of the present disclosure. As shown in FIG. 16A, termination ends 1606 and 1608 can be attached to respective contact pads on bobbin 1604 at an angle, e.g., angle 1518 in FIG. 15A. Once attached to the contact pads, termination ends 1606 and 1608 can be electrically coupled to respective contact pins 1610*a-b* in contact housing 1612. Thus, when contact pads 1610*a-b* are coupled to a driver board (not shown), the driver board can be electrically coupled to coil 1602 to control the operation of angle transmitter coil 1600. Additionally, once coil of wire 1602 is wound about bobbin 1604, angle transmitter coil 1600 is formed and constructed as a single structure that can be picked up and placed on a driver board during assembly of a wireless charging mat.

As can be seen from the bottom perspective view of angle transmitter coil 1600 in FIG. 16B, termination end 1608 can bend over coil 1602. Thus, in addition to contact housing 1612, termination end 1608 can also protrude from a plane of angle transmitter coil 1600. In some embodiments, termination end 1608 and contact housing 1612 protrude from the same plane of angle transmitter coil 1600. This protrusion may affect the way the transmitter coils are radially oriented when implemented in a transmitter coil arrangement, as will be further discussed with respect to FIGS. 17A and 17B.

Figure 17A:
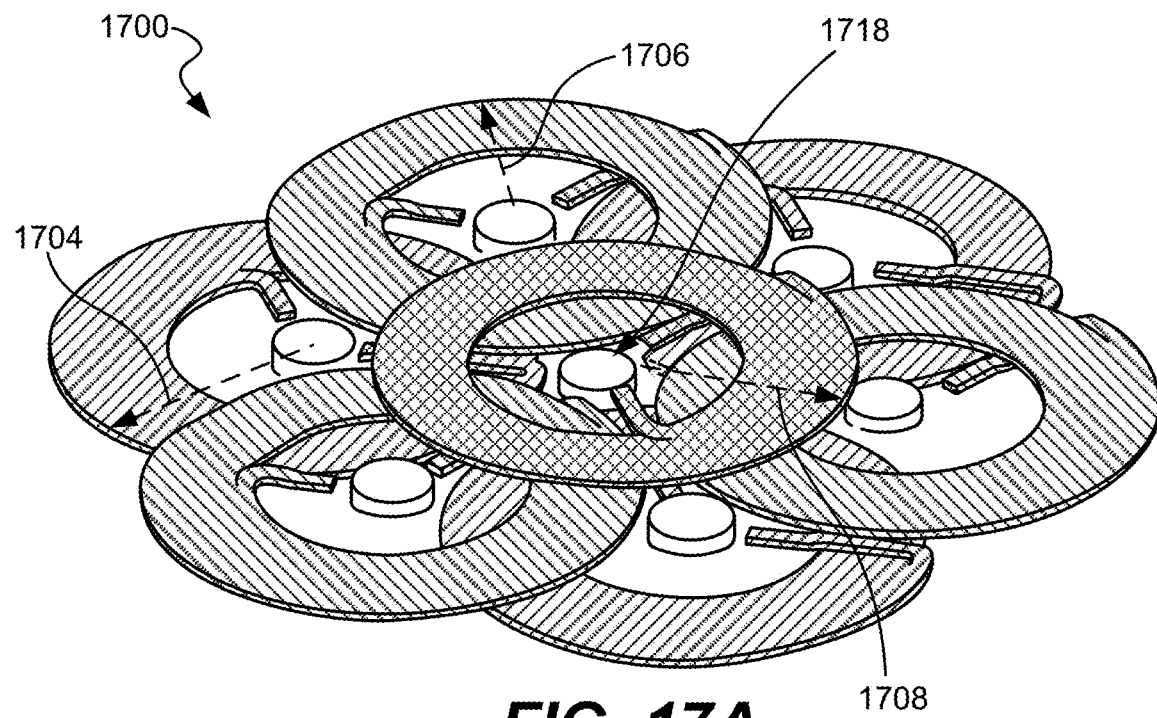
FIG. 17A is a simplified diagram illustrating an exemplary transmitter coil arrangement formed with angle transmitter coils, according to some embodiments of the present disclosure.

FIG. 17A illustrates an exemplary transmitter coil arrangement 1700 formed with angle transmitter coils, according to some embodiments of the present disclosure. Each angle transmitter coil can be arranged in a radial direction suitable for minimizing the z-height of transmitter coil arrangement 1700 while also enabling contact pins from each transmitter coil to make contact with a driver board (not shown). Specifically, transmitter coil arrangement 1700 may be organized based on the transmitter coil arrangement shown in FIGS. 8-9C. Similar to the discussion herein with respect to FIGS. 8-9C, transmitter coils in different transmitter coil layers can be arranged in different radial directions, e.g., radial directions 1704, 1706, and 1708 in the first, second, and third transmitter coil layers, to minimize the z-height of transmitter coil arrangement 1700. Similar to radial directions 808, 810, and 812 in FIG. 8B, radial directions 1704, 1706, and 1708 can be arranged in angular offsets of between 110 to 130 degrees, such as 120 degrees. The angular offset is selected so that the termination ends that protrude from a plane of the transmitter coil can be tucked between adjacent coils in another layer, thereby minimizing the z-height of transmitter coil arrangement 1700.

Figure 17B:
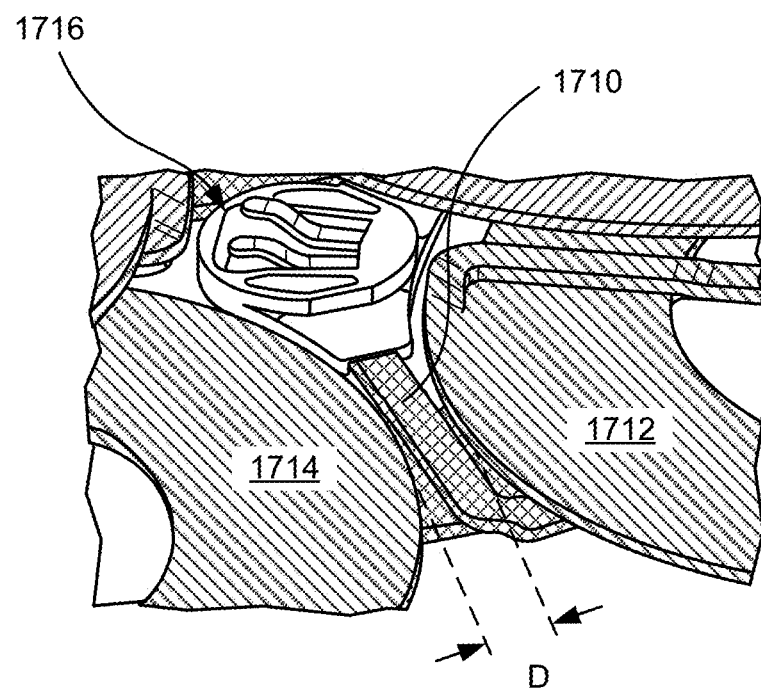
FIG. 17B is a simplified diagram illustrating a zoomed-in, bottom perspective view of a portion of an exemplary transmitter coil arrangement formed with angle transmitter coils, according to some embodiments of the present disclosure.

FIG. 17B illustrates a zoomed-in, bottom perspective view of a portion of transmitter coil arrangement 1700. As shown, termination end 1710 of an angle transmitter coil in a first transmitter coil layer can be tucked in the space between adjacent transmitter coils 1712 and 1714 in a second transmitter coil layer. The space between adjacent transmitter coils may correspond to distance D1 discussed herein with respect to FIGS. 5A and 5B. Distance D1 may be larger than the width of a termination end, i.e., the width of a wire of a transmitter coil. In some embodiments, distance D1 ranges between 1.5 to 2 mm.

Contact housings of transmitter coils are positioned in locations where contact pins can interface with the driver board without being blocked by another transmitter coil. For instance, the contact housings can be positioned within central termination zones 1718 of the transmitter coils. Central termination zones 1718 may correspond to central termination zones 418 discussed herein with respect to FIG. 4.

D. Parallel Transmitter Coil

Figure 18A:
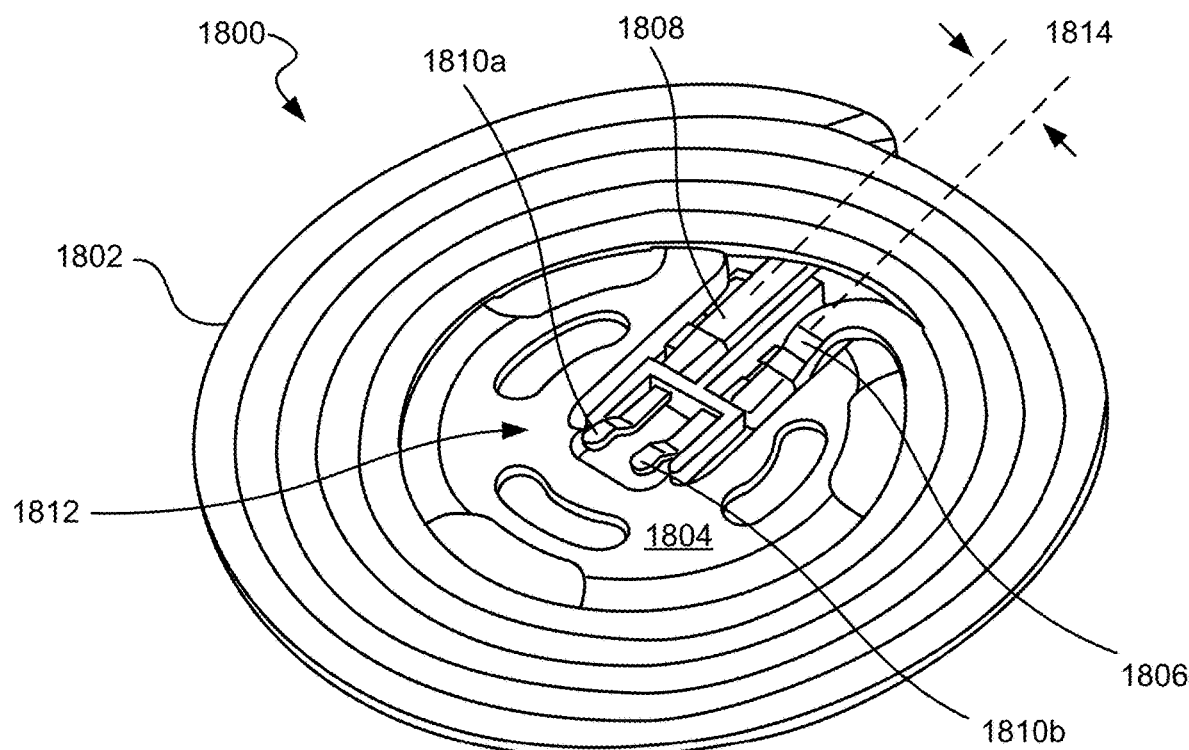
FIGS. 18A-18B are simplified diagrams illustrating top and bottom perspective views of an exemplary parallel transmitter coil, according to some embodiments of the present disclosure.
Figure 18B:
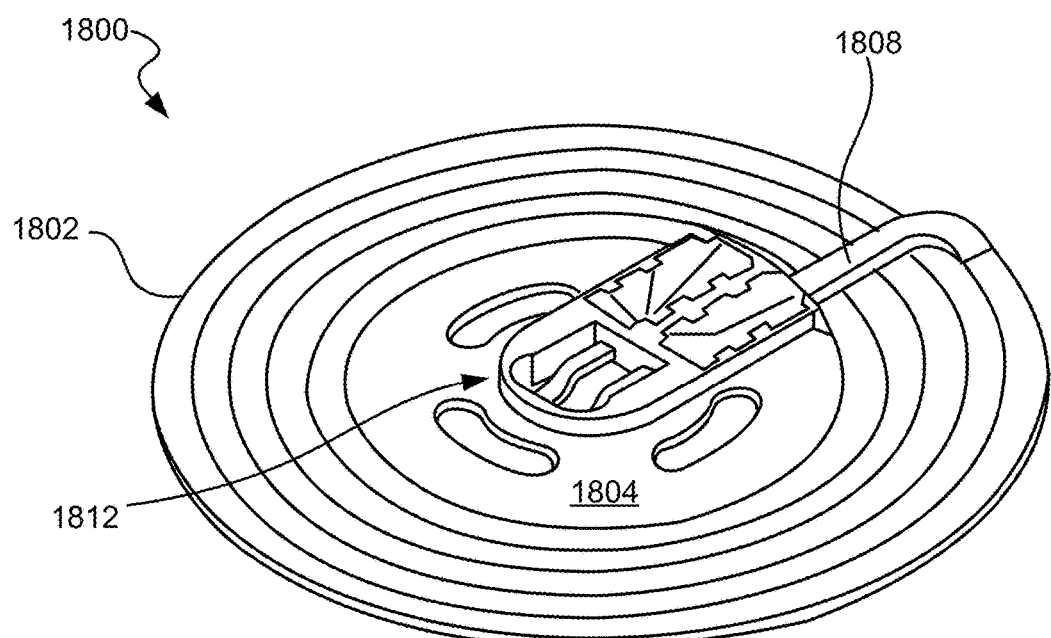

FIGS. 18A-18B illustrate an exemplary parallel transmitter coil 1800 according to some embodiments of the present disclosure. Specifically, FIG. 18A illustrates a top perspective view of parallel transmitter coil 1800, and FIG. 18B illustrates a bottom perspective view of parallel transmitter coil 1800.

As shown in FIG. 18A, parallel transmitter coil 1800 can include a coil of wire 1802 wound about a bobbin 1804. Termination ends 1806 and 1808 can be attached to respective contact pads on bobbin 1804 and arranged parallel to one another. When termination ends 1806 and 1808 are arranged in parallel, a portion 1814 of coiled wire 1802 defined by the region between termination ends 1806 and 1808 may be smaller than portion 1614 of coiled wire 1602. Thus, parallel transmitter coil 1800 may be more efficient than angle transmitter coil 1800. Once attached to the contact pads, termination ends 1806 and 1808 may be electrically coupled to respective contact pins 1810a-b in contact housing 1812. Thus, when contact pads 1810a-b are coupled to a driver board (not shown), the driver board may be electrically coupled to coil 1802 to control the operation of angle transmitter coil 1800.

As can be seen from the bottom perspective view of parallel transmitter coil 1800 in FIG. 18B, contact housing 1812 can protrude from a plane of parallel transmitter coil 1800. Termination end 1808 can bend over coil 1802 and also protrude from a plane of parallel transmitter coil 1800. In some embodiments, termination end 1808 and contact housing 1812 protrude from the same plane of angle transmitter coil 1800. This protrusion may affect the way the transmitter coils are radially oriented when implemented in a transmitter coil arrangement.

Figure 19:
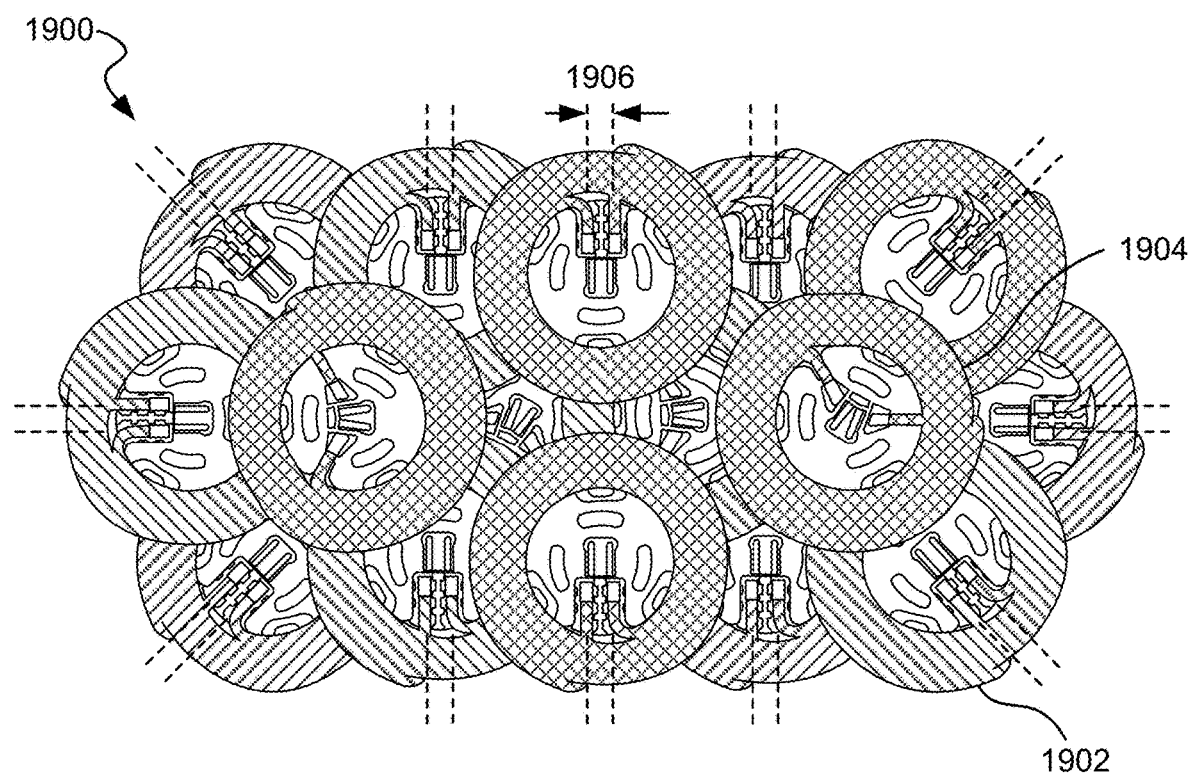
FIG. 19 is a simplified diagram illustrating an exemplary transmitter coil arrangement formed with parallel and angle transmitter coils, according to some embodiments of the present disclosure.

FIG. 19 illustrates an exemplary transmitter coil arrangement 1900 formed with parallel and angle transmitter coils, according to some embodiments of the present disclosure. Each transmitter coil can be arranged in a radial direction suitable for maximizing efficiency of an interior region of transmitter coil arrangement 1900 while also minimizing z-height and enabling contact pins from each transmitter coil to make contact with a driver board (not shown). Specifically, the transmitter coil stack can be arranged according to the transmitter coil arrangement shown in FIGS. 10-11C. Transmitter coil arrangement 1900 may similarly include outer transmitter coils 1902 and inner transmitter coils 1904. Outer transmitter coils 1902 may be a single line of transmitter coils positioned near the outermost regions of transmitter coil arrangement 1900, while inner transmitter coils 1904 may be those transmitter coils surrounded by outer transmitter coils 1902.

In some embodiments, outer transmitter coils 1902 may be parallel transmitter coils arranged in radial directions pointing toward the outer edges of transmitter coil arrangement 1900, e.g., the outer perimeter of the wireless charging mat within which transmitter coil arrangement 1900 is disposed. For instance, portions 1906 of outer transmitter coils 1902 that have less turns of wire, e.g., the less efficient portions of the coil of wire such as portion 1814 in FIG. 18A, can be oriented toward the outer edges of transmitter coil arrangement 1900. Accordingly, the rest of the portions of outer transmitter coils 1904 having more turns and better efficiency may be concentrated toward the interior of transmitter coil arrangement 1900. This helps ensure that the wireless charging mat has a more consistent and efficient charging surface in the inner regions of the charging surface.

While outer transmitter coils 1902 may be formed of parallel transmitter coils, inner transmitter coils 1904 may be formed of angle transmitter coils because of the spatial constraints caused by the arrangement of outer transmitter coils 1902. To fit inner transmitter coils 1904 within transmitter coil arrangement 1900 while minimizing z-height, inner transmitter coils 1904 may be arranged in various radial directions according to the principles discussed herein with respect to FIG. 17A. That is, inner transmitter coils 1904 may be arranged in different radial directions according to an angular offset of between 110 to 130 degrees, such as 120 degrees, so that the termination ends that protrude from a plane of the angular transmitter coil can be tucked between adjacent coils in another layer, thereby minimizing the z-height of transmitter coil stack 1900.

IV. Multi-Layer Arrangement of Transmitter Coils

Figure 20:
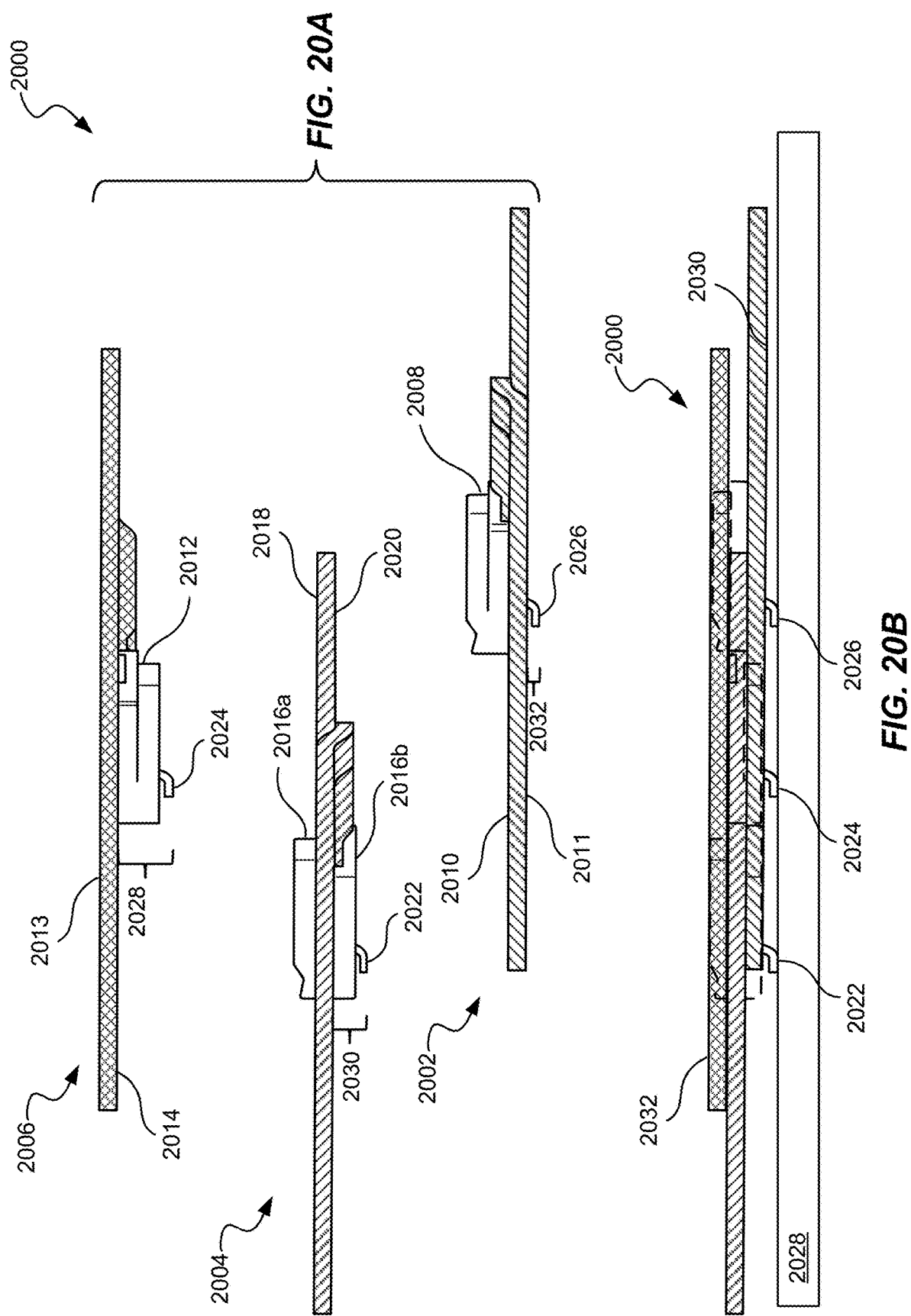
FIG. 20A is a simplified diagram illustrating an exploded side-view perspective of a transmitter coil arrangement, according to some embodiments of the present disclosure.
FIG. 20B is a simplified diagram illustrating side-view perspective of an assembled transmitter coil arrangement, according to some embodiments of the present disclosure.

To minimize the z-height of a transmitter coil arrangement, protrusions of transmitter coils caused by contact housings and the folding-over of termination ends of coils of wire may nest within the transmitter coil arrangement such that they do not protrude above or below the transmitter coil arrangement as a whole. To better understand this concept, FIGS. 20A and 20B illustrate side-views of an exemplary transmitter coil arrangement 2000 showing how the protrusion are positioned when assembled. The nesting of transmitter coil arrangement 2000 may be similar to, and a suitable representation of, how other transmitter coil arrangements are nested, such as transmitter coil arrangements 800, 1000, 1700, and 1900 illustrated in FIGS. 8, 10, 17A, and 19.

FIG. 20A illustrates an exploded view of transmitter coil arrangement 2000 to show how the protrusions are positioned. Transmitter coil arrangement 2000 can include a first transmitter coil 2002 in a first transmitter coil layer, a second transmitter coil 2004 in a second transmitter coil layer, and a third transmitter coil 2006 in a third transmitter coil layer. Each transmitter coil may be representative of other transmitter coils in the same layer. In some embodiments, first transmitter coil 2002 is positioned apart from third transmitter coil 2006 while second transmitter coil 2004 is positioned between first and third transmitter coils 2002 and 2006, respectively.

First transmitter coil 2002 can have a protrusion 2008 extending past a planar surface 2010 of first transmitter coil 2002. Surface 2010 can include corresponding planar surfaces of both the coil of wound wire and portions of the bobbin around which the coil of wire is wound. Accordingly, in some embodiments, the planar surfaces of the coil of wound wire and portions of the bobbin on corresponding sides of first transmitter coil 2002 may be substantially coplanar. Because other portions of the bobbin may not substantially protrude above surface 2010, the other portions are not shown as they are hidden behind the coil of wire as perceived from the side-view perspective of FIG. 20A. In some embodiments, protrusion 2008 can include the contact housing as well as the folded-over termination end of the coil of wire. Contact pins 2026 of first transmitter coil 2002 can be positioned to extend past a planar surface 2011 along a direction opposite of the protrusion. Contact pins 2026 protrude past planar surface 2011 to make contact with an underlying driver board, as will be discussed further herein.

Similar to first transmitter coil 2002, third transmitter coil 2006 can have a protrusion 2012 extending past a planar surface 2014 of third transmitter coil 2002. Protrusion 2012 can include a contact housing of a bobbin and a folded-over termination end of a coil of wire wound around the bobbin of third transmitter coil 2006. Contact pins 2024 of third transmitter coil 2006 can be positioned to extend past an end of protrusion 2012 (e.g., past the contact housing of the bobbin) along a direction with the protrusion. Contact pins 2024 extends past an end of protrusion 2012 to make contact with the underlying driver board.

As further shown in FIG. 20A, second transmitter coil 2004 can have a protrusion that includes two portions: a first portion 2016a and a second portion 2016b. First and second portions 2016a and 2016b can include a contact housing of a bobbin and a folded-over termination end of a coil of wire wound around the bobbin of second transmitter coil 2004. First portion 2016a can extend past a surface 2018 of second transmitter coil 2004, and second portion 2016b can extend past a surface 2020 opposite of surface 2018. Contact pins 2022 of second transmitter coil 2004 can be positioned to extend past an end of second portion 2016b along a direction with second portion 2016b to make contact with the underlying driver board.

According to some embodiments of the present disclosure, protrusions 2008 and 2012 of first and third transmitter coils 2002 and 2006, respectively, can be positioned toward second transmitter coil 2004 so that when the transmitter coils are assembled into transmitter coil arrangement 2000, the protrusions do not protrude above or below transmitter coil arrangement 2000 as a whole. Additionally, the position of the contact pads of the transmitter coils are arranged such that when the transmitter coils are assembled into transmitter coil arrangement 2000, the contact pins can extend past a bottom surface of transmitter coil arrangement 2000 to make contact with an underlying driver board. The distance at which contact pins are positioned away from respective surfaces of the transmitter coils is configured such that they can make contact with the driver board even after being assembled as transmitter coil arrangement 2000, as shown in FIG. 20B.

FIG. 20B illustrates assembled transmitter coil arrangement 2000 attached to an underlying driver board 2028. When assembled, the protrusions from the transmitter coils can be nested within transmitter coil arrangement 2000 as shown by the dotted lines representing protrusions 2008, 2012, and 2016a-b. In some embodiments, no protrusions in transmitter coil arrangement 2000 extend above a top plane 2032 (i.e., surface 2013 of third transmitter coil 2006) or extend below a bottom plane 2030 (i.e., surface 2011 of first transmitter coil 2002) of transmitter coil arrangement 2000. Accordingly, protrusion 2008 can extend a distance from surface 2010 that is less than the combined thickness of the coil of windings of second and third transmitter coils 2004 and 2006; likewise, protrusion 2012 can extend a distance from surface 2014 that is less than the combined thickness of the coil of windings of first and second transmitter coils 2002 and 2004. Because second transmitter coil 2004 is positioned between first and third transmitter coils 2002 and 2006, portion 2016a can extend a distance from surface 2018 that is less than the thickness of the coil of windings of third transmitter coil 2006, and portion 2016b can extend a distance from surface 2020 that is less than the thickness of the coil of windings of first transmitter coil 2002.

In some embodiments, contact pins may be arranged to make contact with driver board 2028 when transmitter coil arrangement 2000 is assembled. Thus, those transmitter coils that are positioned farthest away from driver board 2028 in the transmitter coil arrangement can have their contact pins positioned farthest away from its coil of wire. For instance, as shown in FIG. 20B, third transmitter coil 2006 can be positioned farthest away from driver board 2028. Thus, contact pins 2024 can be positioned farthest away from the coil of wire of third transmitter coil 2006 so that they can make contact with driver board 2028 when transmitter coil arrangement 2000 is assembled. In some embodiments, as shown in FIG. 20A, contact pins 2024 are positioned a distance 2028 from surface 2014 of third transmitter coil 2006, contact pins 2022 are positioned a distance 2030 from surface 2020 of second transmitter coil 2004, and contact pins 2026 are positioned a distance 2032 from surface 2011 of first transmitter coil 2002. Accordingly, distance 2028 may be greater than distance 2030 and 2032, distance 2030 may be less than distance 2028 but greater than distance 2032, and distance 2032 may be less than distances 2028 and 2030. By arranging the contact pins of respective transmitter coils according to these distances, the contact pins can be positioned to make contact with underlying driver board 2028, as shown in FIG. 20B, even though the coils with which they are coupled are positioned at different distances away from driver board 2028.

It is to be appreciated that contact pins 2022, 2024, and 2026 extend toward driver board 2028 regardless of which direction protrusions 2016a-b, 2012, and 2008 extend. As an example, contact pins 2026 of first transmitter coil 2002 extend downward toward driver board 2028 even though its protrusion 2008 extends upward. Contact pins 2022, 2024, and 2026 extend toward driver board 2028 to make contact with driver board 2028 so that control board 2028 can operate the transmitter coils to perform wireless charging.

V. Transmitter Coils without Bobbins

Aforementioned embodiments discussed herein are directed to transmitter coil arrangements formed of transmitter coils with bobbins. However, it is to be appreciated that transmitter coil arrangements according to embodiments of the present disclosure are not required to be formed of transmitter coils with bobbins. In some embodiments, the transmitter coil arrangements may be formed of transmitter coils without bobbins and yet still achieve the same coverage, performance, and efficiency of transmitter coil arrangements formed of transmitter coils with bobbins.

Figure 21:
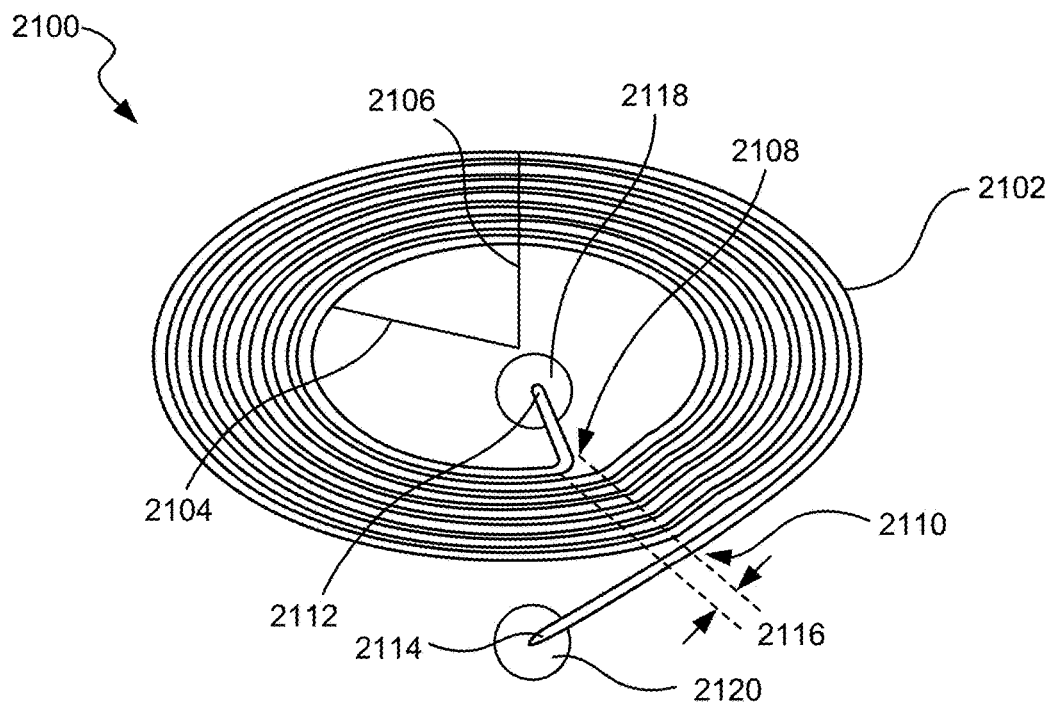
FIG. 21 is a simplified diagram illustrating an exemplary transmitter coil without a bobbin, according to some embodiments of the present disclosure.

FIG. 21 illustrates an exemplary transmitter coil 2100 without a bobbin, according to some embodiments of the present disclosure. Transmitter coil 2100 can include a coil of wire 2102 wound between an inner radius 2104 and an outer radius 2106. Coil of wire 2102 can be formed of a plurality of thin wires, similar to coil of wire 1200 in FIG. 12A, or formed of a single core of conductive material, similar to coil of wire 1300 in FIG. 13A.

In some embodiments, coil of wire 2102 may wind from an initial location 2108 to a termination location 2110. Initial location 2108 may be a position along coil of wire 2102 where the wire initiates winding, and termination location 2110 may be a position along coil of wire 2102 where the wire terminates winding. The windings of wire may not substantially diverge from one another between initial location 2108 and termination location 2110. In some embodiments, termination location 2108 can be positioned based on initial location 2108 to achieve a substantially even winding profile. For instance, termination location 2108 can be positioned directly across coil of winding 2102 from initial location 2108. By positioning initial location 2108 and termination location 2110 this way, the number of windings may be as close to a whole integer as possible, thereby achieving a substantially even winding profile. The substantially even winding profile can minimize the size of a portion 2116 that has a different number of turns than the rest of transmitter coil 2100, as discussed herein with respect to FIGS. 14A and 14C. Furthermore, the number of turns may be determined according to a target inductance value determined by design. As more turns are formed in a transmitter coil, the inductance of the transmitter coil increases. Having too much inductance in a transmitter coil may create inefficient power delivery. In particular embodiments, the number of turns may range between six to eight turns, such as seven turns in some embodiments.

Transmitter coil 2100 can also include a first termination end 2112 and a second termination end 2114. Each termination end 2122 and 2214 can be a point at which coil of wire 2102 physically ends. Unlike transmitter coils with bobbins, second termination end 2114 may not fold over coil of wire 2102 to be positioned within the inner diameter of transmitter coil 2100. Instead, second termination end 2114 may begin to diverge away from coil of wire 2102 at termination location 2110 and stop outside of coil of wire 2102. First and second termination ends 2112 and 2114 can couple with first and second termination zones 2118 and 2120 to make contact with an underlying driver board. First termination zone 2118 may be positioned within the inner diameter of transmitter coil 2100, but second termination zone 2120 may be positioned outside of the inner diameter of transmitter coil 2100. In some embodiments, second termination zone 2120 may be positioned within another transmitter coil when transmitter coil 2100 is assembled in a transmitter coil arrangement, as discussed herein with respect to FIG. 22.

Figure 22A:
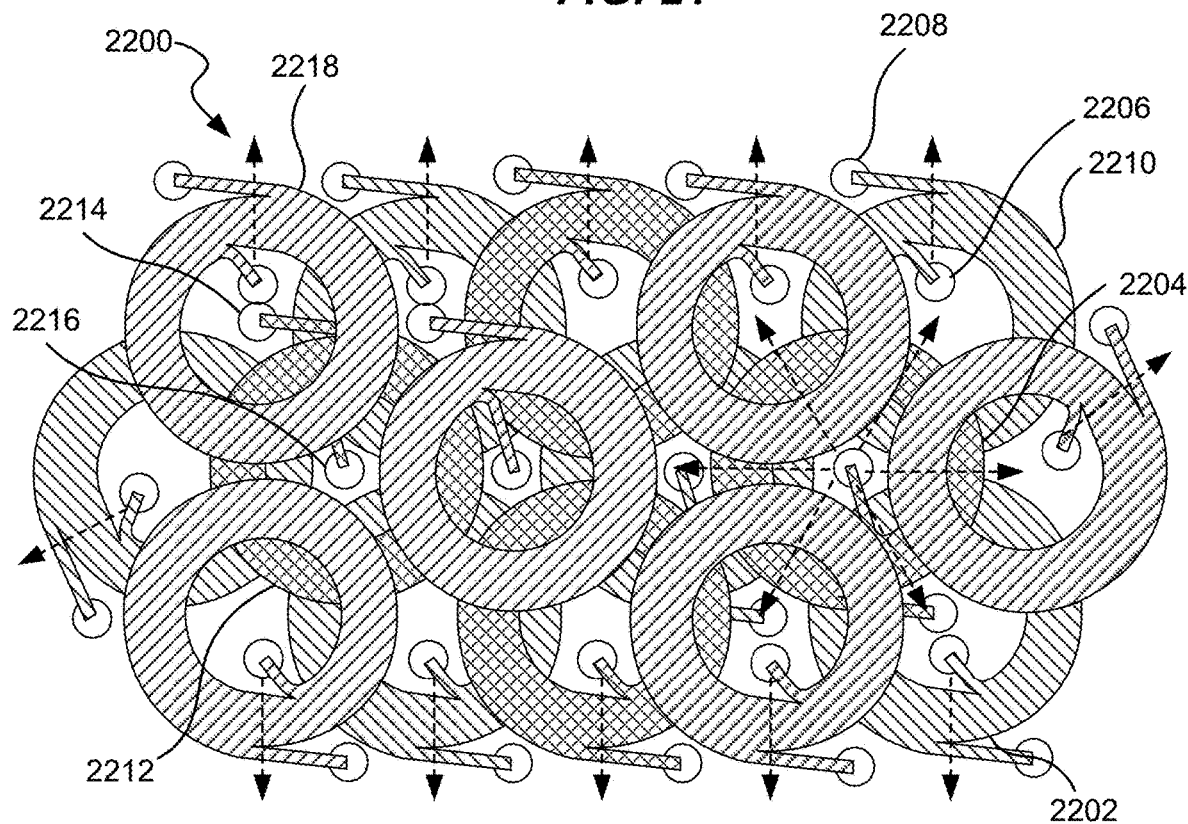
FIG. 22A is a simplified diagram illustrating an exemplary transmitter coil arrangement formed of transmitter coils without bobbins, according to some embodiments of the present disclosure.

FIG. 22A illustrates an exemplary transmitter coil arrangement 2200 formed of transmitter coils without bobbins, according to some embodiments of the present disclosure. Positions of the transmitter coils in transmitter coil arrangement 2200 can be controlled by carriers that define the positions of the transmitter coils according to the respective positions shown in FIG. 22A during assembly. Each carrier can include an array of bosses that define the location of the transmitter coils. The bosses can protrude from the carrier surface and provide a structure around which the transmitter coils may be positioned. In some embodiments, each carrier temporarily holds the transmitter coils in place until they are secured to contacts on a driver board. Each carrier may be specific to a different layer of the transmitter coil arrangement. Once the transmitter coils are secured to the driver board, the carrier may be removed, thereby leaving the transmitter coils in their respective positions according to the transmitter coil arrangement. Each layer is assembled, one-by-one, until all the layers are assembled to form the transmitter coil arrangement shown in FIG. 22. As will be discussed further herein, each layer of transmitter coils in transmitter coil arrangement 2200 can be fixed in position by a cowling.

Each transmitter coil can be arranged in a radial direction suitable for minimizing coupling within an interior region of transmitter coil arrangement 2200, while also enabling termination ends of each transmitter coil to make contact with a driver board (not shown). Similar to transmitter coil arrangement 1900 in FIG. 19, transmitter coil arrangement 2200 can be arranged in three transmitter coil layers according to the transmitter coil arrangement shown in FIGS. 10-11C. Thus, transmitter coil arrangement 2200 can include outer transmitter coils 2202 and inner transmitter coils 2204. Outer transmitter coils 2202 may be a single line of transmitter coils positioned near the outermost regions of transmitter coil arrangement 2200, while inner transmitter coils 2204 may be those transmitter coils surrounded by outer transmitter coils 2202.

In some embodiments, outer transmitter coils 2202 may be arranged in a first radial arrangement where its radial directions point toward the outer edges of transmitter coil arrangement 2200 so that their regions that have a different number of turns, e.g., region 2116 in FIG. 21, are oriented toward the outer edges of transmitter coil arrangement 2200. Thus, the portions of outer transmitter coils 2204 having more turns and lower coupling tendencies may be concentrated toward the interior of transmitter coil arrangement 2200. This helps ensure that the wireless charging mat has a more consistent and efficient charging surface in the inner regions of the charging surface. Additionally, inner transmitter coils 2204 may be arranged in a second radial arrangement different than the first radial arrangement. The second radial arrangement can be where inner transmitter coils 2204 are arranged according to different angular offsets with respect to one another as shown in FIG. 22. For instance, inner transmitter coils 2204 can be arranged in angular offsets between 50-70 degrees, particularly 60 degrees in some embodiments. Arranging inner transmitter coils 2204 according to the second radial arrangement allows their termination ends to reach an underlying interconnection structure by terminating in the inner diameters of adjacent transmitter coils.

Given that transmitter coils without bobbins do not have a folding-over portion nor a bobbin that protrudes from a plane of a winding of coil, inner transmitter coils 2204 do not need to be arranged in a radial direction that nests the protrusions in adjacent layers to minimize z-height. Instead, inner transmitter coils 2204 may only need to be arranged so that their second termination ends can make contact with an underlying driver board (not shown). The second termination ends of the transmitter coils can make contact with the underlying driver board when the second termination zones are positioned so that they are not blocked by another transmitter coil. Accordingly, the second termination zones for the inner transmitter coils 2204 can be positioned within an inner diameter of an adjacent transmitter coil. As shown in FIG. 22, inner transmitter coils 2204 can be arranged in various radial directions offset from one another at an angular offset of between 50 and 70 degrees, such as approximately 60 degrees in some embodiments. Arranging inner transmitter coils 2204 in this way allows their second termination zones to be positioned within the inner diameter of neighboring transmitter coils so that their second termination ends can make contact with the underlying driver board.

As can be seen in FIG. 22A, each transmitter coil can have an outer termination zone 2208 and an inner termination zone 2206 where respective termination ends reside. As mentioned herein, each termination zone may be a region where a termination end is positioned. The termination end can be a point at which a winding of the respective transmitter coil physically ends, but whose electrical connection can continue if it is coupled with a standoff for connecting with an underlying driver board. Outer termination zone 2208 can be a termination zone that is positioned outside of an outer diameter of its respective transmitter coil, e.g., transmitter coil 2210. Inner termination zone 2208 can be a termination zone that is positioned inside an inner diameter of its respective transmitter coil. Thus, outer transmitter coils can have an outer termination zone that is positioned near an outer perimeter of the transmitter coil arrangement, and inner transmitter coils can have outer termination zones that are positioned within an inner diameter of an adjacent transmitter coil. For instance, transmitter coil 2212 can be positioned as an inner transmitter coil and have an outer termination zone 2214 that is positioned in an inner diameter of adjacent transmitter coil 2218.

Given that each transmitter coil has two termination zones, it can be appreciated that a transmitter coil arrangement can have numerous termination zones for coupling with an underlying driver board. In many cases, the positions of these termination zones can affect the efficiency at which the transmitter coil arrangement operates. Thus, in some embodiments, termination zones of a transmitter coil arrangement can be arranged to have a degree of similarity to improve simplicity in design and improvement in operating efficiency, as discussed herein with respect to FIGS. 22B-22E.

Figure 22B:
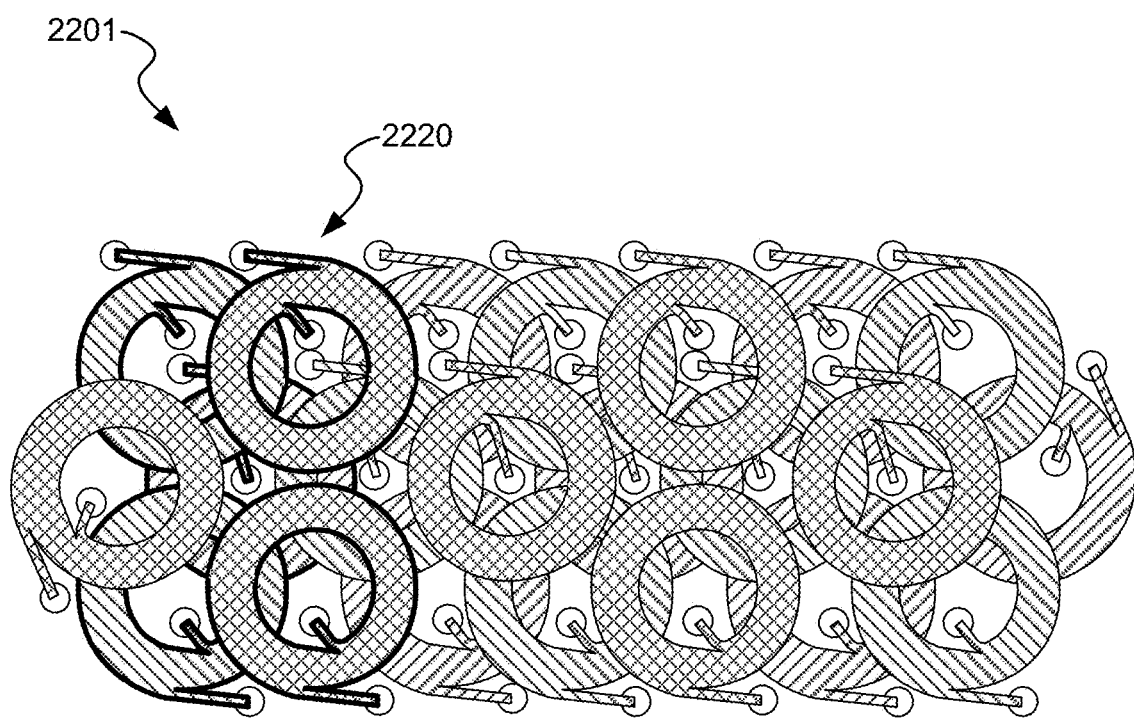
FIG. 22B is a simplified diagram illustrating an exemplary transmitter coil arrangement formed of transmitter coils without bobbins and with similarly organized termination ends, according to some embodiments of the present disclosure.

FIG. 22B is a simplified diagram illustrating an exemplary transmitter coil arrangement 2201 formed of transmitter coils without bobbins and with similarly organized termination ends, according to some embodiments of the present disclosure. Transmitter coil arrangement 2201 is formed of 22 transmitter coils arranged in an overlapping arrangement such that different coils in the plurality of coils are on different planes and each transmitter coil of the transmitter coil arrangement has a central axis that is positioned a lateral distance away from central axes of all other transmitter coils, as discussed herein with respect to FIGS. 3-7C. According to some embodiments of the present disclosure, the organization of termination zones can be derived according to a base pattern of termination zones that is repeated substantially throughout the transmitter coil arrangement. As an example, transmitter coil arrangement 2201 can have termination zones that are substantially positioned according to a base pattern 2220. In some embodiments, base pattern 2220 is established by the termination zones of five transmitter coils shown with bolded lines in FIG. 22B. The termination zones of base pattern 2220 can be repeated throughout a majority of transmitter coil arrangement 2201 except for the termination zones of the farthest left and right transmitter coils. The termination zones of those farthest left and right transmitter coils can be positioned such that one termination zone is outside of the coil and the other termination zone is inside of the coil.

Figure 22C:
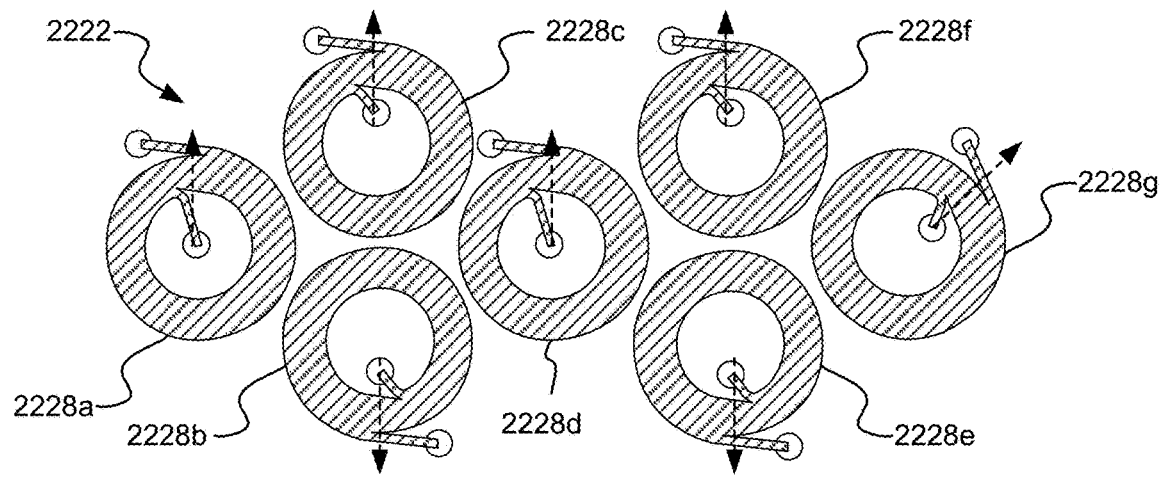
FIGS. 22C-22E are simplified diagrams illustrating individual layers of an exemplary transmitter coil arrangement shown in FIGS. 22B and 22C, according to some embodiments of the present disclosure.
Figure 22D:
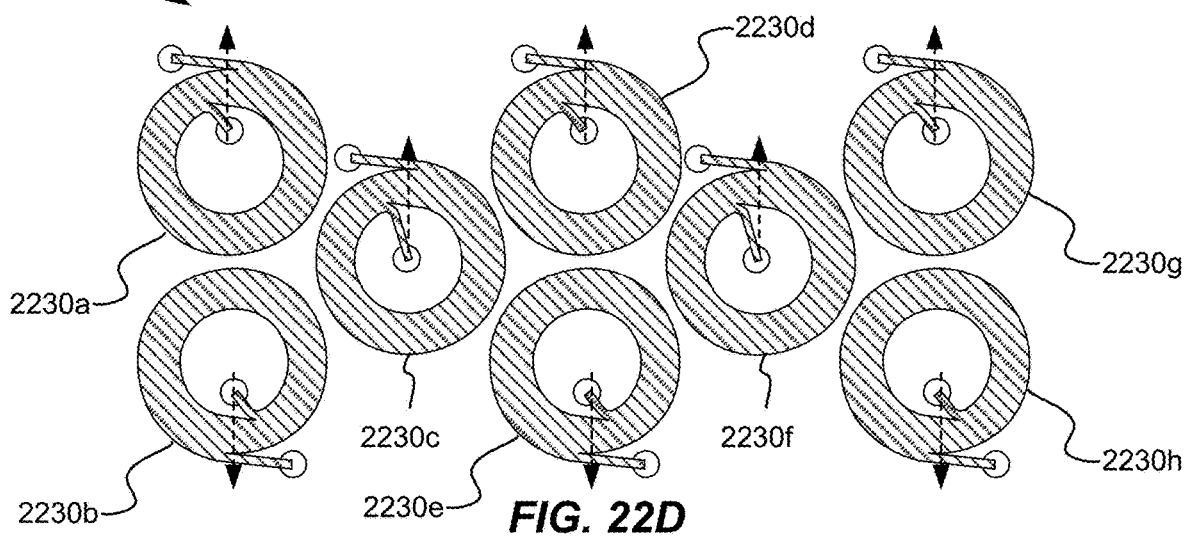
Figure 22E:
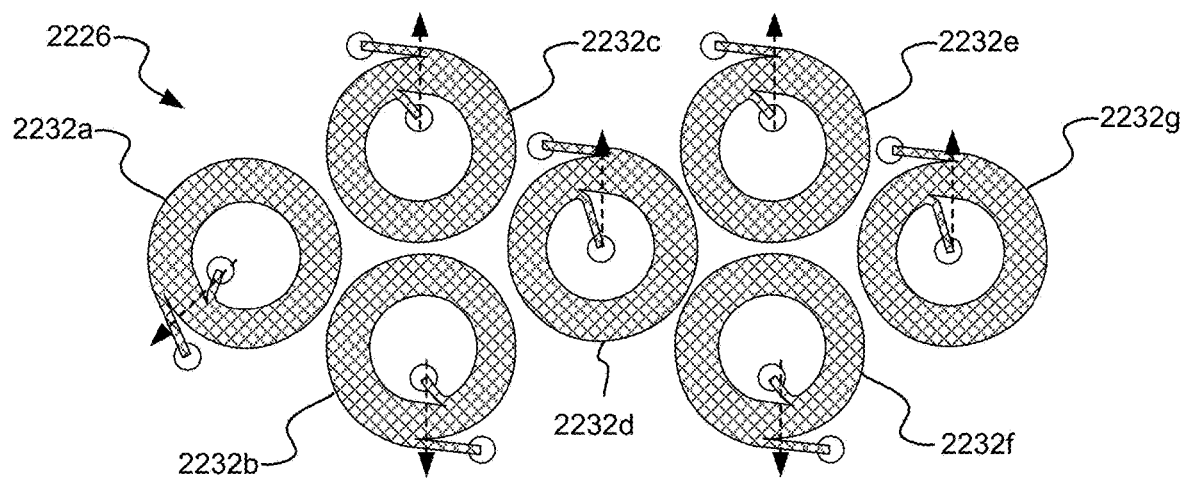

A more detailed view of the transmitter coils in transmitter coil arrangement 2201 can be seen in FIGS. 22C-E. FIGS. 22C-E are simplified diagrams of sets of transmitter coils in each layer of transmitter coil arrangement 2201. FIG. 22C illustrates the angular orientations of a first set of transmitter coils 2222. As shown in FIG. 22C, transmitter coils 2228*b*, 2228*c*, 2228*e* and 2228*f* that are positioned amongst the outer transmitter coils can have angular orientations that are either vertically upward or downward, except for the farthest right transmitter coil 2228*g* when arranged in transmitter coil arrangement 2201. Transmitter coils 2228*a* and 2228*d* that are positioned amongst the inner transmitter coils can have angular orientations that are vertically upward. As shown in FIG. 22D, transmitter coils 2230*a*, 2230*b*, 2230*d*, 2230*e*, 2230*g*, and 2230*h* that are positioned amongst the outer transmitter coils can have angular orientations that are either vertically upward or downward. Transmitter coils 2230*c* and 2230*f* that are positioned amongst the inner transmitter coils can have angular orientations that are vertically upward. And, as shown in FIG. 22E, transmitter coils 2232*c*, 2232*b*, 2232*e*, and 2232*f* that are positioned amongst the outer transmitter coils can have angular orientations that are either vertically upward or downward, except for the farthest right transmitter coil 2232*a* when arranged in transmitter coil arrangement 2201. Transmitter coils 2232*d* and 2232*g* that are positioned amongst the inner transmitter coils can have angular orientations that are vertically upward.

As can be appreciated by FIGS. 22C-E, the outer transmitter coils of a transmitter coil arrangement can be arranged in an angular direction that are either facing vertically upward or downward, except for the farthest left and right transmitter coils. And, the inner transmitter coils of a transmitter coil arrangement can be arranged in an angular direction that is facing in the same direction, e.g., vertically upward. In this manner, the position of termination zones for the transmitter coils in transmitter coil arrangement 2201 can be substantially similar to each other, thereby simplifying design and enhancing charging efficiency.

Unlike transmitter coils with bobbins that have contact pins that extend below a plane of the coil of wire to make contact with the underlying driver board, transmitter coils without bobbins can make contact with the underlying driver board by making contact with surface-mounted standoffs having contact pads that are elevated from the underlying driver board once installed on a driver board. Thus, the contact pads can be positioned in the same plane as the respective transmitter coils to which they are coupled. Details of such standoffs will be discussed further herein.

VI. Wireless Charging Mat Assembly

Figure 23:
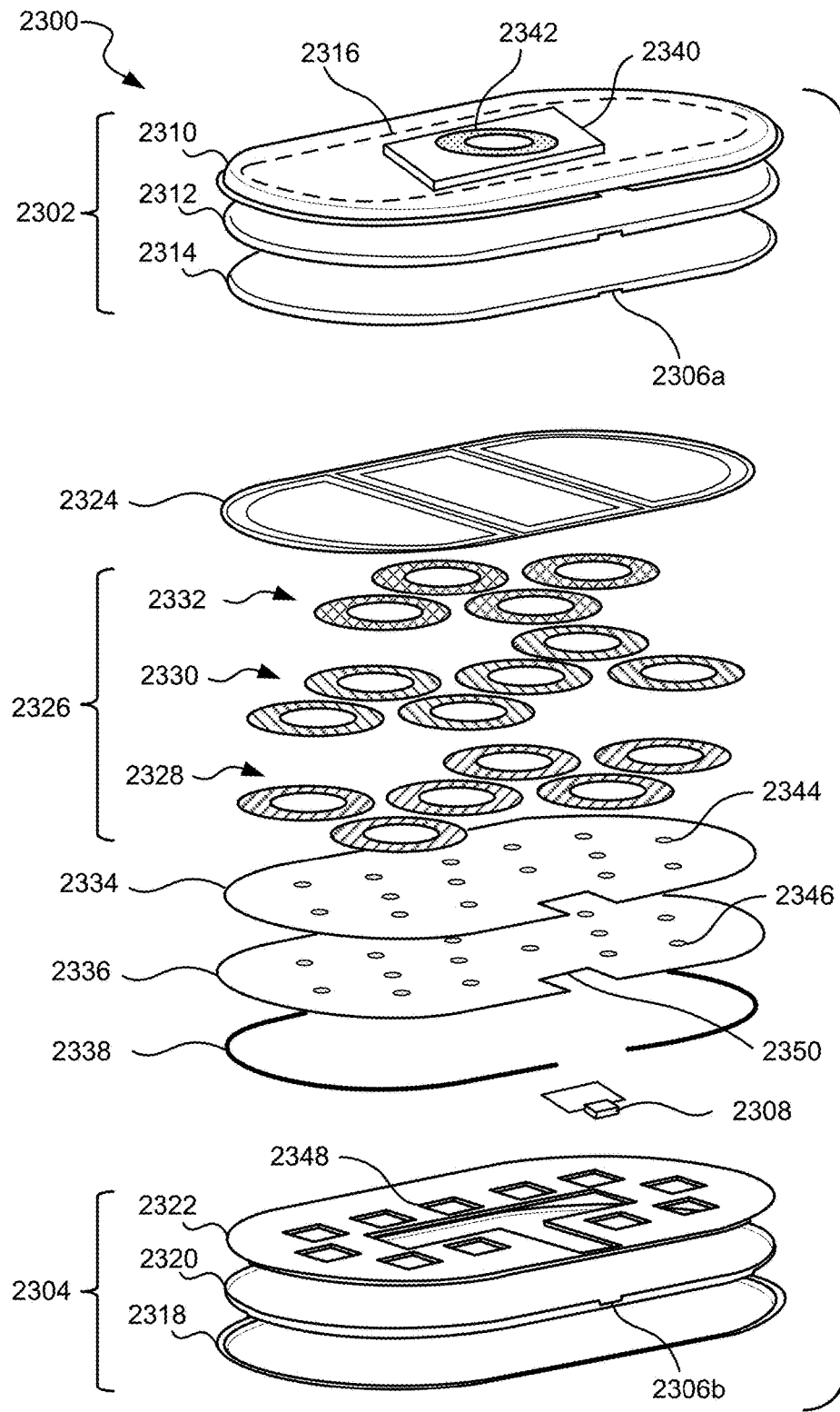
FIG. 23 is a simplified diagram illustrating an exploded view of an exemplary wireless charging mat having transmitter coils with bobbins, according to some embodiments of the present disclosure.

FIG. 23 illustrates an exploded view of an exemplary wireless charging mat 2300 having transmitter coils with bobbins, according to some embodiments of the present disclosure. Transmitter coils with bobbins can correspond to transmitter coils discussed herein with respect to FIGS. 16A-20B. Wireless charging mat 2300 can include a housing formed of two shells: a first shell 2302 and a second shell 2304. First shell 2302 can mate with second shell 2304 to form an interior cavity within which internal components may be positioned. Specifically, surfaces of first and second shells 2302 and 2304 can form walls that define the internal cavity. For instance, first shell 2302 can have a bottom surface that forms a first wall defining a top boundary of the internal cavity. Further, second shell 2304 can have a top surface that forms a second wall defining a bottom boundary of the internal cavity. Side surfaces of both first and second shells 2302 and 2304 can have sidewalls that form the lateral boundaries of the internal cavity. First and second shells 2302 and 2304 can also include notches 2306*a* and 2306*b*, respectively, that form an opening within the housing when first and second shells 2302 and 2304 are mated. An electrical connector 2308, such as a receptacle connector, can be positioned within the opening so that wireless charging mat 2300 can receive power from an external power source through a cable connected to electrical connector 2308. In some embodiments, electrical connector 2308 may include a plurality of contact pins and a plurality of terminals electrically coupled to the contact pins so that power can be routed from the external power source to the wireless charging mat 2300 to provide power for wireless power transfer.

First and second shells 2302 and 2304 may each be formed of more than one layer. For instance, first shell 2302 can include a top covering 2310, a compliant layer 2312, and a stiffening layer 2314. In some embodiments, compliant layer 2312 can be disposed between top covering 2310 and stiffening layer 2314. Top covering 2310 may be a cosmetic layer that is exposed when wireless charging mat 2300 is assembled. According to some embodiments, a top surface of top covering 2310 includes a charging surface 2316 upon which a device 2340 having a wireless power receiver coil 2342 may be placed to receive power from wireless charging mat 2300. The size and dimensions of charging surface 2316 can be defined by one or more transmitter coil arrangements (e.g., any transmitter coil arrangement discussed herein) encased between first and second shells 2302 and 2304.

Stiffening layer 2314 can be a rigid structure that gives wireless charging mat 2300 structural integrity. Any suitable stiff material may be used to form stiffening layer 2314 such as fiberglass. Compliant layer 2312 can be positioned under top covering 2310 to provide a soft, pillow-like texture for devices to rest on when contacting with top covering 2310 to receive power. Compliant layer 2312 can be formed of any suitable compliant material, such as a foam or any other porous material.

Second shell 2304 can include a bottom covering 2318, a bottom chassis 2320, and a drop frame 2322. In some embodiments, bottom chassis 2320 can be positioned between bottom covering 2318 and drop frame 2322. Bottom covering 2318 may be an outer covering that is exposed when wireless charging mat 2300 is assembled. Bottom chassis 2320 can be a stiff structure for providing structural rigidity for wireless charging mat 2300. In some embodiments, bottom chassis 2320 can be formed of any suitable stiff materials, such as fiberglass or carbon fiber. Drop frame 2322 may be a structural support layer that forms the backbone of wireless charging mat 2300. In some embodiments, drop frame 2322 is a stiff layer of plastic within which a plurality of openings 2348 are formed. Each opening 2348 can be formed to have dimensions corresponding to an electronic device, such as an inverter for operating one or more transmitter coils, as will be discussed further herein.

As mentioned above, top and bottom shells 2302 and 2304 can mate to form an inner cavity. Several internal components as shown in FIG. 23 can be positioned within the inner cavity. The internal components may include detection coils 2324 positioned below first shell 2302. Detection coils 2324 can be an arrangement of coils designed to operate at a predetermined frequency that enables detection coils 2324 to detect the presence of a device positioned on top covering 2310 within charging surface 2316.

In some embodiments, the internal components can also include a transmitter coil arrangement 2326 disposed below detection coils 2324. According to some embodiments of the present disclosure, transmitter coil arrangement 2326 can be formed of a plurality of generally planar transmitter coils arranged in multiple layers and in an overlapping and non-concentric arrangement where no two coils are concentric with each other. In other words, each transmitter coil can have a central axis that is positioned a lateral distance away from central axes of all other transmitter coils in the plurality of transmitter coils. For instance, transmitter coil arrangement 2326 can include three layers of transmitter coils (e.g., first layer 2328, second layer 2330, and third layer 2332) where each layer includes a plurality of transmitter coils that are arranged coplanar with one another. Some exemplary transmitter coil arrangements include transmitter coil arrangements 800, 1000, 1900, and 2200 in FIGS. 8, 10, 19, and 22 discussed herein above. Transmitter coil arrangement 2326 can be formed of stranded transmitter coils as discussed herein with respect to FIGS. 16A-16B and 18A-18B.

In some other embodiments, transmitter coil arrangement 2326 can be formed as an array of patterned conductive wires in a PCB.

Transmitter coil arrangement 2326 can be operated to generate time-varying magnetic fields that propagate above the top surface of first shell 2302 to induce a current in receiver coil 2342 in electronic device 2340. Coverage of the time-varying magnetic fields generated by transmitter coil arrangement 2326 may coincide with the dimensions of charging surface 2316. In some embodiments, every transmitter coil in transmitter coil arrangement 2326 includes a coil of wire that is wound in the same direction. Receiver coil 2342, on the other hand, can include a coil of wire that is wound in the opposite direction as the transmitter coils. For instance, every coil of wire in transmitter coil arrangement 2326 is wound in a clockwise direction, while the coil of wire of receiver coil 2342 is wound in a counter-clockwise direction.

In some embodiments, a ferrite layer 2334 can be disposed below transmitter coil arrangement 2326. Ferrite layer 2334 may be a layer of ferromagnetic material configured to prevent magnetic fields generated by transmitter coil arrangement 2326 from disrupting components disposed below transmitter coil arrangement 2326. Ferrite layer 2334 can be sized and shaped to correspond to charging surface 2316 and/or to transmitter coil arrangement 2326. In certain embodiments, ferrite layer 2334 can be positioned directly below first transmitter coil layer 2328. In such embodiments, first transmitter coil layer 2328 can include coils of wire that have less turns than the coils of wire in second and third transmitter coil layers 2330 and 2332. Ferrite layer 2334 can include a plurality of openings corresponding to the positions of contacts pins of transmitter coils in transmitter coil arrangement 2326. The plurality of openings allow the transmitter coils to make contact with components disposed below ferrite layer 2334. For instance, the plurality of openings can allow the transmitter coils to make contact with a driver board 2336 disposed below ferrite layer 2334.

Driver board 2336 may be an electrical interconnection structure, such as a PCB, flex circuit, patterned ceramic board, patterned silicon substrate, and the like, configured to route signals and power for operating transmitter coil arrangement 2326. In some embodiments, driver board 2336 includes plurality of contacts 2346 positioned to make contact with corresponding contact pins of transmitter coils in transmitter coil arrangement 2326. A plurality of inverters can be mounted on an underside of driver PCB 2336 for operating the transmitter coils in transmitter coil arrangement 2326. Each inverter can be positioned at locations corresponding to respective transmitter coils with which the inverter makes contact. In some embodiments, the plurality of inverters can be surface mounted to the bottom surface of driver PCB 2336 such that they extend below driver PCB 2336. Accordingly, the plurality of inverters can insert into respective openings 2348 in drop frame 2322. Openings 2348 can be positioned at locations corresponding to respective inverters mounted on driver PCB 2336. As shown in FIG. 23, notches 2350 may be formed in ferrite layer 2334 and driver PCB 2336 for receptacle connector 2308 to be positioned within wireless charging mat 2300 when assembled.

In some embodiments, a ground ring 2338 can be wound along at least a portion of the outer perimeter of driver PCB 2336. Ground ring 2338 may be a conductive wire wound along the outer perimeter of driver PCB 2336 except for a location where receptacle connector 2308 is coupled to driver PCB 2336.

Figure 24:
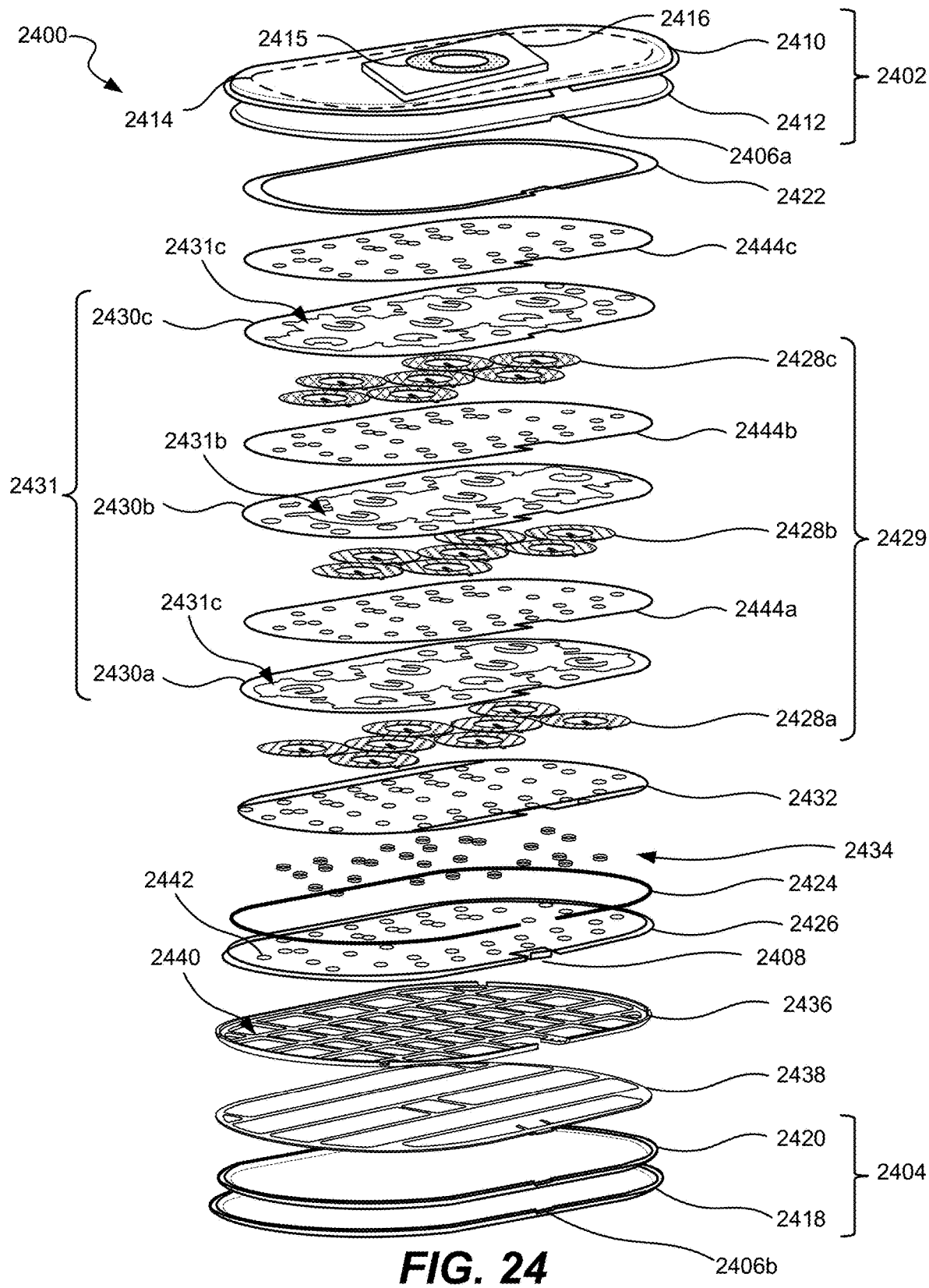
FIG. 24 is a simplified diagram illustrating an exploded view of an exemplary wireless charging mat having transmitter coils without bobbins, according to some embodiments of the present disclosure.

FIG. 24 illustrates an exploded view of an exemplary wireless charging mat 2400 having transmitter coils without bobbins, according to some embodiments of the present disclosure. Transmitter coils without bobbins can correspond to transmitter coils discussed herein with respect to FIGS. 21 and 22. Like wireless charging mat 2300, wireless charging mat 2400 can include a housing formed of two shells: a first shell 2402 and a second shell 2404. First shell 2402 can mate with second shell 2404 to form an interior cavity within which internal components may be positioned. Similar to wireless charging mat 2300, first and second shells 2402 and 2404 can also include notches 2406a and 2406b, respectively, that form an opening within the housing when first and second shells 2402 and 2404 are mated. An electrical connector 2408, such as a receptacle connector, can be positioned within the opening so that wireless charging mat 2400 can receive power from an external power source through a cable connected to electrical connector 2408. In some embodiments, electrical connector 2408 may include a plurality of contact pins and a plurality of terminals electrically coupled to the contact pins so that power can be routed from the external power source to the wireless charging mat 2400 to provide power for wireless power transfer.

First and second shells 2402 and 2404 can each be formed of more than one layer. For instance, first shell 2402 can include a top covering 2410 and a stiffening layer 2412. Top covering 2410 can be a cosmetic layer that is exposed when wireless charging mat 2400 is assembled. According to some embodiments, a top surface of top covering 2410 includes a charging surface 2414 upon which a device 2416 having a wireless power receiver coil 2415 may be placed to receive power from wireless charging mat 2400. The size and dimensions of charging surface 2416 can be defined by one or more transmitter coil arrangements (e.g., any transmitter coil arrangement discussed herein) encased between first and second shells 2402 and 2404.

In some embodiments, top covering 2410 can include a compliant layer (not shown) disposed below charging surface 2414. The compliant layer can be configured to provide a soft, pillow-like texture for devices to rest on when contacting with top covering 2410 to receive power. The compliant layer can be formed of any suitable compliant material, such as a foam or any other porous material. Stiffening layer 2414 can be positioned below top covering 2410, and be composed of a rigid structure that gives wireless charging mat 2400 structural integrity. Any suitable stiff material may be used to form stiffening layer 2414 such as fiberglass or a stiff polymer (e.g., molded Kalix).

Second shell 2404 can include a bottom covering 2418 and a bottom chassis 2420. In some embodiments, bottom chassis 2420 can be positioned against bottom covering 2418 such that bottom chassis 2420 is not shown when wireless charging mat 2400 is assembled. Bottom covering 2418 may be an outer covering that is exposed when wireless charging mat 2400 is assembled. Bottom chassis 2420 can be a stiff structure for providing structural rigidity for wireless charging mat 2400. In some embodiments, bottom chassis 2420 can be formed of any suitable stiff materials, such as fiberglass, carbon fiber, or stainless steel.

As mentioned above, top and bottom shells 2402 and 2404 can mate to form an inner cavity. As shown in FIG. 24, various internal components can be positioned within the inner cavity. For instance, the internal components can include a transmitter coil arrangement 2429. According to some embodiments of the present disclosure, transmitter coil arrangement 2429 can be formed of a plurality of generally planar transmitter coils arranged in multiple layers and in an overlapping and non-concentric arrangement where no two coils are concentric with each other. For instance, transmitter coil arrangement 2429 can include three layers of transmitter coils (e.g., first layer 2428a, second layer 2428b, and third layer 2428c) where each layer includes a plurality of transmitter coils that are arranged coplanar with one another. Some exemplary transmitter coil arrangements include those that have transmitter coils wound about a bobbin, such as transmitter coil arrangements 800, 1000, and 1900 in FIGS. 8, 10, and 19 discussed herein, and those that include transmitter coils that are not wound about a bobbin, such as transmitter coil arrangement 2200 shown in FIG. 22, discussed herein. Furthermore, transmitter coil arrangement 2429 can have any suitable number of transmitter coils. For instance, transmitter coil arrangement 2429 can have a total of 16 coils, such as transmitter coil arrangement 605 in FIG. 6D, or a total of 22 coils, such as transmitter coil arrangement 607 in FIG. 6E.

Transmitter coil arrangement 2429 can be operated to generate time-varying magnetic fields that propagate above the top surface of first shell 2402 to induce a current in receiver coil 2415 in electronic device 2416. Coverage of the time-varying magnetic fields generated by transmitter coil arrangement 2429 may coincide with the dimensions of charging surface 2416.

Wireless charging mat 2400 can also include a plurality of cowlings 2431 for housing transmitter coil arrangement 2429. For instance, plurality of cowlings 2431 can include a first cowling 2430a, a second cowling 2430b, and a third cowling 2430c. Each cowling can be a substantially planar structure that has openings 2431a-c within which transmitter coils can reside. For instance, first cowling 2430a can house first transmitter coil layer 2428a, second cowling 2430b can house second transmitter coil layer 2428b, and third cowling 2430c can house third transmitter coil layer 2428c. When the transmitter coils are housed within the cowling, the cowling can confine the transmitter coils to their respective positions and prevent them from shifting in any lateral direction. Some parts of each cowling can also reside within an inner diameter of transmitter coils to avoid any vacant space within the layer. Vacant space can allow deflection of structures in adjacent layers, which can cause physical stress upon one or more components and lead to excessive wear and tear. In some embodiments, the thickness of each cowling 2430a-c is equal to the thickness of a transmitter coil. Thus, when transmitter coils are housed within a respective cowling, the cowling and transmitter coils combine to form a substantially planar structure that does not have large open spaces within it.

In some embodiments, wireless charging mat 2400 can also include one or more spacers for separating each layer of transmitter coils and cowlings. For instance, wireless charging mat 2400 can include a first spacer 2444a, a second spacer 2444b, and a third spacer 2444c. First spacer 2444a can be positioned between first transmitter coil layer 2428a and second transmitter coil layer 2428b to separate the two transmitter coil layers 2428a and 2428b by a set distance defined by the thickness of first spacer 2444a. Similarly, second spacer 2444b can be positioned between second transmitter coil layer 2428b and third transmitter coil layer 2428c to separate the two transmitter coil layers 2428b and 2428c by a set distance defined by the thickness of second spacer 2444b. Furthermore, third spacer 2444c can be positioned between third transmitter coil layer 2428c and electromagnetic shield 2422 to separate them by a set distance defined by the thickness of third spacer 2444a. In some embodiments, the thickness of spacers 2444a-c are equal such that each transmitter coil layer 2428a-c and electromagnetic shield 2422 are separated from each other by the same distance. One purpose of spacers 2444a-c is to define a degree of parasitic capacitance between adjacent conductive layers (e.g., transmitter coil layers 2428a-c and electromagnetic shield 2422). By defining the space between the conductive layers to be equal, it provides an increase of sensitivity to detection of foreign objects on charging surface 2414, specifically in the high frequency range.

During wireless power transfer, transmitter coil arrangement 2429 can generate time-varying magnetic fields for inducing a corresponding current in receiver coil 2415. These generated magnetic fields, if not controlled, can generate noise and detrimentally affect surrounding components. Thus, transmitter coil arrangement 2429 can be surrounded by several components to confine the magnetic fields such that they are generated in one direction and do not disturb neighboring components. In some embodiments, the components include a ferromagnetic shield 2432, an electromagnetic shield 2422, a grounding fence 2424, and a driver board 2426 as will be discussed further herein.

Ferromagnetic shield 2432 can be a layer of ferromagnetic material that is disposed below transmitter coil arrangement 2429 and configured to prevent magnetic fields generated by transmitter coil arrangement 2429 from disrupting components disposed below ferromagnetic shield 2432. Ferromagnetic shield 2432 can be sized and shaped according to charging surface 2416 and/or to transmitter coil arrangement 2429. In certain embodiments, ferromagnetic shield 2432 can be positioned directly below first transmitter coil layer 2428a. In such embodiments, first transmitter coil layer 2428a can include coils of wire that have less turns than the coils of wire in second and third transmitter coil layers 2428b and 2428c. Ferromagnetic shield 2432 can include a plurality of openings corresponding to the positions of contacts pins of transmitter coils in transmitter coil arrangement 2429. The plurality of openings allow the transmitter coils to make contact with components disposed below ferromagnetic shield 2432, such as driver board 2426.

As mentioned herein, electromagnetic shield 2422 can also be included with wireless charging mat 2400. Electromagnetic shield 2422 can be positioned below first shell 2402 and can be configured to prevent the generation of detrimental voltages on a receiver coil during wireless power transfer. Particularly, electromagnetic shield 2422 can be configured to intercept electric fields generated by transmitter coils within wireless charging mat 2400 during wireless power transfer so that detrimental voltages are prevented from being generated on a receiver coil, e.g., receiver coil 2415. The structure and material composition of electromagnetic shield 2422 is discussed further herein with respect to FIGS. 25A and 25B.

Figure 25A:
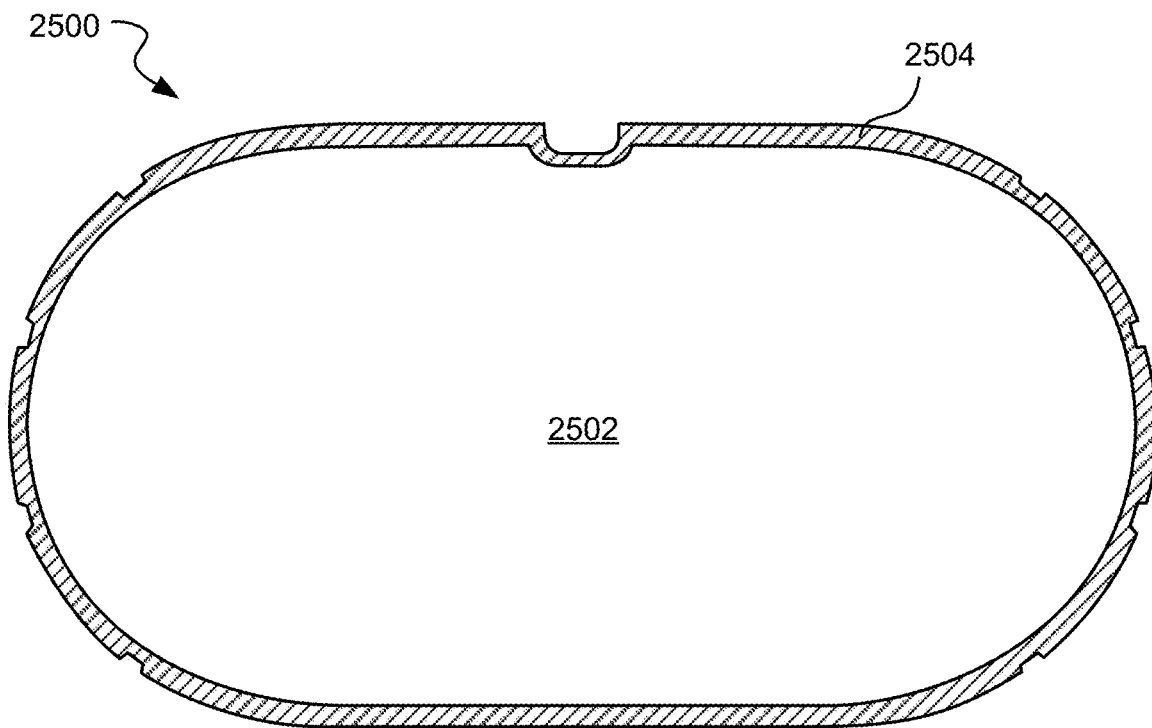
FIG. 25A is a simplified diagram illustrating a top-view of an exemplary electromagnetic shield with a thin conductive border, according to some embodiments of the present disclosure.

FIG. 25A is a top-view illustration of an exemplary electromagnetic shield 2500, according to some embodiments of the present disclosure. Electromagnetic shield 2500 can include a shielding body 2502 and a conductive border 2504 around a perimeter of shielding body 2502. Shielding body 2502 can intercept electric fields generated by one or more transmitter coils in wireless charging mat 2400 and discharge the voltage generated by the intercepted electric fields to ground through conductive border 2504. In some embodiments, shielding body 2502 is constructed of a material having properties that enable magnetic flux to pass through the shielding body but prevent electric fields from passing through. For instance, shielding body 2502 can be formed of silver laminated on a layer of pressure sensitive adhesive (PSA). The silver layer can have a thickness of approximately 30-40 μm, particularly 35 μm in one embodiment. As further shown in FIG. 25A, conductive border 2504 can be constructed as a thin conductive region around shielding body 2502; however, embodiments are not so limited. Other embodiments can have different configurations of conductive border 2504, as shown in FIG. 25B.

Figure 25B:
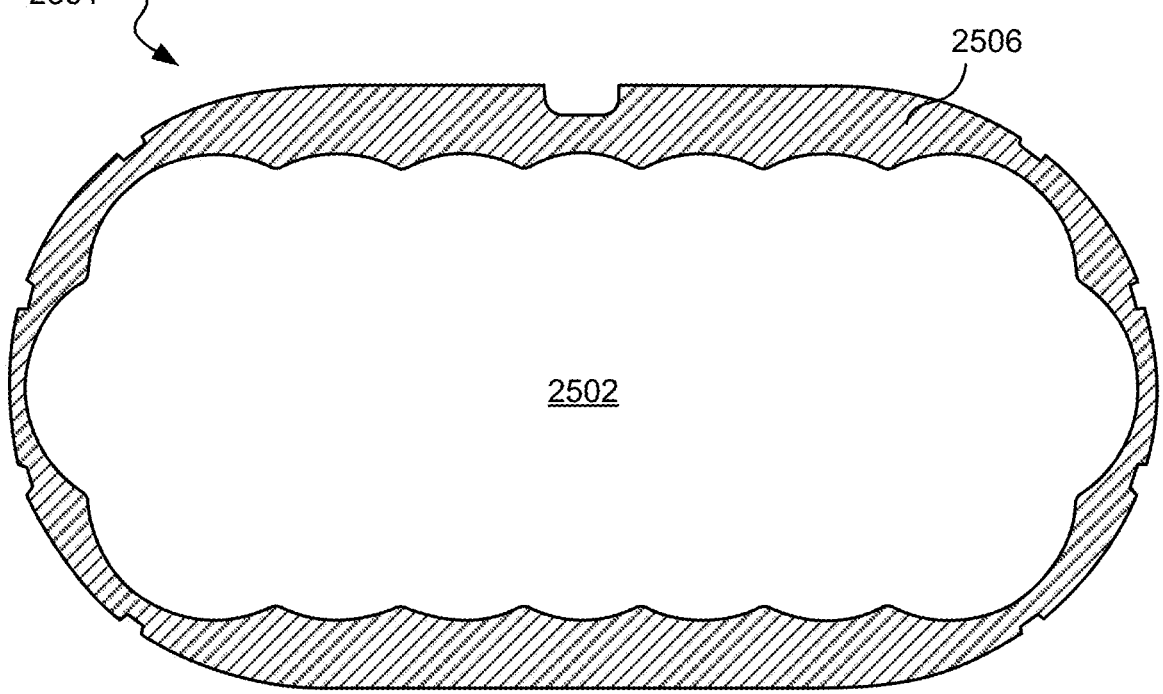
FIG. 25B is a simplified diagram illustrating a top-view of an exemplary electromagnetic shield with a conductive border that extends to edges of a transmitter coil arrangement, according to some embodiments of the present disclosure.

FIG. 25B is a top-view illustration of another exemplary electromagnetic shield 2501, according to some embodiments of the present disclosure. Electromagnetic shield 2501 can include shield body 2502 and a conductive border 2506 that extends to edges of a transmitter coil arrangement, such as any transmitter coil arrangement discussed herein. By extending conductive border 2506 to edges of the transmitter coil arrangement, transmission efficiency of magnetic fields thorough electromagnetic shield 2501 can be improved over the transmission efficiency of electromagnetic shield 2500.

Conductive border 2504 and 2506 can be formed of a conductive material, such as copper. The conductive border 2504 and 2506 can be a thin sheet of copper that is adhered onto the surface of shielding body 2502. The conductive properties of conductive border 2504 and 2506 allows voltage generated by intercepted electric fields to be routed to ground. In some embodiments, conductive border 2504 can route voltage to a grounding fence, such as grounding fence 2424 shown in FIG. 24.

Referring back to FIG. 24 and as aforementioned herein, wireless charging mat 2400 can include grounding fence 2424, according to some embodiments of the present disclosure. Grounding fence 2424 can be wound along at least a portion of the outer perimeter of driver board 2426 and attach to at least a portion of the outer perimeter of electromagnetic shield 2422. Grounding fence 2424 can be formed of a length of wire having conductive properties, as well as shielding properties to inhibit propagation of magnetic fields through grounding fence 2422. For instance, grounding fence 2422 can be formed of a metal, e.g. steel, or a coated metal, e.g., nickel plated steel.

Driver board 2426 can be a PCB configured to route signals and power for operating transmitter coil arrangement 2429. In some embodiments, driver board 2426 can include a plurality of bonding pads 2442 for routing power to transmitter coil arrangement 2429 via a plurality of standoffs, as will be discussed further herein. Electrical connector 2408 can be mounted on driver board 2426 so that driver board 2426 can receive power from an external source to operate transmitter coil arrangement 2429. The combination of driver board 2426, grounding fence 2424, ferromagnetic shield 2432 and electromagnetic shield 2422 can form a faraday cage that encloses transmitter coil arrangement 2429 to control the emission of time-varying magnetic fields generated by transmitter coil arrangement 2429. For instance, the faraday cage can direct magnetic flux out of the faraday cage in a single direction while substantially preventing the propagation of magnetic flux in all other directions out of the faraday cage. A better understanding and a different perspective of this faraday cage is discussed with respect to and shown in FIGS. 26A and 26B.

Figure 26A:
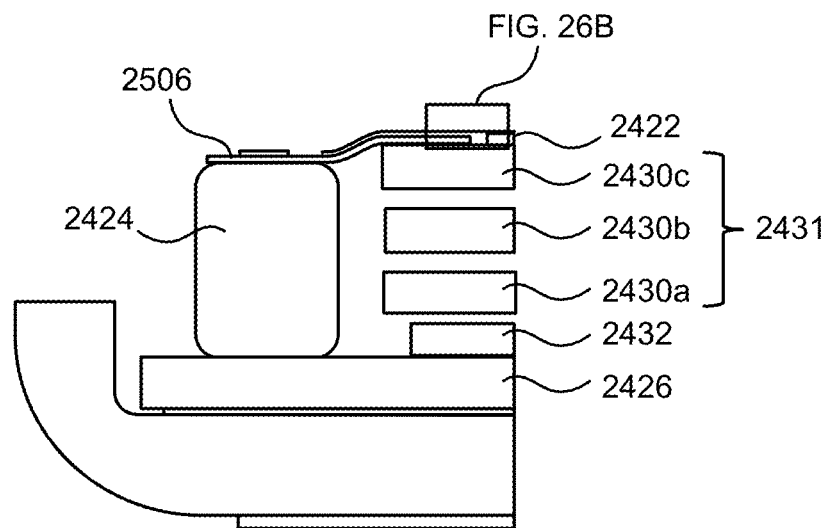
FIG. 26A is a simplified diagram illustrating a cross-sectional view of a part of a faraday cage around a transmitter coil arrangement of a partially-formed wireless charging mat, according to some embodiments of the present disclosure.

FIG. 26A is a cross-sectional view of a part of the faraday cage around transmitter coil arrangement 2429 (not shown) of a partially-formed wireless charging mat, according to some embodiments of the present disclosure. It is to be appreciated that transmitter coil arrangement 2429 is not shown because only an edge of the faraday cage is shown and that transmitter coil arrangement 2429 is positioned away from the edges of the faraday cage, but edges of plurality of cowlings 2431 can be seen. Furthermore, it is to be appreciated that the part of the faraday cage shown in FIG. 26A is only for one side of the wireless charging mat and that one skilled in the art understands that this illustration is representative of substantially all edges of a wireless charging mat. As shown in FIG. 26A, plurality of cowlings 2431 (and transmitter coil arrangement 2429) are enclosed by a faraday cage formed of electromagnetic shield 2422, grounding fence 2424, ferromagnetic shield 2432, and driver board 2426.

According to some embodiments, the faraday cage can be configured to allow magnetic flux to propagate in one direction. For instance, grounding fence 2424 can be configured to substantially resist propagation of magnetic flux from transmitter coil arrangement 2429 through grounding fence 2424 so that magnetic fields are contained within the faraday cage in a lateral direction. Additionally, ferromagnetic shield 2432 can be configured to redirect magnetic flux to substantially mitigate the propagation of magnetic flux into driver board 2426 from transmitter coil arrangement 2429, i.e., downward and out of the faraday cage. However, electromagnetic shield 2422 can be configured to allow magnetic flux to propagate through so that the magnetic flux is directed out of the faraday cage in a single direction, e.g., upwards toward a receiver coil in an electronic device. By configuring the faraday cage to allow the propagation of magnetic flux in one direction, the faraday cage can prevent the generated magnetic flux from creating noise in other electrical systems in the wireless charging mat while purposefully allowing magnetic flux to propagate in a direction toward a receiver coil to perform wireless charging.

In some embodiments, electromagnetic shield 2422 is attached to grounding fence 2424 so that voltages generated on electromagnetic shield 2422 during wireless charging can be discharged to ground. In some instances, conductive border 2506 of electromagnetic shield 2422 is attached to grounding fence 2424 via laser welding to achieve a robust electrical and physical connection. Furthermore, ferromagnetic shield 2432 can be positioned on a surface of driver board 2426 to mitigate the propagation of magnetic flux into driver board 2426. In some embodiments, ferromagnetic shield 2432 is positioned on driver board 2426 and laterally from grounding fence 2424 such that ferromagnetic shield 2432 is not positioned between grounding fence 2424 and driver board 2426. By not attaching ferromagnetic shield 2432, its brittle structure will not be exposed to physical stresses at the interface between grounding fence 2424 and driver board 2426, thereby minimizing damage to ferromagnetic shield 2432.

Figure 26B:
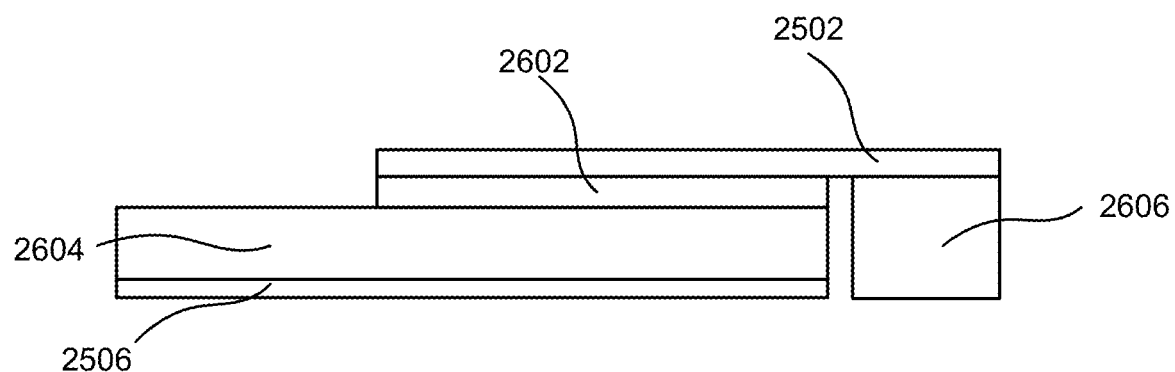
FIG. 26B is a simplified diagram illustrating a close-up cross-sectional view of an interface between a shielding body and a conductive border, according to some embodiments of the present disclosure.

As mentioned herein with respect to electromagnetic shield 2501 shown in FIG. 25B, conductive border 2506 is adhered to shielding body 2502. In some embodiments, one or more adhesives can be used to attach conductive border 2506 to an edge of shielding body 2502. FIG. 26B is a close-up cross-sectional view of an interface between shielding body 2502 and conductive border 2506. As shown, conductive border 2506 can be attached to shielding body 2502 by adhesive layers 2602 and 2604. Adhesive layers 2602 and 2604 can be any suitable conductive adhesive, such as a single or double sided copper tape. In some embodiments, adhesive layer 2602 is a layer of double-sided copper tape and adhesive layer 2604 is a layer of single-sided adhesive tape. Using a conductive adhesive allows voltage captured on electromagnetic shield 2502 to be routed to grounding fence 2424 through conductive border 2506. Although FIG. 26B illustrates conductive border 2506, it is to be appreciated that disclosures herein also apply to embodiments where conductive border 2504 is used instead. In some embodiments, shield 2422 can be secured to third cowling layer 2430c with an adhesive so that it does not substantially move in place during use. For instance, shield 2422 can be secured via an adhesive 2606, such as PSA.

As discussed herein, a driver board can be a PCB configured to operate a transmitter coil arrangement. Thus, with reference back to FIG. 24, driver board 2426 can be electrically coupled to the transmitter coils in transmitter coil arrangement 2429 via a plurality of standoffs 2434, according to some embodiments of the present disclosure. In some embodiments, each standoff is coupled to a respective bonding pad 2442 for enabling power transfer from driver board 2426 to transmitter coil arrangement 2429. Standoffs 2434 can be configured to route power between driver board 2426 and each layer of transmitter coil arrangement 2429. For instance, standoffs 2434 can be composed of a plurality of conductive posts that can route power from one end of the post to an opposite end of the post, as discussed herein with respect to FIGS. 27A-B and 28A-B.

Figure 27A:
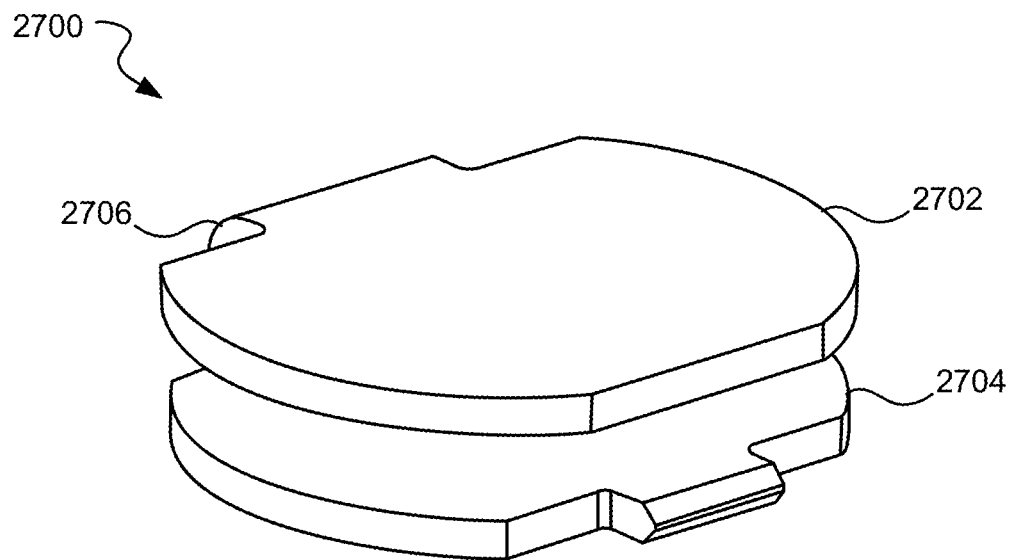
FIGS. 27A and 27B are simplified diagrams illustrating an exemplary standoff, according to some embodiments of the present disclosure.
Figure 27B:
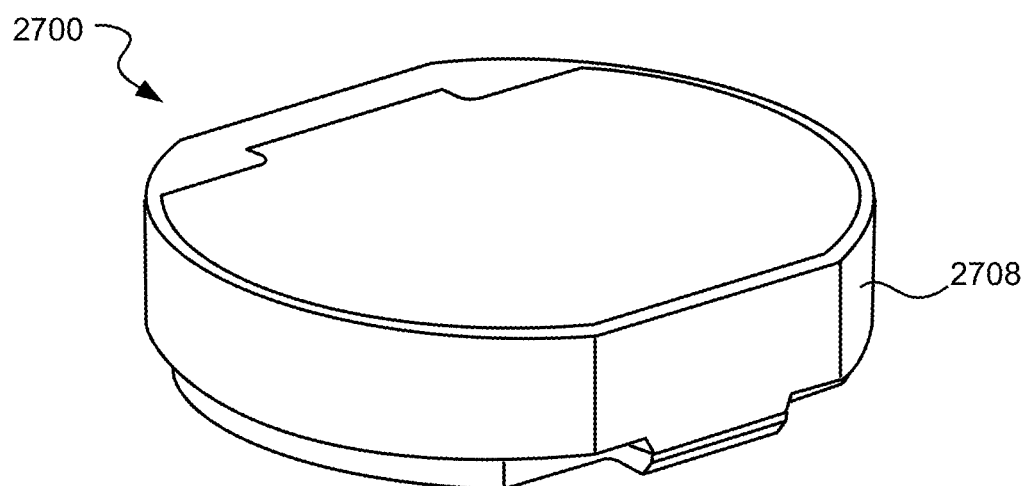

FIGS. 27A and 27B illustrate an exemplary standoff 2700, according to some embodiments of the present disclosure. Standoff 2700 can include a first contact 2702 on one end and a second contact 2704 on an opposite end. A connector 2706 can electrically couple first contact 2702 to second contact 2704 so that power can be routed between contacts 2702 and 2704. In some embodiments, first contact 2702, second contact 2704, and connector 2706 form one monolithic structure that is shaped like the letter "U" tilted on its side. This monolithic structure can have a degree of mechanical compliance when pressure is applied in the vertical direction. Thus, in some embodiments, first contact 2702, second contact 2704, and connector 2706 can be formed of a substantially stiff material that is highly conductive, such as a copper alloy with a conductivity of approximately 60%-90% of the conductivity of copper. Some exemplary copper alloys include, but are not limited to, NKC4419, NKE 010, and C19210.

In addition to using mechanically strong conductive materials for forming the monolithic structure, separate support structures can be used to strengthen standoff 2700 as well. For example, a support component 2708 can be positioned between first and second contacts 2702 and 2704 to provide structural support for standoff 2700. Support component 2708 can also extend over sidewalls of first and second contacts 2702 so that only the top surface of first contact 2702 and the bottom surface of second contact 2704 are exposed. To strengthen the structural coupling between support component 2708 and the monolithic structure, one or more hook structures can be implemented in first and/or second contacts 2702 and 2704, as shown in FIG. 28A.

Figure 28A:
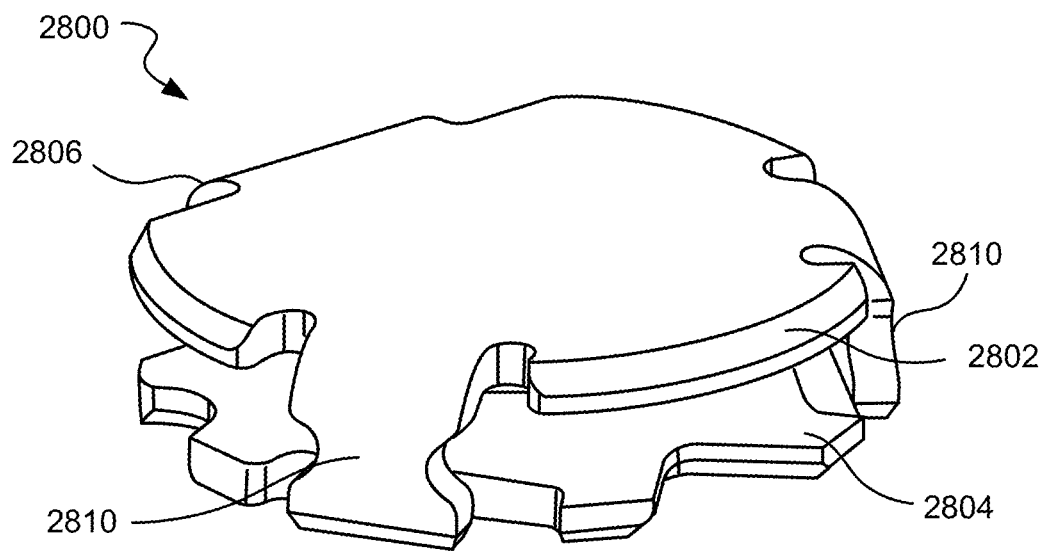
FIGS. 28A and 28B are simplified diagrams illustrating an exemplary standoff with hook structures, according to some embodiments of the present disclosure.
Figure 28B:
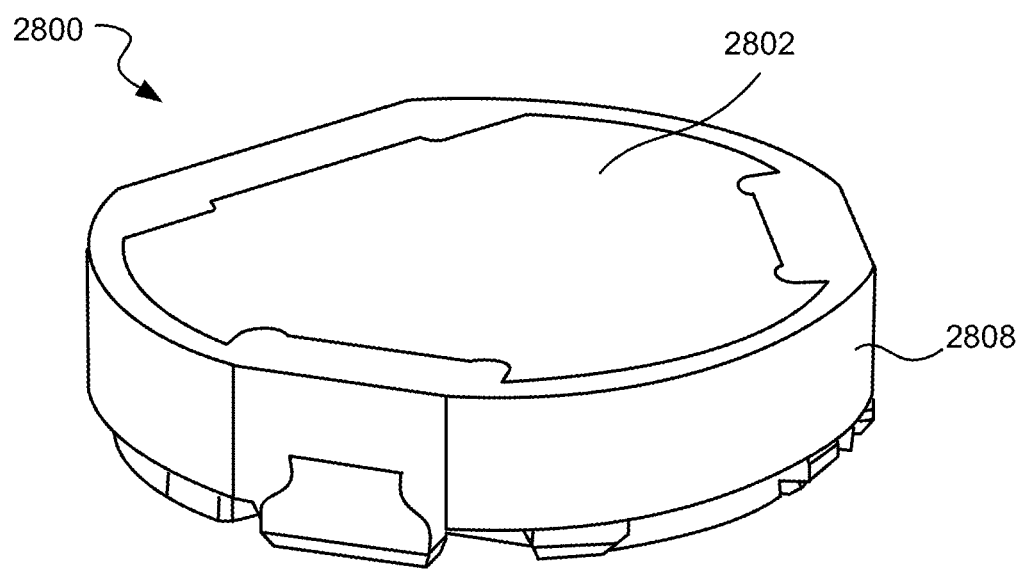

FIGS. 28A and 28B illustrate an exemplary standoff 2800 with hook structures 2810, according to some embodiments of the present disclosure. Like standoff 2700, standoff 2800 can include a first contact 2802 and a second contact 2804 that are coupled together via connector 2806. First connect 2802, second contact 2804, and connector 2806 can form a monolithic structure that is similar to standoff 2700. In some embodiments, standoff 2800 includes hook structures 2810 that extend from first contact 2802 and/or second contact 2804. As shown in FIG. 28A, hook structures 2810 extend from first contact 2802 and also form part of the monolithic structure. Hook structures 2810 provide additional surface area for making contact with a support structure 2808 shown in FIG. 28B to enhance the mechanical coupling with support structure 2808.

As discussed herein, standoffs 2434 can be configured to couple driver board 2426 with each transmitter coil of transmitter coil arrangement 2429. Accordingly, standoffs 2434 can be configured to have different heights to couple driver board 2426 with transmitter coils in different layers.

Figure 29:
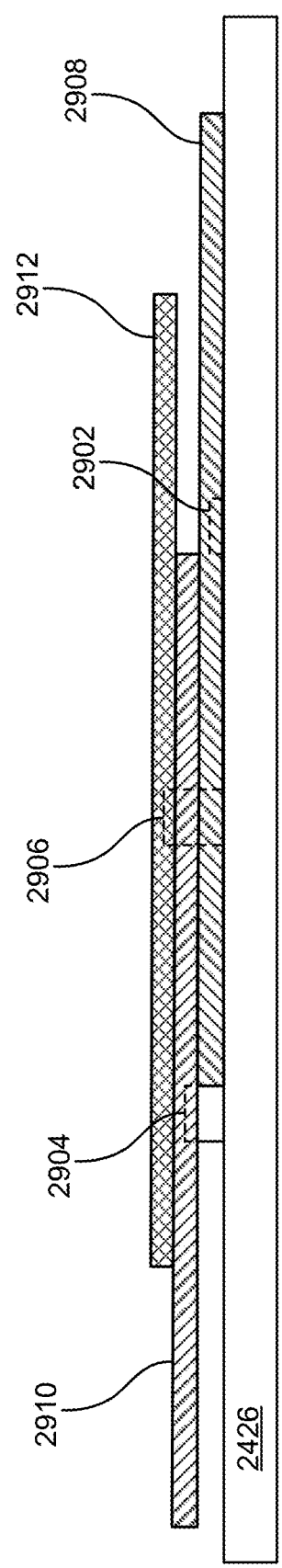
FIG. 29 is a simplified diagram illustrating an exemplary assembled transmitter coil arrangement attached to an underlying driver board, according to some embodiments of the present disclosure.

FIG. 29 illustrates an exemplary assembled transmitter coil arrangement 2900 attached to an underlying driver board (e.g., driver board 2426) with standoffs 2902, 2904, and 2906. according to some embodiments of the present disclosure. Transmitter coil arrangement 2900 can include transmitter coil 2908 in a first transmitter coil layer, transmitter coil 2910 in a second transmitter coil layer, and transmitter coil 2912 in a third transmitter coil layer. Only one transmitter coil from each layer of transmitter coil arrangement 2429 is shown in FIG. 29 for clarity purposes.

When assembled, standoffs 2902, 2904, and 2906 can be nested within transmitter coil arrangement 2900 as shown by the dotted lines. Each standoff 2902, 2904, and 2906 can be configured to have a different height that corresponds to the respective layer of a transmitter coil to which it is coupled. For instance, standoff 2902 can have a first height suitable for coupling driver board 2426 with transmitter coil 2908 in the first transmitter coil layer, standoff 2904 can have a second height suitable for coupling driver board 2426 with transmitter coil 2910 in the second transmitter coil layer, and standoff 2906 can have a third height suitable for coupling driver board 2426 with transmitter coil 2912 in the third transmitter coil layer. Accordingly, standoff 2906 can be taller than both standoffs 2902 and 2904, and standoff 2904 can be taller than standoff 2902 but shorter than standoff 2906. Once the three layers of transmitter coils are assembled, adjacent transmitter coils can rest against each other yet still couple with driver board 2426, thereby minimizing the z-height of transmitter coil arrangement 2900.

With reference back to FIG. 24, wireless charging mat 2400 can also include a drop frame 2436 and a bottom shield 2438 for drop frame 2436, according to some embodiments of the present disclosure. When assembled in wireless charging mat 2400, bottom shield 2438 can be adhered to drop frame 2436. Drop frame 2436 can be a structural support layer that forms the backbone of wireless charging mat 2300. In some embodiments, drop frame 2322 is a stiff layer of plastic within which a plurality of openings 2440 are formed. Each opening 2440 can be formed to have dimensions and a position corresponding to one or more electronic devices, such as a plurality of inverters for operating one or more transmitter coils, as will be discussed further herein.

Figure 30:
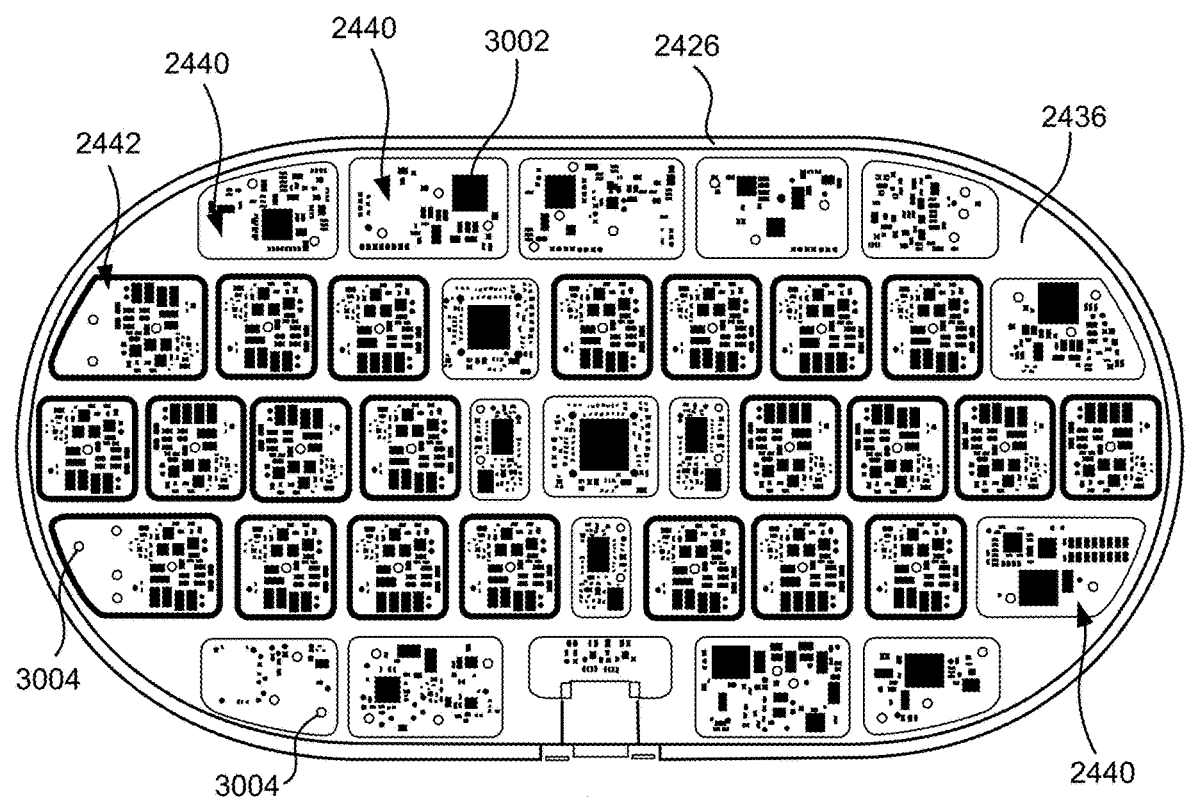
FIG. 30 is a simplified diagram illustrating a bottom-view of a drop frame coupled to a driver board, according to some embodiments of the present disclosure.

FIG. 30 is a bottom-view illustration of drop frame 2436 coupled to driver board 2426, according to some embodiments of the present disclosure. The illustration shows drop frame 2436 and driver board 2426 without a bottom shield so that the placement of a plurality of packaged electrical components 3002 can be seen with respect to drop frame 2436. Thus, openings 2440 of drop frame 2436 can allow driver board 2426 to be seen through each opening 2440 when viewed from the bottom-view perspective. In some embodiments, packaged electrical components 3002, shown as a plurality of black components of various sizes and shapes, can be disposed on driver board 2426 within openings 2440. Electrical components 3002 can be any suitable electrical component utilized for operating wireless charging mat 2400. For instance, electrical components 3002 can be power electronics, microcontrollers, capacitors, resistors, and the like. In some embodiments, electrical components 3002 include a plurality of inverters that can be mounted on a corresponding underside region of driver board 2426 for operating the transmitter coils in transmitter coil arrangement 2429.

In particular embodiments, some of openings 2440 can provide space within which packaged inverters are disposed to operate an arrangement of transmitter coils, such as arrangement of transmitter coils 605 or 607 shown in FIGS. 6D and 6E. For instance, inverter openings 2442 can be used to provide space in which the packaged inverters are positioned. Inverter openings 2442 are shown with bolded lines so that they are easier to be seen. In some embodiments, the number of inverter openings 2442 for the packaged inverters correspond with the number of transmitter coils used in the arrangement of transmitter coils. For instance, if wireless charging mat incorporates an arrangement of transmitter coils that is composed of 22 coils, then drop frame 2436 can include 22 inverter openings 2442, where each inverter opening provides corresponds with a respective inverter for supporting a respective transmitter coil. In some embodiments, inverter openings 2442 are disposed such that the packaged inverters can be positioned directly below respective transmitter coils that they support. In other embodiments, one or more inverter openings 242 may not be positioned to allow a packaged inverter to be disposed directly below its respective transmitter coil. However, these inverter openings nevertheless can allow the packaged inverter to be placed very close to its respective transmitter coil and not at an edge of the wireless charging mat where it is far from its respective transmitter coil. By allowing the packaged inverters to be positioned close to, if not directly below, their respective transmitter coils, timing delays and losses caused by high resistances from long trace lengths (as experienced by conventional charging mats where inverters are placed at the perimeter of a charging mat and need to be routed to transmitter coils in the center of the charging mat) can be minimized.

According to some embodiments of the present disclosure, bottom shield 2438 (not shown in FIG. 30) can be laminated on a side of drop frame 2436 opposite of the side to which driver board 2426 is coupled. Bottom shield 2438 thus encloses electrical components 3002 within respective openings 2440 so that not only are the electrical components protected from outside electrical disturbances, but that components of wireless charging mat 2400 outside of openings 3002 are not disturbed by noises generated from electrical components 3002. In some embodiments, bottom shield 2438 is formed of shielding layer and a plurality of insulating layers as shown in FIG. 31.

Figure 31:
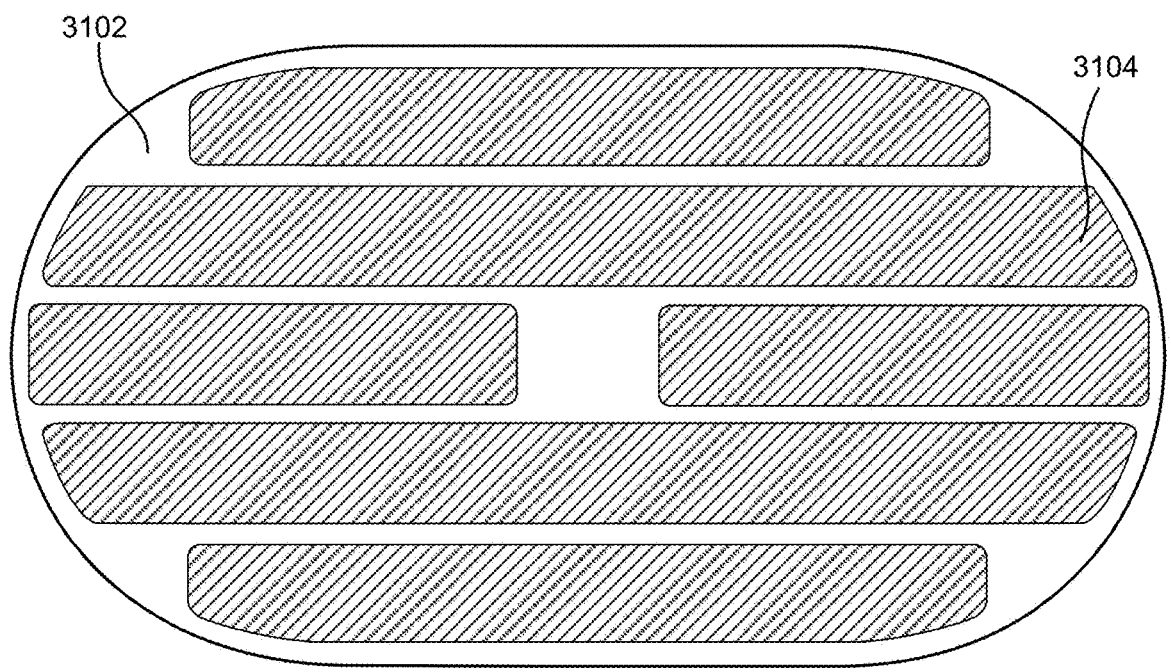
FIG. 31 is a simplified diagram illustrating a top-down view of an exemplary bottom shield, according to some embodiments of the present disclosure.
Figure 32:
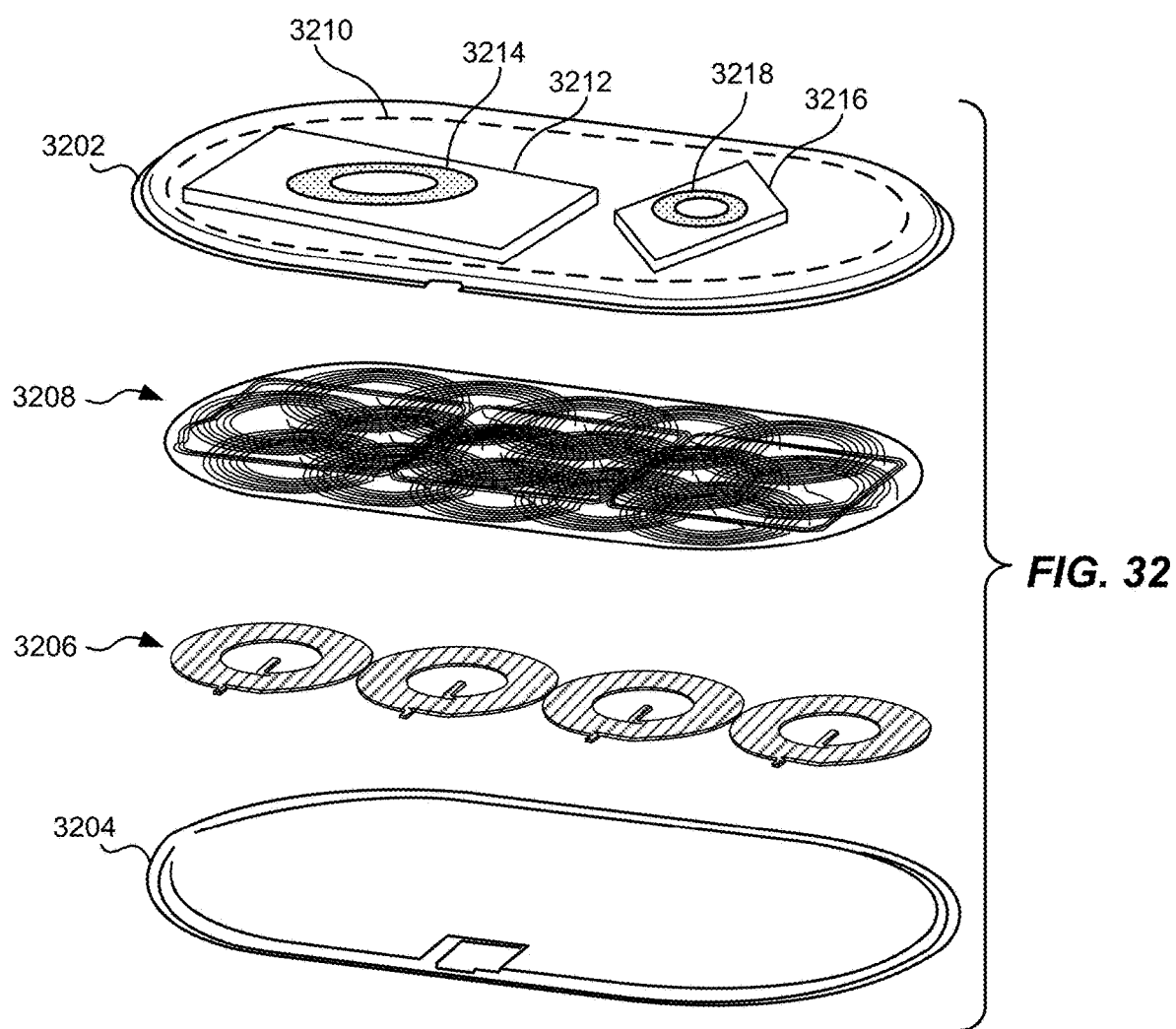
FIG. 32 is a simplified diagram illustrating an exploded view of an exemplary wireless charging mat including more than one transmitter coil arrangement, according to some embodiments of the present disclosure.

FIG. 31 is a top-down view of an exemplary bottom shield 3100, according to some embodiments of the present disclosure. Bottom shield 3100 can include a shielding layer 3102 and a plurality of insulating layers 3104 attached to shielding layer 3102. In some embodiments, insulating layers 3104 correspond to one or more openings of a drop frame, such as openings 2440 in FIG. 30. For instance, insulating layers 3104 can be configured as strips that correspond to more than one opening 2440/2442, as shown in FIG. 31. When constructed in the wireless charging mat, insulating layer 3104 can be attached to drop frame 2436 and positioned between drop frame 2436 (along with its one or more openings) and shielding layer 3102. Insulating layers 3104 can prevent electrical coupling of electrical components 3002 with the shielding layer 3102. In some embodiments, shielding layer 3102 is a thin material that is flexible. Thus, areas of shielding layer 3102 directly above openings 2440 can deflect into openings 2440 and make contact with one or more electrical components 3002. Accordingly, insulating layers 3104 can prevent electrical coupling between shielding layer 3102 and one or more electrical components 3002.

Shielding layer 3102 can be formed of any material suitable for shielding against electrical emissions to and from electrical components 3002. For instance, shielding layer 3102 can be formed of copper. Insulating layers 3104 can be formed of any electrically insulating material, such as polyimide.

In some embodiments, a plurality of posts can be disposed within openings 2440 to mitigate the degree of travel when shielding layer 3102 is depressed into openings 2440. For instance, with reference back to FIG. 30, posts 3004 can be positioned on driver board 2426 in areas where there are open spaces to mitigate deflection of bottom shield 2438. Additionally, posts 3004 can also prevent electrical components 3002 from damage caused by external objects pressing to openings 2440.

VII. Hybrid PCB and Stranded Coil Wireless Charging Mat

According to some embodiments of the present disclosure, a wireless charging mat can be configured to provide power to more than one different device. For instance, one device can be a larger device with larger receiving coils, e.g., a smart phone, table, laptop, and the like, while the other device can be a smaller device with smaller receiving coils, e.g., a smart watch, a small portable music player, and the like. In such embodiments, the wireless charging mat can include more than one transmitter coil arrangement where each transmitter coil arrangement is optimized for charging a different electronic device. Accordingly, the wireless charging mat can advantageously charge more than one different device at a time and/or be equally efficient at charging multiple different devices.

FIG. 30 illustrates an exploded view of an exemplary wireless charging mat 3200 including more than one transmitter coil arrangement, according to some embodiments of the present disclosure. Wireless charging mat 3200 can include a first shell 3202 and a second shell 3204, each of which may be constructed similar to first and second shells 2302 and 2304 in FIG. 23. First and second shells 3202 and 3204 can mate to form an inner cavity within which internal components can be housed. In some embodiments, the inner cavity can include more than one transmitter coil arrangement. For instance, the inner cavity can include two transmitter coil arrangements: first transmitter coil arrangement 3206 and second transmitter coil arrangement 3208. It is to be appreciated that wireless charging mat 3200 can further include other internal components similar to wireless charging mat 2320 in FIG. 23 but are not shown for clarity purposes.

First transmitter coil arrangement 3206 may be optimized to charge a first device 3212 including a first receiver coil 3214 and second transmitter coil arrangement 3208 may be optimized to charge a second device 3216 including a second receiver coil 3218 that has a different size and shape, and thus different electrical characteristics, than the first receiving coil. For example, first device 3212 can be a larger device than second device 3216, and first receiver coil 3214 can be larger than second receiver coil 3218. Although each transmitter coil arrangement 3206 and 3208 can be optimized to charge a different device, each transmitter coil arrangement may still charge other devices that they are not optimized to charge but in a less efficient manner. It is to be appreciated that even though FIG. 30 illustrates only two devices, embodiments discussed herein may be configured to charge more than two devices, each having different sizes and shapes than those shown in FIG. 30. Furthermore, it is to be appreciated that each transmitter coil arrangement can charge an electronic device across the entire charging surface. It is not the case where one transmitter coil arrangement can only charge devices in a sub-region of the charging surface, and that the other transmitter coil arrangement can only charge devices in another sub-region of the charging surface.

In some embodiments, first and second transmitter coil arrangements 3206 and 3208 can be formed of transmitter coils where the sizes of the transmitter coils are optimized for a different electrical device. As an example, first transmitter coil arrangement 3206 can be formed of transmitter coils of a first size, while second transmitter coil arrangement 3208 is formed of transmitter coils of a second size. The first size can correspond to the size of receiver coil 3214 in first electronic device 3212, whereas the second size can correspond to the size of receiver coil 3218 in second electronic device 3216. Accordingly, first transmitter coil arrangement 3206 may be particularly efficient at inducing a current in receiver coil 3214 of first device 3212 but less efficient at inducing a current in receiver coil 3218 of second device 3216. Conversely, second transmitter coil arrangement 3208 may be particularly efficient at inducing a current in receiver coil 3218 of second device 3216 but less efficient at inducing a current in receiver coil 3214 of first device 3212. It is to be appreciated that each transmitter coil arrangement can charge an electronic device across the entire charging surface.

In additional embodiments, first and second transmitter coil arrangements 3206 and 3208 can be arranged in different patterns where each pattern is optimized for a different electrical device. As an example, first transmitter coil arrangement 3206 can be arranged in a single row of transmitter coils, while second transmitter coil arrangement 3208 is arranged according to any of transmitter coil arrangements 800, 1000, 1900, and 2200 in FIGS. 8, 10, 19, and 22 discussed herein above. Accordingly, first transmitter coil arrangement 3206 may be particularly efficient at inducing a current in receiver coil 3214 of first device 3212 but less efficient at inducing a current in receiver coil 3218 of second device 3216, and vice versa.

As discussed herein, transmitter coil arrangements can generate time-varying magnetic fields. Thus, first and second transmitter coil arrangements 3206 and 3208 can be operated at various frequencies to generate the time-varying magnetic fields. In some embodiments, first transmitter coil arrangement 3206 can operate at a first frequency while second transmitter coil arrangement 3208 operates at a second frequency. The first and second frequencies may be the same or different when first and second transmitter coil arrangements 3206 and 3208 are arranged in different patterns. However, the first and second frequencies are different when first and second transmitter coil arrangements 3206 and 3208 are arranged in the same pattern. For instance, first and second transmitter coil arrangements 3206 and 3208 can both be arranged according to any of transmitter coil arrangements 800, 1000, 1900, and 2200 in FIGS. 8, 10, 19, and 22 discussed herein above, or any other transmitter coil arrangement. In such cases, first transmitter coil arrangement 3206 may operate at a frequency that is particularly efficient at inducing a current in receiver coil 3214 of first device 3212 but less efficient at inducing a current in receiver coil 3218 of second device 3216. Conversely, second transmitter coil arrangement 3208 can operate at a frequency that is particularly efficient at inducing a current in receiver coil 3218 of second device 3216 but less efficient at inducing a current in receiver coil 3214 of first device 3212. The difference in operating frequencies may depend on the particular operating frequencies of the respective receiver coils. In some embodiments, the difference can range between orders of magnitudes. As an example, the first frequency can be an order of one or two magnitudes higher than the second frequency. In particular embodiments, the first device 3212 is a smart watch and second device 3216 is a smart phone.

Furthermore, in some embodiments, first and second transmitter coil arrangements 3206 and 3208 can be formed from the same or different transmitter coils. That is, first transmitter coil arrangement 3206 can be formed from transmitter coils having stranded coiled wire with or without bobbins, e.g., transmitter coils 1600, 1800, and 2100 in FIGS. 16, 18, and 21, while second transmitter coil arrangement 3208 can be formed within a PCB. Each form of construction can be tailored to efficiently induce power in a respective device. For instance, the stranded coil construction of second transmitter coil arrangement 3208 may be particularly efficient at inducing a current in receiver coil 3218 of second device 3216 but less efficient at inducing a current in receiver coil 3214 of first device 3212.

Although the invention has been described with respect to specific embodiments, it will be appreciated that the invention is intended to cover all modifications and equivalents within the scope of the following claims.

What is claimed is:

1. An electronic device, comprising:
   a housing comprising a charging surface; and
   an inductor coil arrangement disposed within the housing, the inductor coil arrangement comprising:
      a first inductor coil layer in a first plane including a first inductor coil having a first center axis;
      a second inductor coil layer in a second plane including a second inductor coil overlapping with a portion of the first inductor coil and having a second center axis;
      a third inductor coil layer in a third plane including a third inductor coil overlapping with a portion of the first inductor coil and a portion of the second inductor coil, the third inductor coil having a third center axis, wherein the first center axis, the second center axis, and the third center axis are equally spaced apart from one another; and
      a spacing layer between one of the first inductor coil layer and the second inductor coil layer or the second inductor coil layer and the third inductor coil layer, wherein the spacing layer defines a degree of parasitic capacitance between adjacent conductive layers.

2. The electronic device of claim 1, wherein the first center axis is laterally positioned outside of a first outer diameter of the second inductor coil and the third inductor coil, the second center axis is laterally positioned outside of a second outer diameter of the first inductor coil and the third inductor coil, and the third center axis is laterally positioned outside of a third outer diameter of the first inductor coil and the second inductor coil.

3. The electronic device of claim 1, wherein the first center axis, the second center axis, and the third center axis are arranged in an equilateral triangle pattern.

4. The electronic device of claim 1, wherein the inductor coil arrangement is formed with a total of three inductor coils.

5. The electronic device of claim 1, wherein the first inductor coil layer further includes a fourth inductor coil and a fifth inductor coil, and the second inductor coil layer further includes a sixth inductor coil and a seventh inductor coil.

6. The electronic device of claim 5, wherein the first inductor coil, the fourth inductor coil, and the fifth inductor coil in the first inductor coil layer are coplanar, equally spaced apart from one other, and positioned in a non-overlapping arrangement.

7. The electronic device of claim 5, wherein the second inductor coil, the sixth inductor coil, and the seventh inductor coil in the second inductor coil layer are coplanar, equally spaced apart from one other, and positioned in a non-overlapping arrangement.

8. The electronic device of claim 5, wherein the third inductor coil overlaps with a portion of all other inductor coils in the inductor coil arrangement.

9. The electronic device of claim 5, wherein the third center axis is positioned at a center of an entire inductor coil arrangement.

10. The electronic device of claim 5, wherein the inductor coil arrangement is formed with a total of seven inductor coils.

11. A wireless charging device, comprising:
    a housing comprising a charging surface; and
    an inductor coil arrangement disposed within the housing, the inductor coil arrangement comprising:
       a first inductor coil layer in a first plane including a first inductor coil having a first center axis;
       a second inductor coil layer in a second plane including a first plurality of inductor coils arranged in a non-overlapping arrangement with one another and in an overlapping arrangement with the first inductor coil, wherein each inductor coil of the first plurality of inductor coils are spaced equally apart from one another;
       a third inductor coil layer in a third plane including a second plurality of inductor coils arranged in a non-overlapping arrangement with one another and in an overlapping arrangement with the first inductor coil, wherein each inductor coil of the second plurality of inductor coils are spaced equally apart from one another; and
       a spacing layer between one of the first inductor coil layer and the second inductor coil layer or the second inductor coil layer and the third inductor coil layer, wherein the spacing layer defines a degree of parasitic capacitance between adjacent conductive layers.

12. The wireless charging device of claim 11, wherein the first plurality of inductor coils includes three inductor coils, wherein each inductor coil of the first plurality of inductor coils includes a center axis that is equally spaced apart from the center axes all other inductor coils in the second inductor coil layer.

13. The wireless charging device of claim 12, wherein the second plurality of inductor coils includes three inductor coils, wherein each inductor coil of the second plurality of inductor coils includes a center axis that is equally spaced apart from the center axes all other inductor coils in the second inductor coil layer.

14. The wireless charging device of claim 13, wherein the first center axis is equally spaced apart in a lateral dimension from a center axis of all other inductor coils in the second inductor coil layer and the third inductor coil layer of the inductor coil arrangement.

15. The wireless charging device of claim 11, wherein the first inductor coil overlaps with a portion of all other inductor coils in the inductor coil arrangement.

16. A wireless charging system, comprising:
- a first electrical device comprising a receiver coil configured to generate a current to charge a battery when exposed to a time-varying magnetic flux; and
- a second electrical device configured to generate the time-varying magnetic flux to wirelessly charge the first electrical device, the second electrical device comprising:
  - a housing comprising a charging surface; and
  - an inductor coil arrangement disposed within the housing, the inductor coil arrangement comprising:
    - a first inductor coil layer in a first plane including a first inductor coil having a first termination zone at a center of the first inductor coil;
    - a second inductor coil layer in a second plane including a second inductor coil overlapping with a portion of the first inductor coil and having a second termination zone at a center of the second inductor coil; and
    - a third inductor coil layer in a third plane including a third inductor coil overlapping with a portion of the first inductor coil and a portion of the second inductor coil, the third inductor coil having a third termination zone at a center of the third inductor coil; and
    - a spacing layer between one of the first inductor coil layer and the second inductor coil layer or the second inductor coil layer and the third inductor coil layer, wherein the spacing layer defines a degree of parasitic capacitance between adjacent conductive layers.

17. The wireless charging system of claim 16, wherein a first center axis is laterally positioned outside of a first outer diameter of the second inductor coil and the third inductor coil, a second center axis is laterally positioned outside of a second outer diameter of the first inductor coil and the third inductor coil, and a third center axis is laterally positioned outside of a third outer diameter of the first inductor coil and the second inductor coil.

18. The wireless charging system of claim 16, wherein a first center axis, a second center axis, and a third center axis form an equilateral triangle.

19. The wireless charging system of claim 16, wherein the inductor coil arrangement is formed with a total of three inductor coils.

20. The wireless charging system of claim 16, wherein the first inductor coil layer further includes a fourth inductor coil and a fifth inductor coil, and the second inductor coil layer further includes a sixth inductor coil and a seventh inductor coil.

* * * * *